United States Patent
Nishimura

(10) Patent No.: US 10,026,812 B2
(45) Date of Patent: Jul. 17, 2018

(54) SEMICONDUCTOR DEVICE AND METHOD OF MANUFACTURING THE SAME

(71) Applicant: FUJI ELECTRIC CO., LTD., Kawasaki (JP)

(72) Inventor: Takeyoshi Nishimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/897,590

(22) Filed: Feb. 15, 2018

(65) Prior Publication Data

US 2018/0175148 A1    Jun. 21, 2018

Related U.S. Application Data

(62) Division of application No. 15/188,233, filed on Jun. 21, 2016, now Pat. No. 9,935,169.

(30) Foreign Application Priority Data

Aug. 11, 2015   (JP) ................... 2015-159138

(51) Int. Cl.
*H01L 29/10* (2006.01)
*H01L 27/07* (2006.01)
(Continued)

(52) U.S. Cl.
CPC .......... *H01L 29/1095* (2013.01); *H01L 23/34* (2013.01); *H01L 27/0727* (2013.01); *H01L 29/7396* (2013.01); *H01L 25/18* (2013.01)

(58) Field of Classification Search
CPC ............. H01L 29/1095; H01L 29/7396; H01L 27/0727; H01L 25/18; H01L 23/34
See application file for complete search history.

(56) References Cited

U.S. PATENT DOCUMENTS

| 5,500,547 A | 3/1996 | Yamaguchi et al. |
| 6,229,180 B1 | 5/2001 | Yoshida et al. |

(Continued)

FOREIGN PATENT DOCUMENTS

| WO | WO 2013/015014 A1 | 1/2013 | |
| WO | WO 2013015014 A1 * | 1/2013 | ..... H01L 21/823487 |

OTHER PUBLICATIONS

Restriction Requirement Office Action dated Jan. 27, 2017 in related U.S. Appl. No. 15/188,233.

(Continued)

*Primary Examiner* — Yu Chen
*Assistant Examiner* — Vincent Wall

(57) ABSTRACT

A method of manufacturing a semiconductor device includes preparing a layer, including columns, the columns extend a first direction parallel to the surface of the layer, the columns are arranged at intervals, interdigitally sandwiching other columns so as to implement a superjunction structure so the columns and the other columns are side by side; forming well regions in the layer; forming source regions in the well regions; forming an insulating film on the well regions; and forming gate electrodes on the gate insulating film, the gate electrodes bridging corresponding source regions in neighboring well regions, a temperature detection diode at an area in the gate electrodes, one column has a first width in a second direction, the temperature detection diode has a second width in the second direction, and the first width equal to the second width, and the second direction is perpendicular to the first direction.

5 Claims, 40 Drawing Sheets

(51) Int. Cl.
    *H01L 23/34*     (2006.01)
    *H01L 29/739*     (2006.01)
    *H01L 25/18*     (2006.01)

(56) References Cited

U.S. PATENT DOCUMENTS

| | | |
|---|---|---|
| 2004/0262684 A1 | 12/2004 | Fragapane et al. |
| 2005/0156267 A1 | 7/2005 | Mori et al. |
| 2006/0289915 A1 | 12/2006 | Omura et al. |
| 2009/0230500 A1 | 9/2009 | Yoshikawa et al. |
| 2014/0061644 A1 | 3/2014 | Cao et al. |

OTHER PUBLICATIONS

Office Action dated Jun. 1, 2017 in related U.S. Appl. No. 15/188,233.

Notice of Allowance dated Dec. 14, 2017 in related U.S. Appl. No. 15/188,233.

U.S. Appl. No. 15/188,233, filed Jun. 21, 2016, Takeyoshi Nishimura, Fuji Electric Co., Ltd.

\* cited by examiner

SEMICONDUCTOR DEVICE AND METHOD OF MANUFACTURING THE SAME

CROSS REFERENCE TO RELATED APPLICATIONS

This application is a divisional of U.S. application Ser. No. 15/188,233, filed Jun. 21, 2016, which claims benefit of priority under 35 USC 119 based on Japanese Patent Application No. 2015-159138 filed on Aug. 11, 2015, the entire contents of which are incorporated by reference herein.

BACKGROUND

1. Field

The present invention relates to semiconductor devices and a method of manufacturing the semiconductor devices, specifically relates to a technique to integrate a temperature detection device with the semiconductor device including a SJ structure.

2. Description of Related Art

In a structure such that a temperature detection device is disposed in the middle of a principal surface of a semiconductor device, and that the semiconductor device includes a superjunction (SJ) structure in which plural p- and n-type columns are located relatively side by side, the temperature detection device is provided to detect the temperature of the semiconductor device, electric field distributions and potential distributions in a diode merged in the temperature detection device sometimes influences the behaviors of the semiconductor device. Accordingly, the temperature detection device, which is referred to as "a temperature detection diode" hereinafter, changes the electric charge balances in the semiconductor devices, reducing the breakdown voltages of the semiconductor devices in some cases.

In order to reduce the imbalance of electric charges due to the temperature detection diode in the case of detecting the temperature of the semiconductor device, WO2013/015014 has proposed a technique to make a width of columns under the temperature detection area where the temperature detection diode is provided shorter than a width of columns under the active area around the temperature detection area.

However, with the technique disclosed in WO2013/015014, the potential distribution becomes uneven at the boundary between the temperature detection area and an active area, the active area includes a path through which the main current flows, ascribable to the structure implemented by the p- and n-type columns. The uneven potential distribution could reduce the breakdown voltages of the semiconductor devices.

SUMMARY

The present invention is addressing to the aforementioned problems, and an object of the invention is to provide semiconductor devices which include SJ structures, each of the semiconductor devices is merged with a temperature detection diode configured to detect temperatures of the semiconductor devices, and the breakdown voltage in each of the semiconductor devices is effectively prevented from being reduced, because no influence is exerted on the performance of the semiconductor devices as the main devices, and to provide a method of manufacturing the semiconductor devices.

To solve the aforementioned problem, an aspect of a semiconductor device according to the present invention includes: a drift layer of a first conductivity-type, including a plurality of columns of a second conductivity-type, a plane pattern of each of the columns of the second conductivity-type extends along a parallel direction to the principal surface of the layer of the first conductivity-type, the columns of the second conductivity-type are arranged at regular intervals, interdigitally sandwiching columns of the first conductivity-type made of the drift layer so as to implement a drift layer having a superjunction structure in which the columns of the first conductivity-type and the columns of the second conductivity-type are arranged side by side; a plurality of well regions of the second conductivity-type provided in a surface-side layer of the layer of the first conductivity-type; a plurality of source regions of the first conductivity-type selectively provided in the plurality of well regions; a gate insulating film provided on the principal surface; an array of gate electrodes disposed on the gate insulating film, each of the gate electrodes is provided so as to bridge the corresponding source regions in a pair of neighboring two well regions; and a temperature detection diode provided at a partial area defined in the array of the gate electrodes, the temperature detection diode having the same line width as the line width of the column of the first conductivity-type above which the temperature detection diode is provided.

Another aspect of the semiconductor device according to the present invention includes: a drift layer of a first conductivity-type, including a plurality of columns of a second conductivity-type, a plane pattern of each of the columns of the second conductivity-type extends along a parallel direction to the principal surface of the layer of the first conductivity-type, the columns of the second conductivity-type are arranged at regular intervals, interdigitally sandwiching columns of the first conductivity-type made of the drift layer so as to implement a drift layer having a superjunction structure in which the columns of the first conductivity-type and the columns of the second conductivity-type are arranged side by side; a plurality of well regions of the second conductivity-type provided in a surface-side layer of the layer of the first conductivity-type; a plurality of source regions of the first conductivity-type selectively provided in the plurality of well regions; an interlayer dielectric provided on the array of gate electrodes; and a temperature detection diode provided on the interlayer dielectric, the temperature detection diode having the same line width as the line width of the column of the first conductivity-type above which the temperature detection diode is provided.

An aspect of a method of manufacturing a semiconductor device according to the present invention includes the steps of: preparing a drift layer of a first conductivity-type, including a plurality of columns of a second conductivity-type, a plane pattern of each of the columns of the second conductivity-type extends along a first direction parallel to the principal surface of the layer of the first conductivity-type, the columns of the second conductivity-type are arranged at regular intervals, interdigitally sandwiching columns of the first conductivity-type made of the drift layer so as to implement a drift layer having a superjunction structure in which the columns of the first conductivity-type and the columns of the second conductivity-type are arranged side by side; forming a plurality of well regions of the second conductivity-type in a surface-side layer of the layer of the first conductivity-type; forming a plurality of source regions of the first conductivity-type selectively in the plurality of well regions; forming a gate insulating film on the plurality of well regions; and forming an array of gate electrodes on the gate insulating films, each of the gate electrodes bridging the corresponding source regions in a pair of neighboring two well regions, wherein a temperature detection diode is included at a partial area defined in the array of the gate electrodes, wherein at least one column among the columns has a first line width in a second direction, the temperature detection diode has a second line width in the second direction, and the first line width is equal to the second line width, and wherein the second direction is perpendicular to the first direction.

DESCRIPTION OF THE EMBODIMENTS

Figure 1:
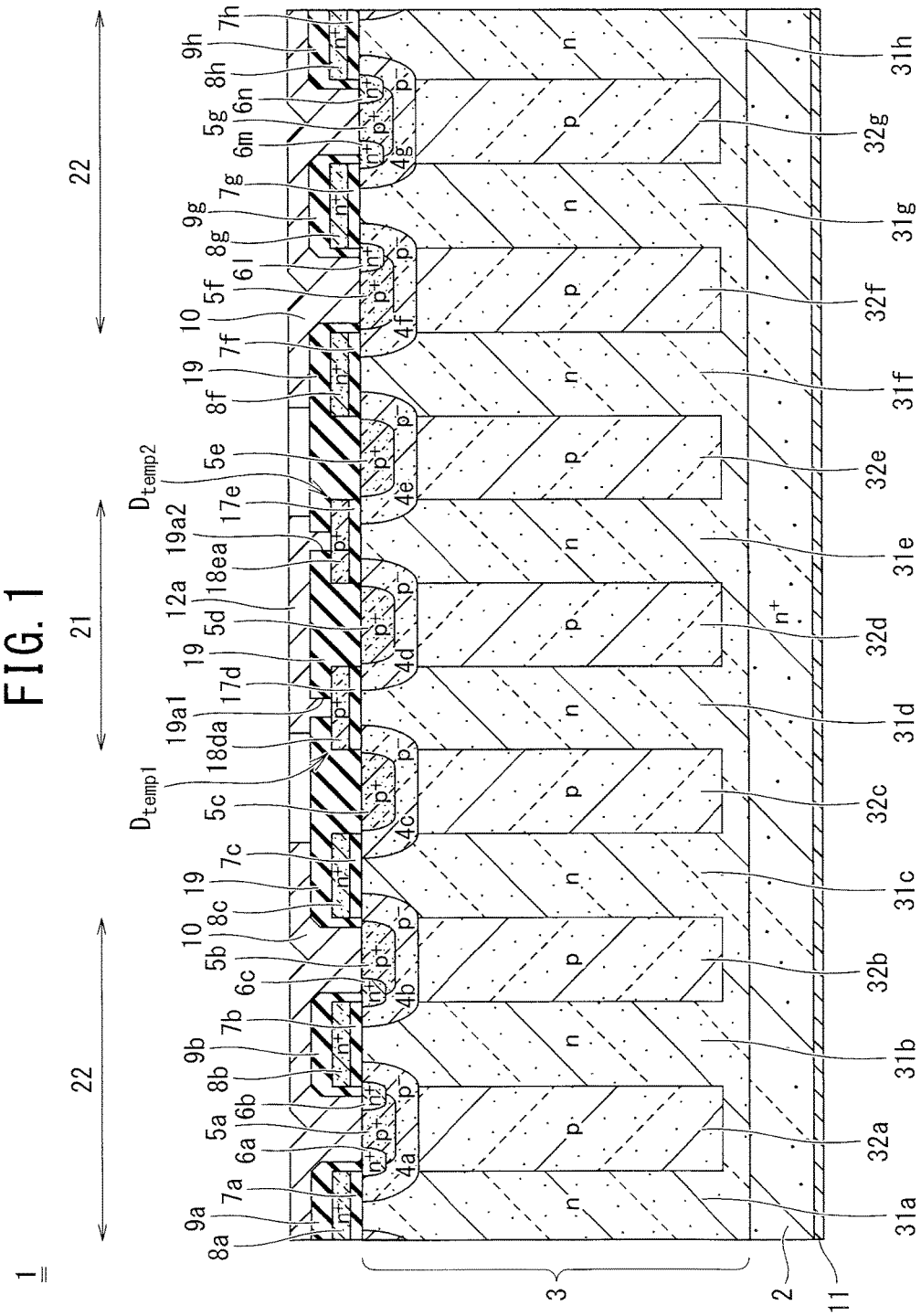
FIG. 1 is a cross-sectional view of a semiconductor device according to a first embodiment, taken in the direction of arrows A in FIG. 4, the view schematically illustrating the configuration of the semiconductor device.

The embodiments of the present invention are explained below. In the description of the drawings below, the same or similar reference numerals are used for the same or similar parts. However, it should be noted that the drawings are schematic, and relations between thicknesses and flat dimensions, ratios of thicknesses in each apparatus and each member, and so on are different from those in reality. Therefore, specific thicknesses and dimensions should be determined in consideration of the explanation below.

Needless to say, relations and ratios of dimensions are partially different among the drawings. In the following explanation, directions expressed as "left and right" and "up and down" are defined only for convenience of explanation, and do not limit the technical ideas of the present invention. Therefore, it is needless to say that when the paper is rotated by 90 degrees, for example, "left and right" and "up and down" are exchanged with each other when read, and, when the paper is rotated by 180 degrees, the "left" becomes "right" and "right" becomes "left".

Moreover, following embodiments of the prevent invention are exemplified in a manner as a first conductivity type is n-type and a second conductivity type is p-type. However, it is available to determine that a first conductivity type is p-type and a second conductivity type is n-type, in reverse.

Moreover, in this specification and the accompanying drawings, in regions and layers, which are denoted by n and p, n and p stand for that electrons and holes are majority carriers in the subject regions or layers. Furthermore, superscript notations of + and −, which are added to n and p, stand for the subject regions concerned are semiconductor regions in which impurity concentrations are relatively higher and lower in comparison with semiconductor regions which are not added with superscript notations of + and −, respectively. Moreover, in the accompanying drawings, illustration of hatching of layers is partially omitted for enhancing visibility.
<First Embodiment>
—Structure of Semiconductor Device—

As illustrated in the cross-sectional view of FIG. 1, a semiconductor device 1 according to a first embodiment includes a drain region 2 of a first conductivity-type and a region of the first conductivity-type provided on the drain region 2. The semiconductor device 1 according to the first embodiment defines a drift layer 3 by the layer of the first conductivity-type so as to implement a SJ structure, in which plural columns (p-type vertical pillars) 32a to 32g of a second conductivity-type are buried in the layer of the first conductivity-type, at regular intervals in the direction parallel to the principal surface of the region of the layer of the first conductivity-type.

The remaining portions by the p-type columns (pillars) 32a to 32g in the layer of the first conductivity-type, being sandwiched by the p-type columns 32a to 32g, other than the lower surface side of the layer of the first conductivity-type, are defined as "n-type columns (pillars) 31a to 31h". The layer developing "a SJ structure", implemented by a periodic array structure in which the plural n-type columns 31a to 31h and p-type columns 32a to 32g are arranged side by side as illustrated in FIG. 1, is referred to as "a p-n column layer (p-n pillar layer)".

The semiconductor device 1 includes plural well regions 4a to 4g of the second conductivity-type, which are periodically buried in a surface-side layer of the layer of the first conductivity-type, and contact regions 5a to 5g of the second conductivity-type, which are periodically arranged in the plural well regions 4a to 4g, respectively. The positions of the well regions 4a to 4g may be elected just above the p-type columns 32a to 32g, respectively. The semiconductor device 1 further includes source regions 6a to 6c, 6dl to 6kl, 6dr to 6kr, and 6l to 6n of the first conductivity-type, which are selectively provided in the plural well regions 4a to 4g, other than specific triple well regions 4c to 4e illustrated in the middle of FIG. 1. Source regions 6dl to 6kl and 6dr to 6kr will be illustrated later in FIG. 23.

Figure 2:
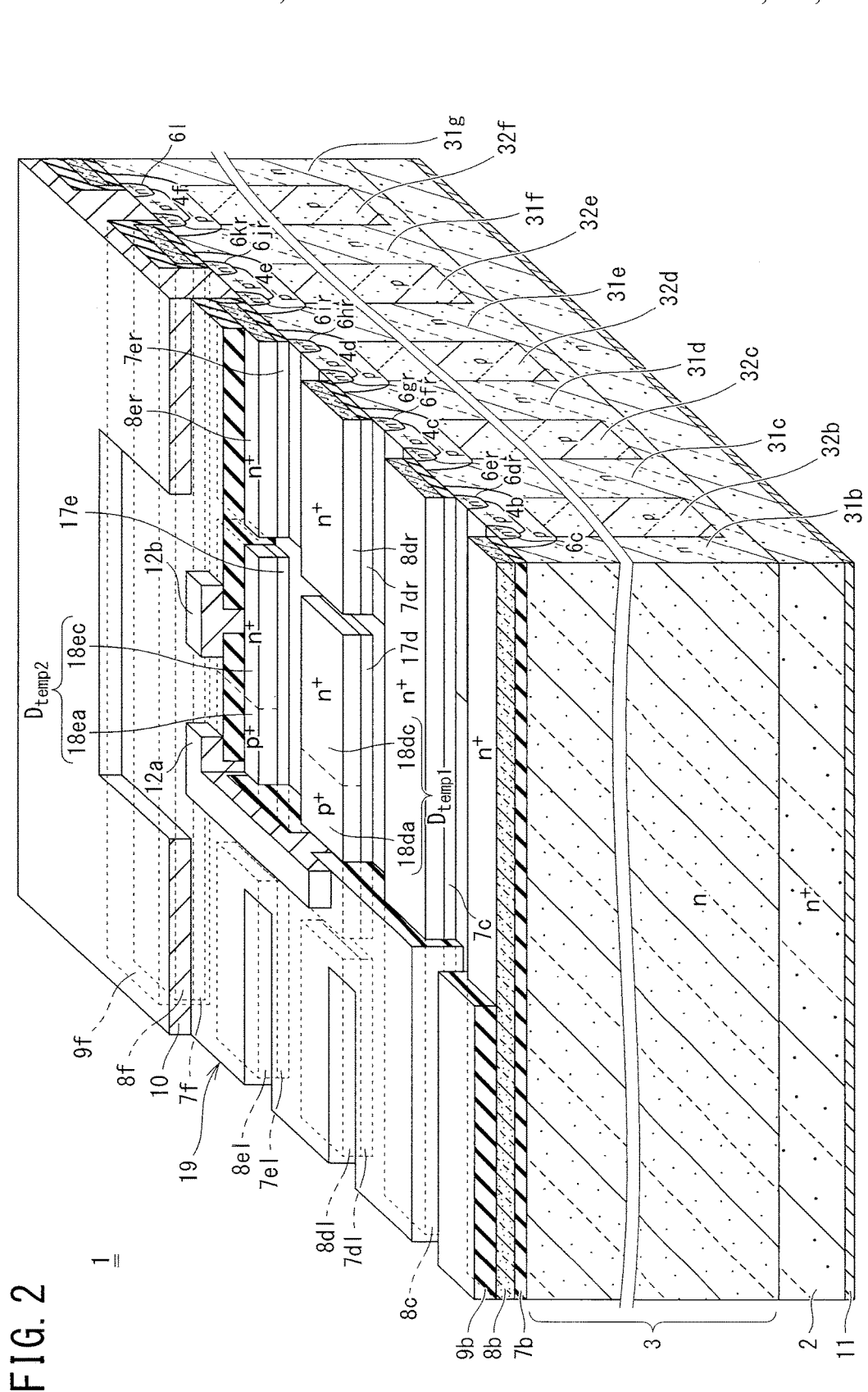
FIG. 2 is a bird's eye view (a perspective view) schematically illustrating a configuration of the semiconductor device according to the first embodiment.

As illustrated in FIGS. 1 and 2, the semiconductor device 1 includes gate insulating films 7a, 7b, 7c, 7dl, 7dr, 7el, 7er, 7f, 7g, 7h . . . disposed just above the well regions 4a to 4g, other than the specific triple well regions 4c to 4e, and plural gate electrodes 8a to 8c, 8dl, 8dr, 8el, 8er, and 8f to 8h, which have the same gate width and are periodically disposed on the gate insulating films 7a, 7b, 7c, 7dl, 7dr, 7el, 7er, 7f, 7g, 7h . . . .

As illustrated in FIG. 1, the semiconductor device 1 includes a first middle insulating film 17d and a second middle insulating film 17e disposed on the surfaces of the specific triple well regions 4c to 4e. And a first temperature detection diode $D_{temp1}$ and a second temperature detection diodes $D_{temp2}$ are developed on the first middle insulating film 17d and the second middle insulating film 17e relatively.

The first temperature detection diode $D_{temp1}$ and the second temperature detection diode $D_{temp2}$ have the same line width, thickness, and pitch as those of the gate electrodes 8a to 8c and 8f to 8h so that the first temperature detection diode $D_{temp1}$ and the second temperature detection diode $D_{temp2}$ can be arranged in a topology which keeps the periodic structure of the gate electrodes 8a to 8c and 8f to 8h.

Each of the gate insulating films 7a, 7b, 7c, 7f, 7g, 7h . . . are provided on the surface of the layer of the first conductivity-type so as to bridge each of the corresponding pairs of the source regions 6a to 6c and 6l to 6n, each of the pairs is assigned to cover neighboring two well regions 4a to 4g. In some portions under the gate insulating films 7c and 7f, no source region is provided at a pair spanning between the well region 4b and the well region 4c, which locates adjacent to a first middle insulating film 17d, and at a pair spanning between the well region 4e and the well region 4f, which locates adjacent to a second middle insulating film 17e.

The gate insulating film 7c is provided on the surface of the layer of the first conductivity-type so as to bridge the source regions 6dr and 6er (FIG. 23) and bridge the source regions 6dl and 6el (see FIG. 2 and FIG. 23), and longitudinally extends, along the vertical direction to the paper illustrated in FIG. 1, on a part the well region where no source region is provided so as to establish the same line width and thickness. Similarly, the gate insulating film 7f is provided on the surface of the layer of the first conductivity-type so as to bridge the source regions 6jr and 6kr (FIG. 23) and bridge the source regions 6jl and 6kl (FIG. 23), and longitudinally extends on a part the well region where no source region is provided so as to establish the same line width and thickness.

Just under the gate insulating films $7dl$, $7dr$, $7el$, and $7er$ (FIG. 2), the source regions $6dl$ to $6kl$ and $6dr$ to $6kr$ (FIG. 23) are provided. Each of the gate insulating films $7dl$, $7dr$, $7el$, and $7er$ is provided on the surface of the layer of the first conductivity-type so as to bridge the source regions located in the corresponding pair of neighboring well regions, in a similar manner to the gate insulating films $7a$, $7b$, $7c$, $7f$, $7g$, $7h$ . . . illustrated in FIG. 1. The first middle insulating film $17d$ is provided between the gate insulating films $7dl$ and $7dr$ (FIG. 2), and the second middle insulating film $17e$ is provided between the gate insulating films $7el$ and $7er$ (FIG. 2). The gate insulating films $7dl$ and $7dr$ (FIG. 2) and the first middle insulating film $17d$ have the same line width, thickness, and pitch. The gate insulating films $7el$ and $7er$ (FIG. 2) and the second middle insulating film $17e$ have the same line width, thickness, and pitch.

As illustrated in FIG. 1, the semiconductor device 1 further includes an anode surface interconnection $12a$ on the middle interlayer dielectric 19. A pattern of the anode surface interconnection $12a$ is delineated to bridge a first anode region $18da$ of the first temperature detection diode $D_{temp1}$ and a second anode region $18ea$ of the second temperature detection diode $D_{temp2}$. The semiconductor device 1 further includes a cathode surface interconnection $12b$ (FIG. 2) on the middle interlayer dielectric 19. A pattern of the cathode surface interconnection $12b$ (FIG. 2) is delineated to bridge a first cathode region $18dc$ (FIG. 2) of the first temperature detection diode $D_{temp1}$ and a second cathode region $18ec$ (FIG. 2) of the second temperature detection diode $D_{temp2}$.

As illustrated in FIG. 1, the anode surface interconnection $12a$ penetrates a contact hole $19a1$, which is disposed just above the first anode region $18da$ of the first temperature detection diode $D_{temp1}$ in the middle interlayer dielectric 19, and a contact hole $19a2$, which is disposed just above the second anode region $18ea$ of the second temperature detection diode $D_{temp2}$ in the middle interlayer dielectric 19, and is in contact with the first anode region $18da$ and the second anode region $18ea$. The anode surface interconnection $12a$ connects the first anode region $18da$ and the second anode region $18ea$ and extracts the positive electrode potential.

The cathode surface interconnection $12b$ (FIG. 2) connects the first cathode region $18dc$ (FIG. 2) of the first temperature detection diode $D_{temp1}$ and the second cathode region $18ec$ (FIG. 2) of the second temperature detection diode $D_{temp2}$ and extracts the negative potential electrode. The anode surface interconnection $12a$ and the cathode surface interconnection $12b$ (FIG. 2) connect the first temperature detection diode $D_{temp1}$ and the second temperature detection diode $D_{temp2}$ in parallel. Each of the source and drain electrodes 10 and 11 only needs to be made of a conductive material and can be implemented by metallic film containing aluminum (Al), for example.

As illustrated in FIG. 1, the semiconductor device 1 includes a source electrode 10 and a drain electrode 11. The source electrode 10 is provided on the plural interlayer dielectrics $9a$, $9b$, $9g$, $9h$ . . . to electrically short-circuit the source regions $6a$ to $6c$, $6dl$ to $6kl$, $6dr$ to $6kr$, and $6l$ to $6n$ (FIG. 22) and the contact regions $5a$ to $5g$. The drain electrode 11 is provided on the bottom surface (the lower surface) of the drain region 2 opposite to the drift layer 3. The structure of the semiconductor device 1 according to the first embodiment is based upon MOSFETs.

As illustrated in FIG. 1, the semiconductor device 1 is divided into the temperature detection area 21, and an active area 22 located around the temperature detection area 21 so as to provide a window space for the temperature detection area 21, and an edge area 23 (FIG. 3) located around the active area 22 at the periphery of the semiconductor device 1, the edge area 23 (FIG. 3) includes a higher breakdown voltage achieving structure.

FIG. 2 is a partially-enlarged perspective view illustrating the structure of a central region at the principal surface of the semiconductor device 1 and a surrounding region around the central region. FIG. 2 also illustrates cross sections of some of the layers included in the enlarged region.

As illustrated in FIGS. 1 and 2, the first middle insulating film $17d$ is an insulating film which has the same line width and thickness as those of the gate insulating films $7a$, $7b$, $7c$, $7dl$, $7dr$, $7el$, $7er$, $7f$, $7g$, $7h$ . . . and is made of the same material, for example, silicon oxide film ($SiO_2$ film). The first middle insulating film $17d$ is located above the n-type column $31d$, which is the near side column, or the left side column illustrated in FIG. 2 among the two n-type columns $31d$ and $31e$ assigned at a middle position in a depth direction, the depth direction is defined as a direction from near left side to rear right side, in FIG. 2. The second middle insulating film $17e$ has an equivalent configuration to that of the first middle insulating film $17d$ and is located above the n-type column $31e$, which is in the rear side column illustrated as the right side in FIG. 2.

As illustrated in FIGS. 1 and 2, the semiconductor device 1 further includes plural interlayer dielectrics $9a$, $9b$, $9g$, and $9h$ . . . laid on the gate electrodes $8a$, $8b$, $8c$, $8dl$, $8dr$, $8el$, $8er$, $8f$, $8g$, $8h$ . . . , and a middle interlayer dielectric 19 provided on the first temperature detection diode $D_{temp1}$ and the second temperature detection diodes $D_{temp2}$.

The gate electrodes $8a$ to $8c$ and $8f$ to $8h$ are provided on the gate insulating films $7a$, $7b$, $7c$, $7f$, $7g$, $7h$ . . . so as to bridge each of the corresponding pairs of the source regions $6a$ to $6c$ and $6l$ to $6n$, the pair being assigned to neighboring two well regions $4a$ to $4g$ next to each other. The first temperature detection diode $D_{temp1}$ is provided between the gate electrodes $8dl$ and $8dr$, and the second temperature detection diode $D_{temp2}$ is provided between the gate electrodes $8el$ and $8er$.

Each of the first temperature detection diode $D_{temp1}$ and the second temperature detection diodes $D_{temp2}$ may be implemented by a partial element in the gate electrodes. In other words, the first temperature detection diode $D_{temp1}$ and the second temperature detection diodes $D_{temp2}$ are simultaneously manufactured with the delineation process of the gate electrodes in the first half of the manufacturing procedure and are then manufactured in a different way in the second half.

The fabrication steps for a partial element of the structure, which is manufactured at a temperature detection area 21 illustrated in FIG. 1 being scheduled to be used as gate electrodes, is separated from the fabrication steps for other partial elements in the middle step of the manufacturing procedure. The partial element is then subjected to a predetermined treatment so as to establish the characteristics required as a diode, and the partial element is eventually used not as a gate electrode but as an element for detecting temperature in the semiconductor device 1.

Figure 22:
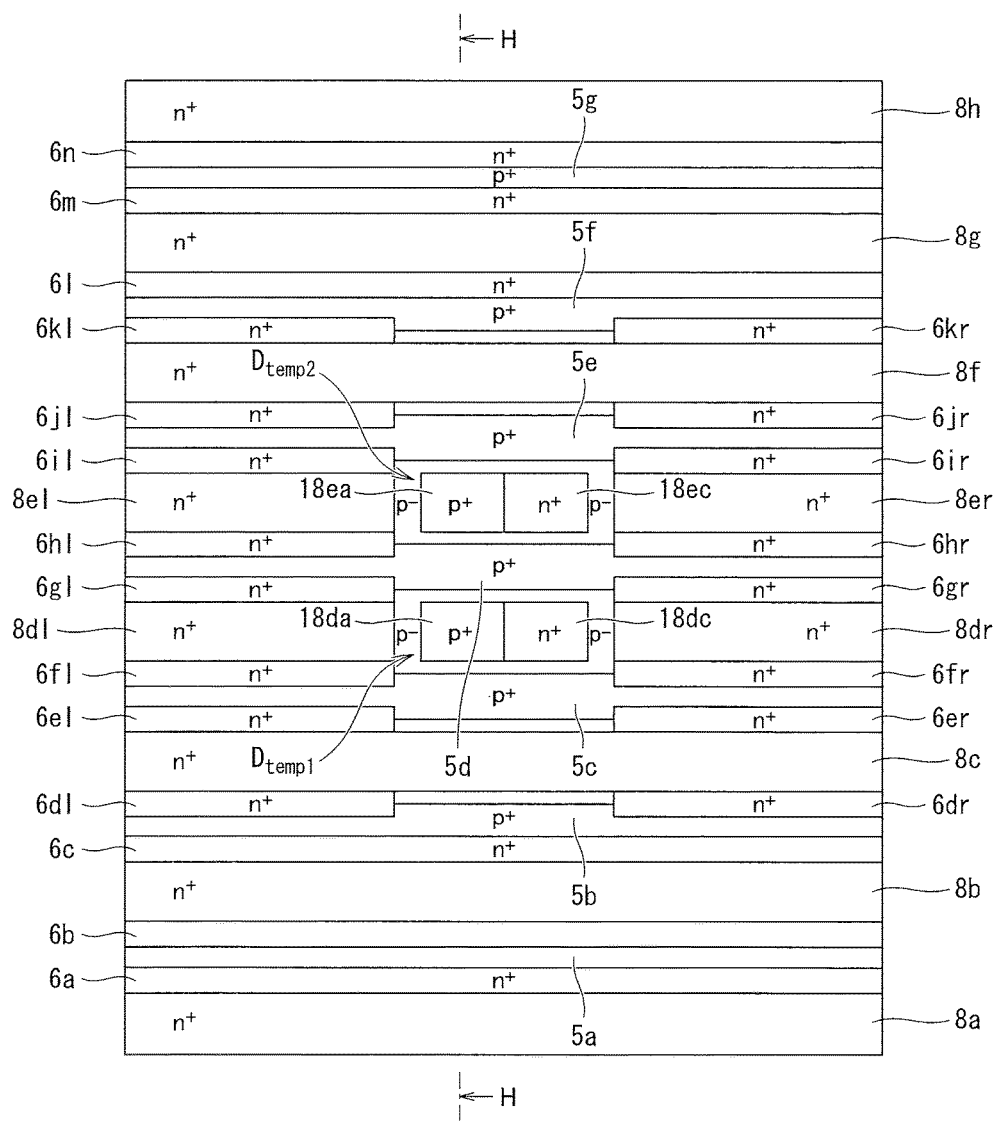
FIG. 22 is a schematic top view illustrating the method of manufacturing a semiconductor device according to the first embodiment (No. 6)

As illustrated in FIGS. 1 and 22, the gate electrodes $8dl$, $8dr$, $8el$, and $8er$ are provided on the gate insulating films $7dl$, $7dr$, $7el$, and $7er$ so as to bridge each of the corresponding pairs among the source regions $6dl$ to $6kl$ and $6dr$ to $6kr$, the pairs are assigned to neighboring two well regions $4c$ to $4e$, respectively. the first temperature detection diode $D_{temp1}$ and the second temperature detection diodes $D_{temp2}$ have the same line width, thickness, and pitch as those of the gate electrodes $8dl$ and $8dr$ and the gate electrodes $8el$ and $8er$.

The first temperature detection diode $D_{temp1}$ is isolated from the gate electrodes 8*dl* and 8*d*, and the second temperature detection diode $D_{temp2}$ is isolated from the gate electrodes 8*el* and 8*er*.

Figure 3:
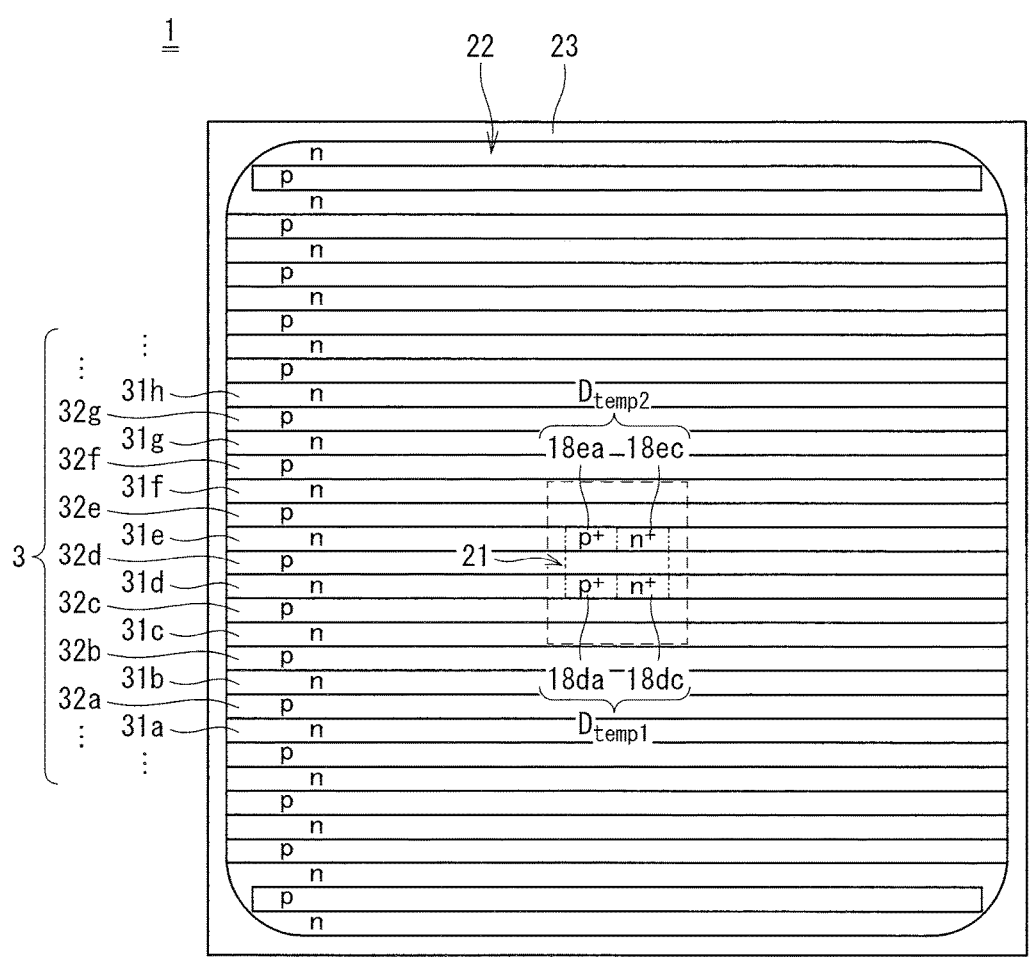
FIG. 3 is a top view schematically illustrating the positional relationship between a p-n column layer and temperature detection diodes in the semiconductor device according to the first embodiment.

The semiconductor device 1 includes a temperature detection area 21 located at the substantially center of the entire structure in the layout of a plane pattern of the principal surface seen from above along the direction vertical to the principal surface as illustrated in the top view of FIG. 3. FIG. 3 illustrates a horizontal cross section of the semiconductor device 1, being parallel to the plane of the principal surface, the horizontal cross section is cut at a depth such that the horizontal cross section can includes the p-type columns 32*a* to 32*g*.

The temperature detection area 21 is defined as a substantially rectangular area in the plane pattern illustrated in FIG. 3. The rectangular area is prescribed by three sides on the horizontally-long rectangular outline of the first temperature detection diode $D_{temp1}$ other than one long side facing to the second temperature detection diode $D_{temp2}$ side, three sides on the horizontally-long rectangular outline of the second temperature detection diode $D_{temp2}$ other than one long side facing to the first temperature detection diode $D_{temp1}$ side, and dual dashed lines connecting both longitudinal ends of the first temperature detection diode $D_{temp1}$ and the second temperature detection diodes $D_{temp2}$.

The active area 22 is established by an area between an inner rectangle drawn by a dashed line, which defines the rectangular area of the temperature detection area 21, and a substantially square outer outline (the boundary line to the edge area 23) with four round corners, the outer outline being drawn in the square, which is a little smaller than a square defining the chip outline of the semiconductor device 1. The active area 22 is surrounded by the edge area 23 in the plane pattern and has an opening for the temperature detection area 21. As illustrated in FIGS. 2 and 3, there are gaps between the gate electrodes 8*dl*, 8*dr*, 8*el*, and 8*er* of the active area 22 and the first temperature detection diode $D_{temp1}$ and the second temperature detection diodes $D_{temp2}$ in the temperature detection area 21, so that the gate electrodes 8*dl*, 8*dr*, 8*el*, and 8*er* can be isolated from the first temperature detection diode $D_{temp1}$ and the second temperature detection diodes $D_{temp2}$, respectively.

On the drift layer 3 including the p-n column layer, plural planer MOS gate structure units are periodically provided to implement a multichannel structure, which is not illustrated in FIG. 3. As illustrated in FIGS. 1 and 2, the MOS gate structure units are periodically arrayed along the longitudinal direction that the stripe-shaped gate electrodes 8*a*, 8*b*, 8*c*, 8*dl*, 8*dr*, 8*el*, 8*er*, 8*f*, 8*g*, 8*h* . . . are extended, and in the transverse direction that the gate electrodes 8*a*, 8*b*, 8*c*, 8*dl*, 8*dr*, 8*el*, 8*er*, 8*f*, 8*g*, 8*h* . . . are arranged side by side so as to implement a stripe topology as a whole.

FIG. 3 illustrates seventeen n-type columns 31*a* to 31*h* and sixteen p-type columns 32*a* to 32*g*. The numbers of n-type columns can be properly changed according to the requirements of the rated current of the semiconductor device 1 and the like.

As illustrated in FIG. 1, the drain region 2 is implemented by a first conductivity-type silicon (Si) substrate having a high impurity concentration ($n^+$) as a mother material, and implements a low-resistivity semiconductor layer. The Si substrate as the mother material has the same structure across the temperature detection area 21 and active area 22, serving as a semiconductor chip.

The n-type columns 31*a* to 31*h* implementing the drift layer 3 are first conductivity-type semiconductor regions with a comparatively low impurity concentration (n), that is, high resistivity. The impurity concentration (p) of the p-type columns 32*a* to 32*g* is determined in view of the depletion layer development in the p-n column layer and is selected so that the semiconductor region has a comparatively high resistivity. The breakdown-voltage class of the semiconductor device 1 illustrated in FIG. 1 can be 300 to 900 V, for example. The thickness of the drift layer 3 between the top and bottom sides can be about ten to forty micrometers and is more preferably about twenty micrometers.

In the plane pattern illustrated in FIG. 3, the longitudinal directions of the n-type columns 31*a* to 31*f* and p-type columns 32*a* to 32*g* extend along the horizontal direction, and further, the n-type columns 31*a* to 31*f* and p-type columns 32*a* to 32*g* are deployed along the vertical direction so as to establish a consecutive periodic pattern between the upper and lower horizontal end lines. The upper surface of the p-n column layer therefore represents plural stripes having the same line width in the plane pattern. The width of the n-type columns 31*a* to 31*h* and p-type columns 32*a* to 32*g* is defined as the length measured along the direction orthogonal to the longitudinal direction through which the n-type columns 31*a* to 31*h* and p-type columns 32*a* to 32*g* extend.

The width of the n-type columns 31*a* to 31*h* and p-type columns 32*a* to 32*g* can be about one to ten micrometers and is more preferably about five micrometers. In the first embodiment, the n-type columns and the p-type columns have the same line width but do not need to have the same line width in some cases, depending on the impurity concentration profiles of the columns.

In the p-n column layer, as illustrated in FIG. 1, the cross section cut at any constant height in the drift layer 3 illustrates a stripe plane pattern. In the plane pattern appearing in the cross section cut at any constant depth, the n-type columns 31*a* to 31*h* have the same line width while the p-type columns 32*a* to 32*g* have the same line width. In other words, the p-n column layer is three-dimensionally provided as a multilayer structure of plate-shaped patterns arranged side by side. The n-type columns 31*a* to 31*h* and the p-type columns 32*a* to 32*g* are disposed uniformly and periodically to implement the same structure across the temperature detection area 21 and active area 22.

As illustrated in FIG. 1, the well regions 4*a* to 4*g* are second conductivity-type semiconductor regions having an impurity concentration determined by the MOSFET gate threshold voltage and the like. The well regions 4*a* to 4*g* implement a stripe pattern across the entire drift layer 3. The shape of each of the well regions 4*a* to 4*g* illustrated in FIG. 1 extends linearly along the depth direction, which is vertical to the paper of FIG. 1. The stripes of the plural well regions 4*a* to 4*g* have the same line width, which is the length measured along the direction illustrated as the horizontal direction in FIG. 1, orthogonal to the longitudinal direction, and the stripes of the plural well regions 4*a* to 4*g* are provided at regular intervals in a repeating manner.

Each of the cross sections of the well regions 4*a* to 4*g* has roughly an approximately inverted trapezoidal shape, in which the lower base is a little shorter than the upper base, and the lateral sides of the well regions 4*a* to 4*g* are curved. Because the well regions 4*a* to 4*g* establish even pattern of the same structure across the temperature detection area 21 and active area 22, in a similar manner to the p-n column layer, the breakdown voltage increases. The number of well regions 4*a* to 4*g* can be properly determined in accordance with the number of the p-type columns 32*a* to 32*g*.

As illustrated in FIG. 1, the contact regions 5a to 5g are semiconductor regions of the second conductivity type having a higher impurity concentration ($p^+$) than that of the p-type columns 32a to 32g, establishing a comparatively low resistivity. The contact regions 5a to 5g are linearly extended along the depth direction in FIG. 1 across the entire drift layer 3. The contact regions 5a to 5g have the same line width and are provided at regular intervals in a repeating manner to define a stripe plane pattern similarly to the well regions 4a to 4g. The contact regions 5a to 5g establish an even pattern of the same structure across the temperature detection area 21 and active area 22, contributing to an increase in breakdown voltage of the semiconductor device 1, similarly to the effectiveness of the well regions 4a to 4g. The number of contact regions 5a to 5g can be properly determined in accordance with the number of well regions 4a to 4g.

As illustrated in FIGS. 1 and 22, the source regions 6a to 6c, 6dl to 6kl, 6dr to 6kr, and 6l to 6n are semiconductor regions of the first conductivity-type having a high impurity concentration ($n^+$), that is, the source regions 6a to 6c, 6dl to 6kl, 6dr to 6kr, and 6l to 6n have a comparatively low resistivity. The source regions 6a to 6c, 6dl to 6kl, 6dr to 6kr, and 6l to 6n are only disposed in the corresponding active area 22, and are not assigned to the temperature detection area 21 and the space between the temperature detection area 21 and active area 22.

As illustrated in FIG. 3, the first temperature detection diode $D_{temp1}$ has a stripe structure having a rectangular principal surface. The first temperature detection diode $D_{temp1}$ is a p-n junction diode, the entire of which is substantially equally divided into a p-type first anode region 18da and an n-type first cathode region 18dc, in the longitudinal direction. The kinds of the first temperature detection diode $D_{temp1}$ are not particularly limited, as far as the diode $D_{temp1}$ includes a p-n junction for temperature detection. Therefore, the first temperature detection diode $D_{temp1}$ is preferably a Zener diode, for example.

Figure 4:
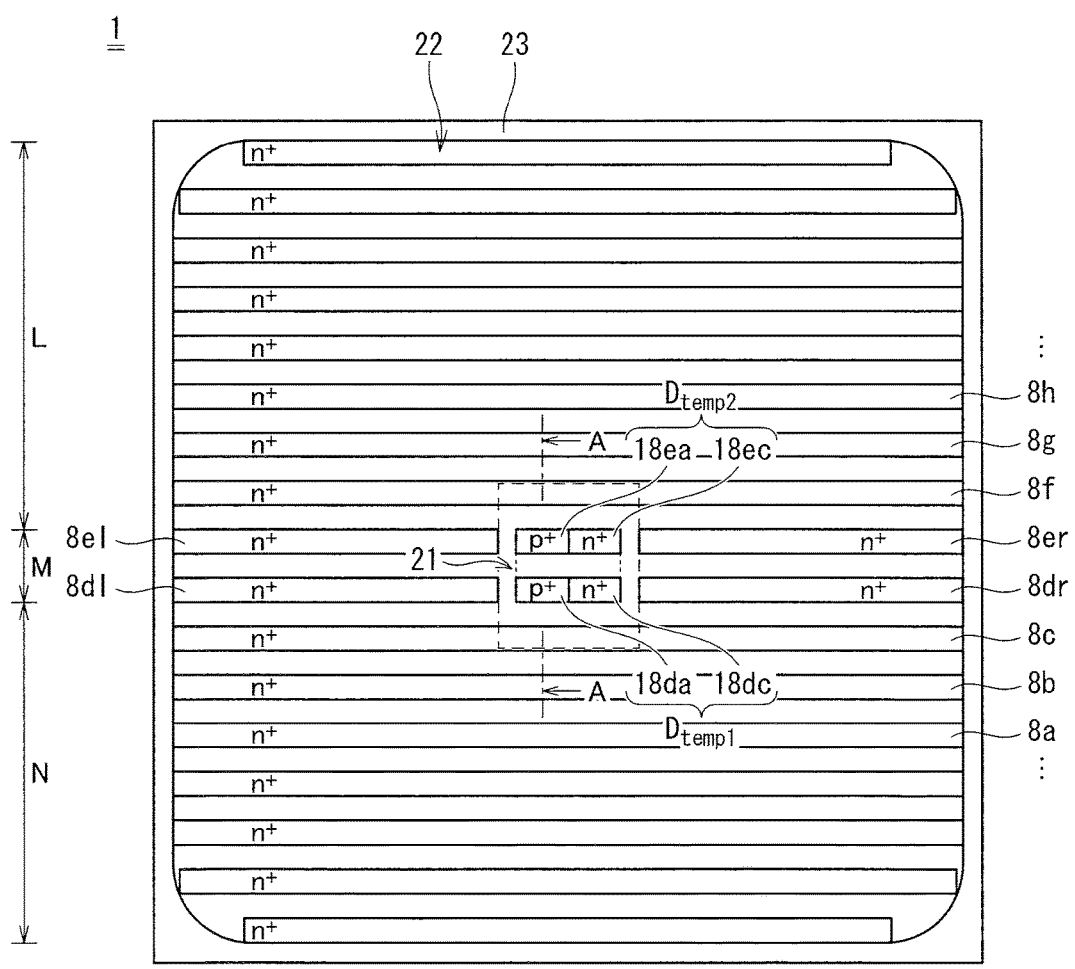
FIG. 4 is a top view schematically explaining the positional relationship between the gate electrode and temperature detection diodes in the semiconductor device according to the first embodiment.

The junction plane of the p-n junction of the first anode 18da and the cathode region 18dc, which implement the first temperature detection diode $D_{temp1}$, is set orthogonal to the direction along which the gate electrodes 8a, 8b, 8c, 8dl, 8dr, 8el, 8er, 8f, 8g, 8h . . . extend as illustrated in the top view of FIG. 4. FIG. 4 illustrates a horizontal cross section of the semiconductor device 1 parallel to the plane of the principal surface of the semiconductor device 1, being cut at a height of the upper surface of the first temperature detection diode $D_{temp1}$.

The length of the first temperature detection diode $D_{temp1}$ illustrated in FIG. 4 measured in the extending direction is about four to forty micrometers, but can be properly changed according to the desired temperature detection performance. The thickness of the first temperature detection diode $D_{temp1}$ is about 0.1 to 1.0 micrometer and is more preferably about 0.5 micrometer.

The impurity concentration of the first anode region 18da of the first temperature detection diode $D_{temp1}$ is about $1 \times 10^{18}$ to $1 \times 10^{19}$ cm$^{-3}$, for example. The example of the first anode region 18da illustrated in FIGS. 1 to 4 has an impurity concentration of about $3 \times 10^{18}$ cm$^{-3}$, which is equal to or a little lower than the $p^+$ concentration of the contact regions 5a to 5g. The impurity concentration of the first cathode region 18dc of the first temperature detection diode $D_{temp1}$ is about $1 \times 10^{18}$ to $1 \times 10^{21}$ cm$^{-3}$, for example. The example of the first cathode region 18dc illustrated in FIGS. 1 to 4 has an impurity concentration of about $5 \times 10^{18}$ cm$^{-3}$, which is equal to or a little lower than the $n^+$ concentration of the source regions 6a to 6c, 6dl to 6kl, 6dr to 6kr, and 6l to 6n and gate electrodes 8a, 8b, 8c, 8dl, 8dr, 8el, 8er, 8f, 8g, and 8h . . . .

The second temperature detection diode $D_{temp2}$ has an equivalent configuration to that of the first temperature detection diode $D_{temp1}$. As illustrated in FIG. 4, the second anode region 18ea of the second temperature diode $D_{temp2}$ corresponds to the first anode region 18da of the first temperature detection diode $D_{temp1}$. The second cathode region 18ec corresponds to the first cathode region 18dc of the first temperature detection diode $D_{temp1}$. The second temperature detection diode $D_{temp2}$ is located in parallel to the first temperature detection diode $D_{temp1}$, sandwiching a space equal to the width of each gate electrode as illustrated in FIGS. 1 to 4.

As illustrated in FIGS. 3 and 4, the first temperature detection diode $D_{temp1}$ and the second temperature detection diodes $D_{temp2}$ are located symmetrically in the vertical direction in the middle of the principal surface of the semiconductor device 1 so as to have a mirror image relationship with respect to the central line horizontally extending through the center of the principal surface in the drawings. As illustrated in FIG. 1, both of the first temperature detection diode $D_{temp1}$ and the second temperature detection diodes $D_{temp2}$ are located just above any of the n-type columns 31a to 31h in the thickness direction.

As illustrated in FIG. 4, each of the gate electrodes 8a, 8b, 8c, 8dl, 8dr, 8el, 8er, 8f, 8g, and 8h . . . is made of polycrystalline silicon (polysilicon) doped with first conductivity-type impurities. The gate electrodes 8a, 8b, 8c, 8dl, 8dr, 8el, 8er, 8f, 8g, and 8h . . . have an $n^+$ impurity concentration in a range from about $1 \times 10^{18}$ to about $1 \times 10^{20}$ cm$^{-3}$, specifically about $5 \times 10^{18}$ cm$^{-3}$, for example, which is higher than the impurity concentration of the n-type columns 31a to 31h. The gate electrodes 8a, 8b, 8c, 8dl, 8dr, 8el, 8er, 8f, 8g, and 8h . . . therefore have a comparatively low resistivity.

As illustrated in FIGS. 1 and 4, the gate electrodes 8a, 8b, 8c, 8dl, 8dr, 8el, 8er, 8f, 8g, and 8h . . . linearly extend in the direction perpendicular to the paper of FIG. 1 above the drift layer 3 except the temperature detection area 21 where the first temperature detection diode $D_{temp1}$ and the second temperature detection diodes $D_{temp2}$ are disposed. The gate electrodes 8a, 8b, 8c, 8dl, 8dr, 8el, 8er, 8f, 8g, and 8h . . . have the same line width, measured along the direction, which is illustrated as the horizontal direction in FIG. 1, orthogonal to the extending direction of the gate electrodes, and the gate electrodes 8a, 8b, 8c, 8dl, 8dr, 8el, 8er, 8f, 8g, and 8h . . . are arranged at the same pitch.

As illustrated in FIG. 4, the plane pattern of the gate electrodes 8a, 8b, 8c, 8dl, 8dr, 8el, 8er, 8f, 8g, and 8h . . . is the substantially same as that of the n-type columns 31a to 31h illustrated in FIG. 3. As illustrated to the left in FIG. 4, the principal surface of the semiconductor device 1 is conveniently sectioned into three regions: a middle region M including the temperature detection area 21; a region L above the middle region M; and a region N below the middle region M.

The gate electrodes 8a to 8c and 8f to 8h included in the upper region L and the lower region N extend between the right and left inner end lines of the edge area 23 of the semiconductor device 1. Among the four gate electrodes 8dl, 8dr, 8el, and 8er included in the middle region M, the gate electrodes 8dl and 8el extend between the left inner end line of the edge area 23 and the first or second temperature detection diode $D_{temp1}$ and $D_{temp2}$, and the gate electrodes 8dr and 8er extend between the right inner end line of the edge area 23 and the first or second temperature detection diode $D_{temp1}$ and $D_{temp2}$.

The first anode region 18da and the first cathode region 18dc implement the first temperature detection diode $D_{temp1}$. The two gate electrodes 8dl and 8dr on the right and left sides in FIG. 4 are provided just above the same n-type column 31d as the first temperature detection diode $D_{temp1}$, as illustrated in FIG. 2, and the gate electrode 8dl on the right side and the gate electrode 8dr on the left side are spaced from the first temperature detection diode $D_{temp1}$. As illustrated in FIG. 4, the two gate electrodes 8dl and 8dr and the first temperature detection diode Dtemp1 are aligned to define the same straight line in the plane pattern.

The second anode region 18ea and the second cathode region 18ec implement the second temperature detection diode $D_{temp2}$. The two gate electrodes 8el and 8er on both sides of the second anode region 18ea and the second cathode region 18ec are provided just above the same n-type column 31e as the second temperature detection diode $D_{temp2}$ is in a similar manner to the first temperature detection diode $D_{temp1}$. The two gate electrodes 8el and 8er are individually spaced from the second temperature detection diode $D_{temp2}$ and are aligned with the second temperature detection diode $D_{temp2}$ to define the same straight line in the plane pattern.

Around the first temperature detection diode $D_{temp1}$ and the second temperature detection diodes $D_{temp2}$, six stripe-shaped gate electrodes including the gate electrode 8c, two gate electrode 8dl and 8dr, two gate electrodes 8el and 8er, and gate electrode 8f are allocated being closest to the first temperature detection diode $D_{temp1}$ and the second temperature detection diodes $D_{temp2}$.

As illustrated in FIG. 4, the gate electrode 8c is allocated on the other side of the first temperature detection diode $D_{temp1}$ from the second temperature detection diode $D_{temp2}$. The two gate electrodes 8dl and 8dr are allocated on both sides of the first temperature detection diode $D_{temp1}$ in the longitudinal direction. The two gate electrodes 8el and 8er are located on both sides of the second temperature detection diode $D_{temp2}$, along the longitudinal direction. The gate electrode 8f is allocated on the other side of the second temperature detection diode $D_{temp2}$ from the first temperature detection diode $D_{temp1}$. In other words, the temperature detection area 21 is surrounded by the six gate electrodes 8c, 8dl, 8dr, 8el, 8er, and 8f.

As for each of the gate electrodes 8c and 8f among the six gate electrodes 8c, 8dl, 8dr, 8el, 8er, and 8f, no source regions are disposed on both sides of middle part in the longitudinal direction (corresponding to the first temperature detection diode $D_{temp1}$ and the second temperature detection diode $D_{temp2}$) as illustrated in the top view of FIG. 22 illustrated later. The source region which is the closest to the first anode region 18da and the first cathode region 18dc is a middle part of the source region 6c, which is allocated above the gate electrode 8b (the second gate electrode from the bottom in FIG. 22) in the horizontal direction.

The middle region of the gate electrode 8c which is the third gate electrode from the bottom in FIG. 22 in the horizontal direction is illustrated as an example that is not involved in transistor operation. However, the structure of the source region is not limited to the example illustrated in FIG. 22. For example, a source region may be provided in lower part located on the gate electrode 8b side of the middle region corresponding to the first anode region 18da and the first cathode region 18dc of the gate electrode 8c, which is the third gate electrode from the bottom in FIG. 22, so as to contribute to transistor operation.

As illustrated in FIG. 4, the length of the gap between the first temperature detection diode $D_{temp1}$ and each of the two gate electrodes 8dl and 8dr on both sides of the first temperature detection diode $D_{temp1}$ in the longitudinal direction, is preferably about 5 micrometers in the light of the first temperature detection diode $D_{temp1}$ and the influence of the edge effect of the field intensity by the first temperature detection diode $D_{temp1}$ and the like. The length of the gap between the second temperature detection diode $D_{temp2}$ and each of the two gate electrodes 8el and 8er on both sides of the second temperature detection diode $D_{temp2}$ in the longitudinal direction can be also determined in a similar manner to the gaps on the both sides of the first temperature detection diode $D_{temp1}$.

The interlayer dielectrics 9a, 9b, 9g, 9h ... illustrated in FIG. 1 are respectively laid on the gate electrodes 8a, 8b, 8g, 8h ... included in the upper region L and the lower region N in FIG. 4. The interlayer dielectrics 9a, 9b, 9g, 9h ... illustrated in FIG. 1 have a stripe shape in the plane pattern according to the shape of the gate electrodes 8a, 8b, 8c, 8f, 8g, 8h ....

Figure 23:
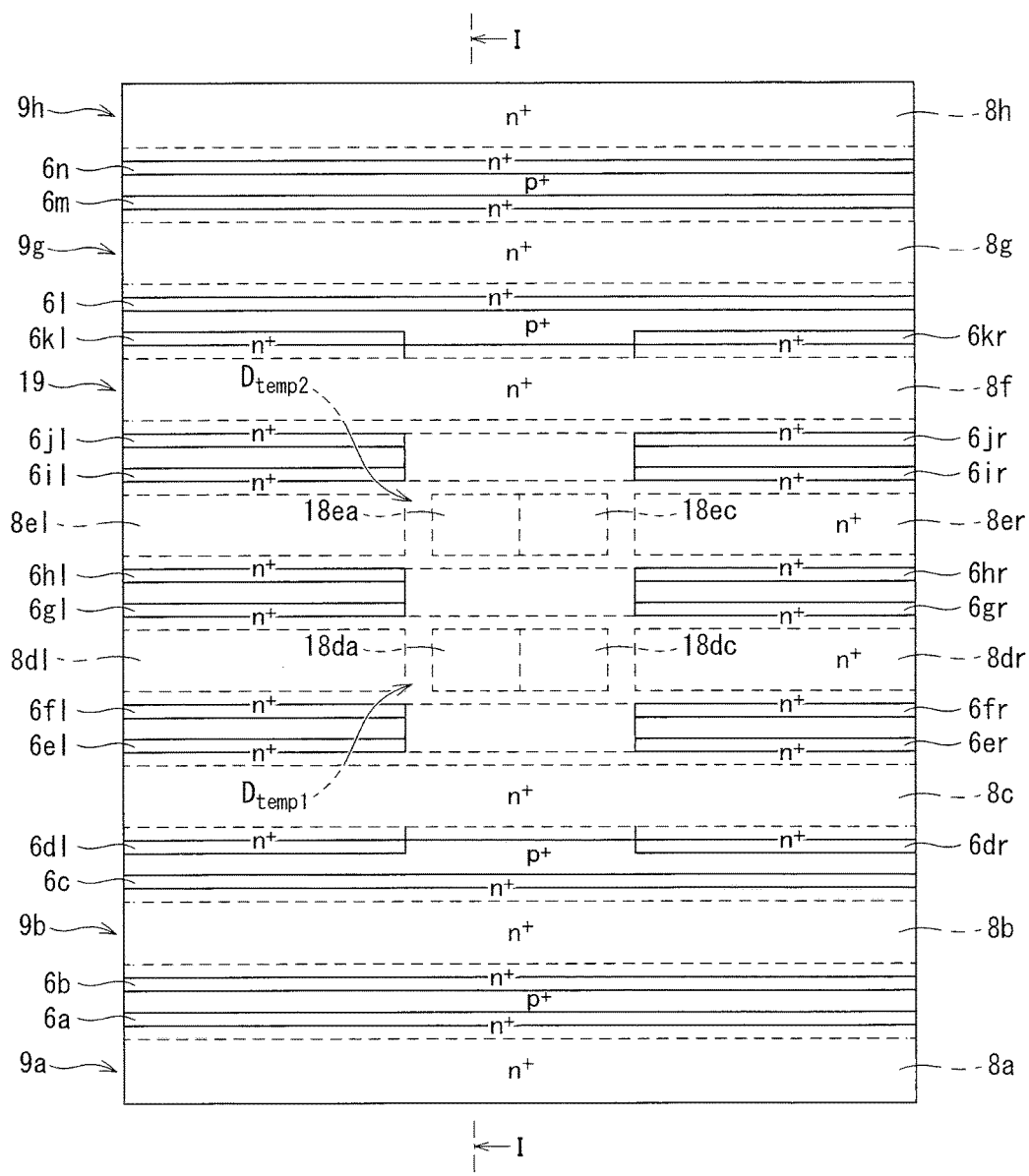
FIG. 23 is a top view illustrating the method of manufacturing a semiconductor device according to the first embodiment (No. 7)

On the other hand, as illustrated in the top view of FIG. 23 later illustrated, the middle interlayer dielectric 19 illustrated in FIG. 1 is integrally laid on the four gate electrodes 8dl, 8dr, 8el, and 8er, which are included in the middle region M, and the first temperature detection diode $D_{temp1}$ and the second temperature detection diode $D_{temp2}$. As illustrated in FIG. 23, the middle interlayer dielectric 19 includes a plate-shaped region which corresponds to the temperature detection area 21 and appears as a vertically-long rectangle in the plane pattern; and six stick-shaped regions each of which appears as a horizontally long rectangle in the plane pattern. Three of the six stick-shaped regions are protruded from one of two long sides of the rectangle of the plate-shaped region and extend along the short sides. The other three stick-shaped regions are protruded from the other long side and extended along the short sides. The middle interlayer dielectric 19 fills the gaps cut around the first temperature detection diode $D_{temp1}$ and the second temperature detection diode $D_{temp2}$, the gaps isolate the six gate electrodes 8c, 8dl, 8dr, 8el, 8er, and 8f from the first temperature detection diode $D_{temp1}$ and the second temperature detection diode $D_{temp2}$.

In the semiconductor device 1 according to the first embodiment, when the semiconductor device 1 is forward biased and gate voltage is applied to the gate electrodes 8a, 8b, 8c, 8dl, 8dr, 8el, 8er, 8f, 8g, 8h ..., channels are implemented between the drift layer 3 and the respective source regions 6a to 6c, 6dl to 6kl, 6dr to 6kr, and 6l to 6n in the well regions 4a to 4g. Current then flows between the source electrode 10 and drain electrode 11. The semiconductor device 1 is thus turned on. When the semiconductor device 1 is operated to cause current to flow to the drift layer 3, the temperature of the semiconductor device 1 rises. The forward voltage of each of the first temperature detection diode $D_{temp1}$ and the second temperature detection diode $D_{temp2}$ therefore changes depending on the temperature of the drift layer 3, and the value of the changed voltage is transferred to the outside through the anode surface interconnection 12a and the cathode surface interconnection 12b. Based on the extracted values, the potential difference is calculated. Based on the calculated potential difference, the temperature of the semiconductor device 1 is detected.

The first anode region 18da and the first cathode region 18dc and the second anode region 18ea and the second cathode region 18*ec* have the same line width and pitch according to the same design rule as those of the n-type columns 31*a* to 31*h* and gate electrodes 8*dl*, 8*dr*, 8*el*, and 8*er* and are provided just above the n-type columns 31*d* and 31*e*. The first anode region 18*da* and the first cathode region 18*dc* and the second anode region 18*ea* and the second cathode region 18*ec* have the same thickness as that of the gate electrodes 8*a*, 8*b*, 8*c*, 8*dl*, 8*dr*, 8*el*, 8*er*, 8*f*, 8*g*, 8*h* . . . . Therefore, surely reducing of the influence of the edge effect of the field intensity and the like by the temperature detection area 21 on the p-n column layer becomes possible, thus preventing significant imbalance of electric charges in the semiconductor device 1.

—Comparative Example—

Figure 5:
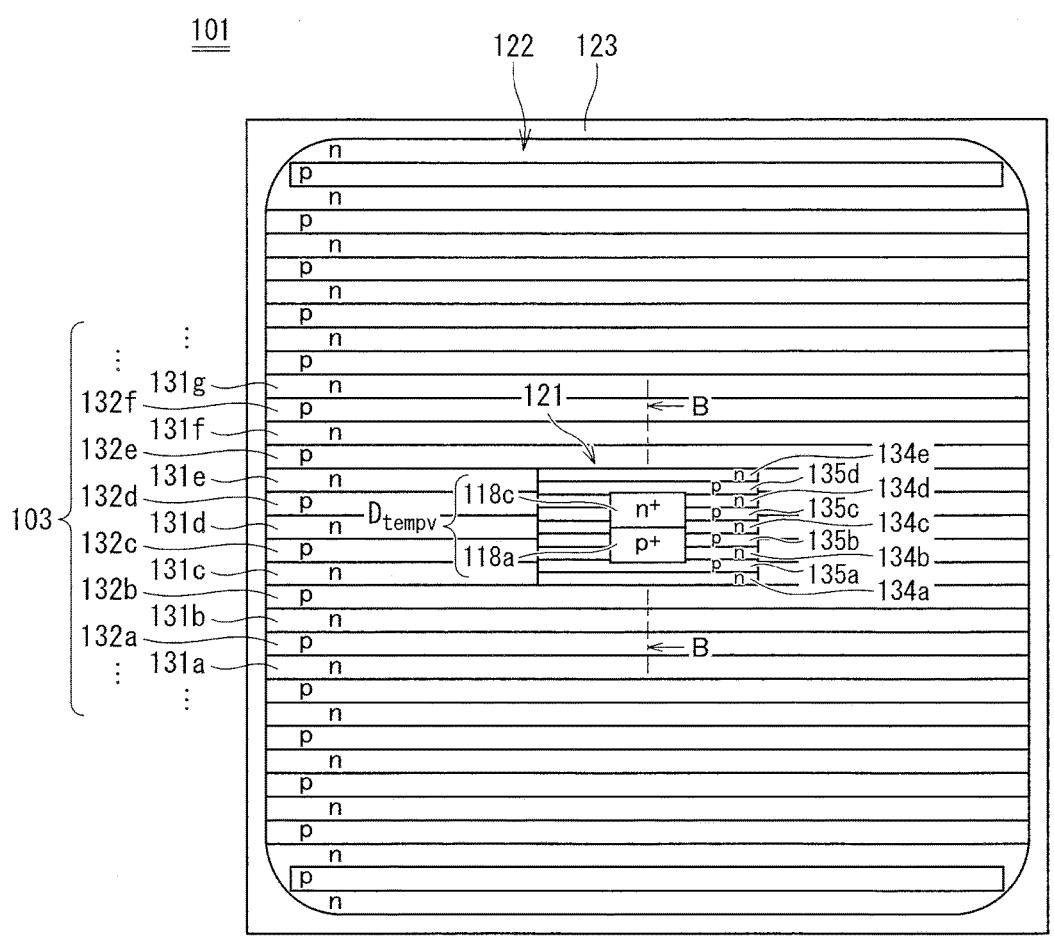
FIG. 5 is a top view schematically explaining the positional relationship between a p-n column layer and a temperature detection diode in the semiconductor device according to a comparative example.

In a semiconductor device 101 according to a comparative example illustrated in the top view of FIG. 5, the length and width of an anode region 118*a* and a cathode region 118*c* of the temperature detection diode $D_{tempv}$, which is provided in the middle of the semiconductor device 1, are larger than the width of n-type columns 131*a* to 131*h* and p-type columns 132*a* to 132*g* of an active area 122.

Figure 6:
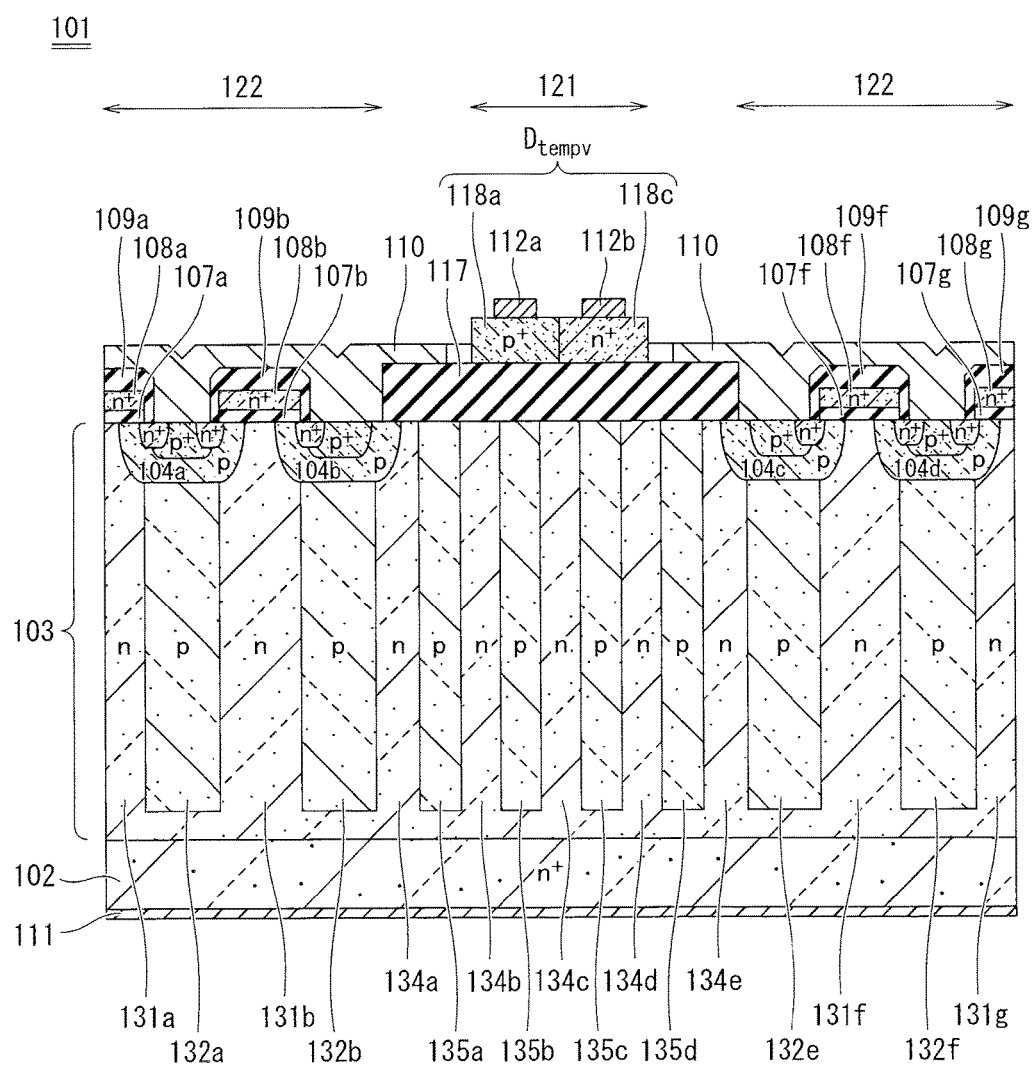
FIG. 6 is a cross-sectional view of the semiconductor device according to the comparative example, taken in the direction of arrows B in FIG. 5.

As illustrated in the cross-sectional view of FIG. 6, the temperature detection diode $D_{tempv}$ of the semiconductor device 101 according to the comparative example is very thick and has three times the thickness of the gate electrodes 108*a*, 108*b*, 108*f*, and 108*g*. The first temperature detection diode $D_{tempv}$ of the semiconductor device 101 according to the comparative example is extremely large in terms of the area of the principal surface and the entire volume compared with the first temperature detection diode $D_{temp1}$ and the second temperature detection diode $D_{temp2}$ according to the first embodiment.

Accordingly, the edge effect of the field intensity and the like by the temperature detection diode $D_{tempv}$ greatly influences the p-n column layer in lower side. When the temperature detection diode having dimensions according to the different design rule is directly located on the drift layer 3 where the p-n column layer having the same structure is uniformly provided across the temperature detection area 21 and active area 22 as illustrated in FIG. 3, the electric charge balance in the entire semiconductor device 101 cannot be maintained.

To reduce the imbalance of electric charges, in the semiconductor device 101 according to the comparative example, the width of each of n-type columns 134*a* to 134*e* and p-type columns 135*a* to 135*d* in the temperature detection area 121 is designed to be about five-ninths of the width of the n-type columns 131*a* to 131*h* and p-type columns 132*a* to 132*g* in the active area 122. However, the structure of the connections (junctions) in the p-n column layer significantly changes at the boundary between the active area 122 and temperature detection area 121 in the drift layer 103, thus leading to a reduction in breakdown voltage.

The length of the temperature detection area 121 in the direction that the p-n column layer extends, which is illustrated as the horizontal direction in FIG. 5, is very long, about three times the length of the anode and cathode regions 118*a* and 118*c* of the temperature detection diode $D_{tempv}$ in the horizontal direction. The reason is because the imbalance of electric charges cannot be sufficiently reduced only by changing the design of the p-n column layer in the region just under the temperature detection diode $D_{tempv}$ and the design change is applied to a larger area. The area of the temperature detection area 121 is therefore increased in the plane pattern. The structure different from structure of the p-n column layer of the active area 122 occupies a high proportion of the semiconductor device 101. In other words, the ratio of the ineffective area not involved in electric conduction in the semiconductor device 101 is increased, resulting in an increase in cost of the semiconductor device 101.

Moreover, even when the temperature detection area 121 is increased, the imbalance of electric charges cannot be reduced sufficiently in some cases. As illustrated in FIG. 6, for example, a middle insulating film 117, which is provided in the temperature detection area 121 on the upper surface of the drift layer 103, is very thick, about four times the thickness of the gate insulating films 107*a*, 107*b*, 107*f*, and 107*g*, which are provided between well regions 104*a* to 104*g*. Providing the thick middle insulating film 117 can prevent the imbalance of electric charges to a certain extent. However, the increased distance between the drift layer 103 and the temperature detection diode $D_{tempv}$ degrades the accuracy of temperature detection.

With the semiconductor device 1 according to the first embodiment, the p-n column layer is provided across the active area 22 and temperature detection area 21 in the drift layer 3 so that the columns regularly appear as repeated stripes of the same line width in the plane pattern. The repetition pitch of the stripes and impurity concentration are uniform in the p-n column layer. Moreover, the gate electrodes 8*a* to 8*c*, 8*dl*, 8*dr*, 8*el*, 8*er*, and 8*f* to 8*h*, the first temperature detection diode $D_{temp1}$ and the second temperature detection diode $D_{temp2}$, which have the same thickness, are provided on the n-type columns 31*a* to 31*h* so as to have the same line width as the n-type columns 31*a* to 31*h*.

Provision of the p-n column layer, the gate electrodes 8*a* to 8*c*, 8*dl*, 8*dr*, 8*el*, 8*er*, and 8*f* to 8*h*, and the first temperature detection diode $D_{temp1}$ and the second temperature detection diode $D_{temp2}$ considerably reduces the imbalance of electric charges in the p-n column layer. Accordingly, even when the first temperature detection diode $D_{temp1}$ and the second temperature detection diode $D_{temp2}$ are allocated in a middle area of the principal surface of the semiconductor device 1, the first temperature detection diode $D_{temp1}$ and the second temperature detection diode $D_{temp2}$ can accurately detect temperature with the breakdown voltage of the semiconductor device 1 prevented from being reduced, with no influence on the performance of the semiconductor device 1 as the main device.

In the semiconductor device 1 according to the first embodiment, the length of the temperature detection area 21 in the direction that the p-n column layer extends can be set equal to about the length of the first temperature detection diode $D_{temp1}$ and the second temperature detection diode $D_{temp2}$ in the direction of the p-n junction. Accordingly, the temperature detection area 21 does not need to be large unnecessarily like the temperature detection area 121 illustrated in FIG. 5. Therefore, minimizing the proportion of the ineffective area in the semiconductor device 1 becomes possible.

In the semiconductor device 1 according to the first embodiment, the first middle insulating film 17*d* under the first temperature detection diode $D_{temp1}$ and the second middle insulating film 17*e* under the second temperature detection diode $D_{temp2}$ can be made as thin as the gate insulating films 7*a*, 7*b*, 7*c*, 7*dl*, 7*dr*, 7*el*, 7*er*, 7*f*, 7*g*, and 7*h*. Accordingly, the distance between the drift layer 3 and the first temperature detection diode $D_{temp1}$ and the second temperature detection diode $D_{temp2}$ is not increased unnecessarily. Therefore, detecting temperature at high accuracy even when the first temperature detection diode $D_{temp1}$ and the second temperature detection diode $D_{temp2}$ are allocated above the middle area in the principal surface of the semiconductor device 1 becomes possible.

In the semiconductor device 1 according to the first embodiment, the width of the space between the temperature detection area 21 and active area 22 is controlled by partially providing a region not involved in transistor operation for each of the gate electrode 8c, which is on the other side of the first temperature detection diode $D_{temp1}$ from the second temperature detection diode $D_{temp2}$, and the gate electrode 8f, which is on the other side of the second temperature detection diode $D_{temp2}$ from the first temperature detection diode $D_{temp1}$. Accordingly, the imbalance of electric charges, in the direction that the first temperature detection diode $D_{temp1}$ and the second temperature detection diode $D_{temp2}$ are arranged side by side, can be effectively reduced.

In the semiconductor device 1 according to the first embodiment, plane patterns of the n-type columns 31a to 31h and p-type columns 32a to 32g, the well regions 4a go 4g, and the gate electrodes 8a to 8c, 8dl, 8dr, 8el, 8er, and 8f to 8h are stripes, the longitudinal directions of which are parallel. However, the first embodiment, the plane patterns of the n-type columns 31a to 31h and p-type columns 32a to 32g may be orthogonal to the stripe plane patterns of the well regions 4a to 4g and gate electrodes 8a to 8c, 8dl, 8dr, 8el, 8er, and 8f to 8h.

—First Modification—

In the semiconductor device 1 illustrated in FIGS. 1 to 4, the first temperature detection diode $D_{temp1}$ and the second temperature detection diode $D_{temp2}$ are connected in parallel. However, in the semiconductor device according to the present invention, the first temperature detection diode $D_{temp1}$ and the second temperature detection diode $D_{temp2}$ may be connected in series as illustrated in the top view of FIG. 7. The first temperature detection diode $D_{temp1}$ and the second temperature detection diode $D_{temp2}$ are arranged side by side similarly as illustrated in FIGS. 1 to 4 so that the positions of the first anode region 18da and the second anode region 18ea directly face each other, while the positions of the first cathode region 18dc and the second cathode region 18ec directly face each other.

Figure 7:
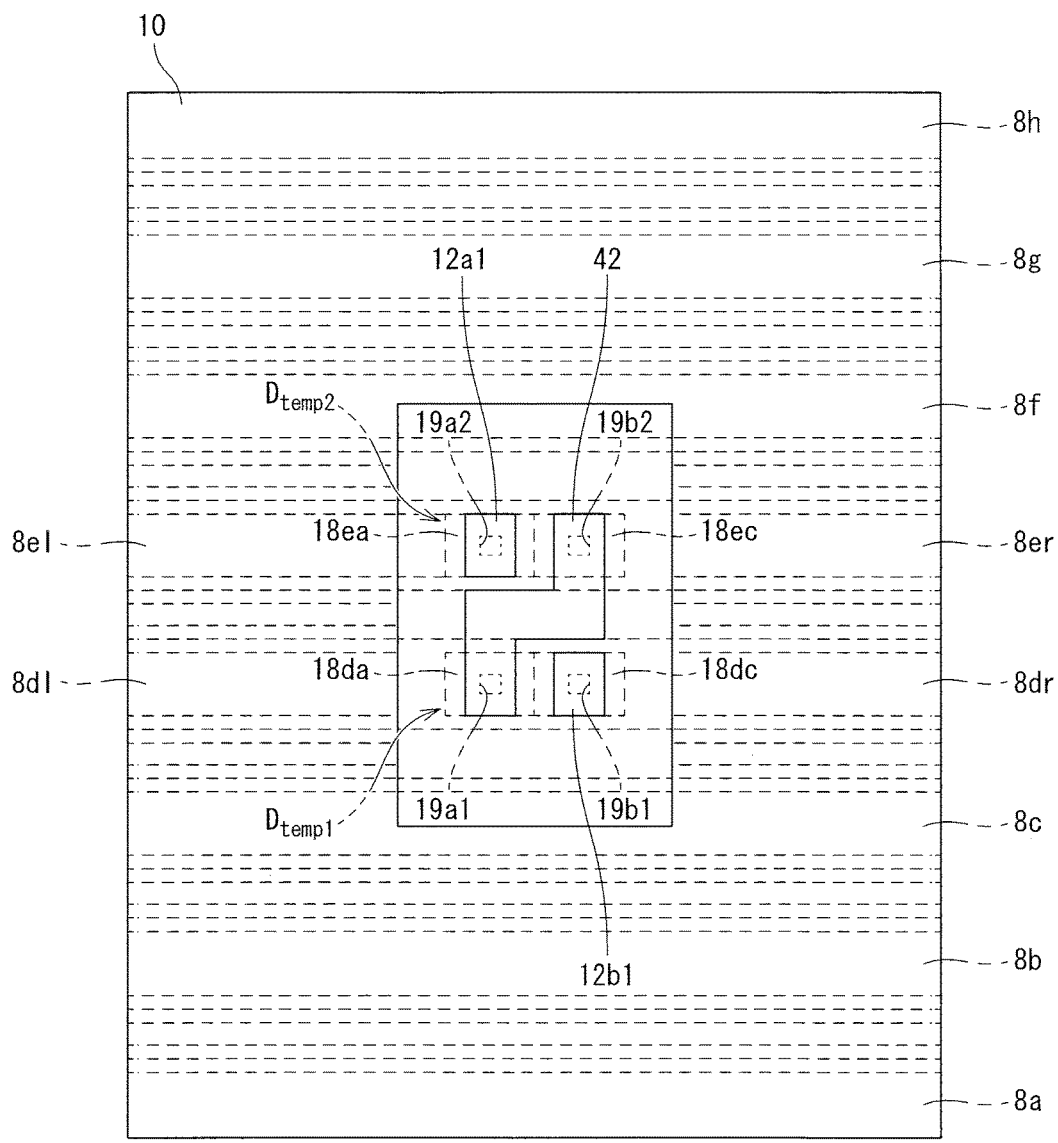
FIG. 7 is a top view schematically illustrating the configuration of a semiconductor device according to a first modification, the view illustrates a cross section of the semiconductor device at the same height as the upper surfaces of anode and cathode surface interconnections.

FIG. 7 illustrates an anode surface interconnection 12a1 by way of example, which is connected to the second anode region 18ea of the second temperature detection diode $D_{temp2}$ through the contact hole 19a2. FIG. 7 illustrates a diagonal intermediate wiring 42, which runs between the first anode region 18da of the first temperature detection diode $D_{temp1}$ and the second cathode region 18ec of the second temperature detection diode $D_{temp2}$ to connect the first anode region 18da and the second cathode region 18ec.

The diagonal intermediate wiring 42 is provided through the contact hole 19a1 dug just above the first anode region 18da and the contact hole 19b2 dug just above the second cathode region 18ec. The cathode surface interconnection 12b1 is connected to the first cathode region 18dc of the first temperature detection diode $D_{temp1}$ through the contact hole 19b1.

—Second Modification—

In the description of FIG. 7, the first temperature detection diode $D_{temp1}$ and the second temperature detection diode $D_{temp2}$ arranged side by side are connected in series. However, the semiconductor device according to the present invention may include plural temperature detection diodes which are serially aligned along the same straight line and are connected in series. In the case of a semiconductor device 1x illustrated in the cross-sectional view of FIG. 8, triple temperature detection diodes 18el, 18e2, and 18e3 are connected in series and are aligned along the same straight line just above the n-type column 31e.

Figure 8:
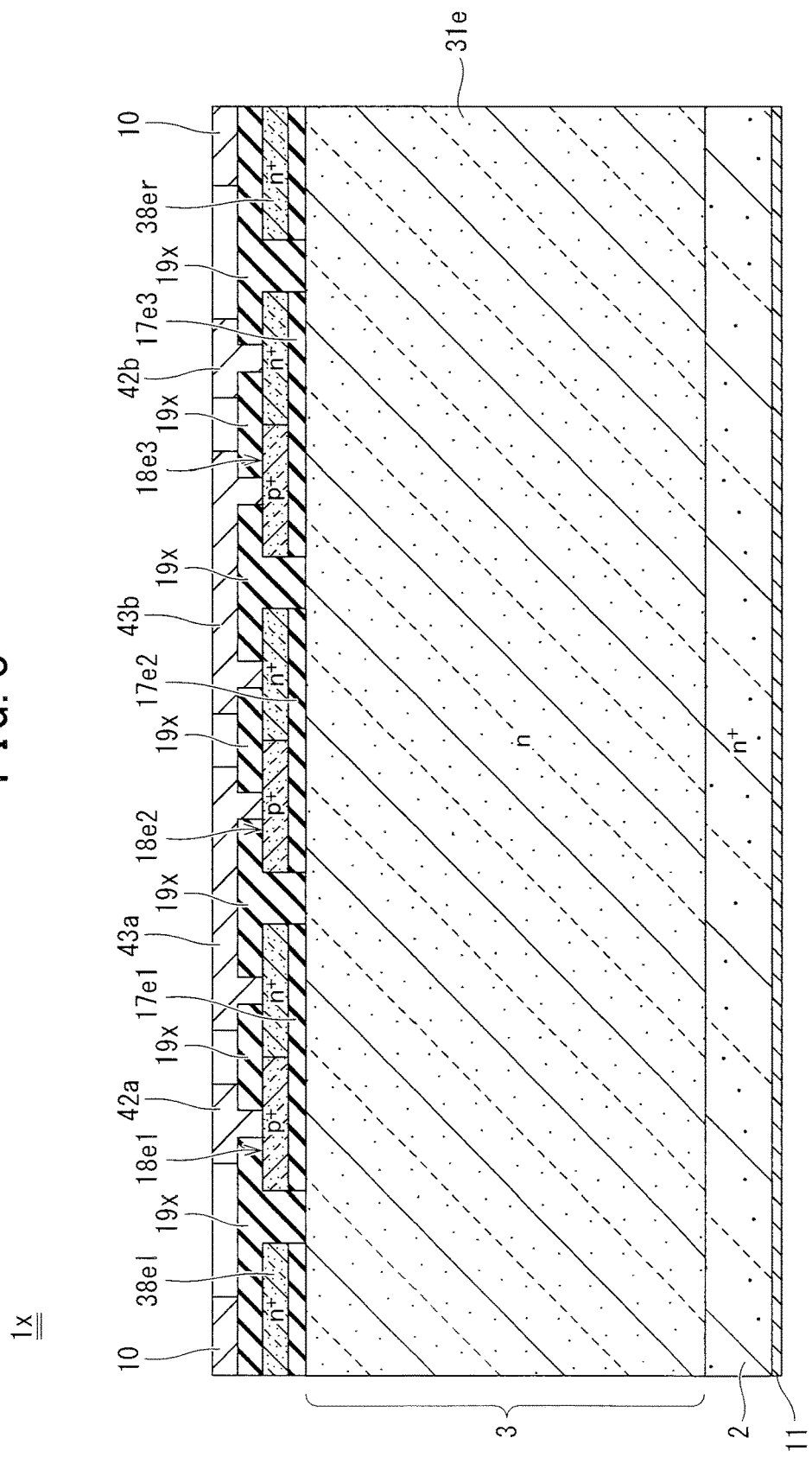
FIG. 8 is a cross-sectional view schematically illustrating the configuration of a semiconductor device according to a second modification.

In the semiconductor device 1x, the p-n column layer is uniformly embedded across the active area and the temperature detection area so that the columns regularly appear as repeated stripes of the same line width in the plane pattern in the drift layer 3. FIG. 8 is a cross-sectional view of a semiconductor device 1x according to the second modification. FIG. 8 is a view corresponding to a case where a view is taken along a plane parallel to the extending direction of the n-type column 31e inside the n-type column 31e extending laterally in the semiconductor element 1 illustrated in FIG. 3. In FIG. 8, two gate electrodes 38e 1 and 38er are disposed just above the same n-type column 31e on which the triple temperature detection diodes 18e1, 18e2, and 18e3 are provided. Each of the gate electrodes 38e 1 and 38er has the same thickness and the same width as the thickness and the width of the n-type columns 31e. The two gate electrodes 38e 1 and 38er are allocated so as to sandwich the triple temperature detection diodes 18e1, 18e2, and 18e3 between the front and back sides of the alignment of the triple temperature detection diodes 18e1, 18e2, and 18e3, along the series connection direction.

The p-type anode region of the temperature detection diode 18el (the left one in FIG. 8) among the triple temperature detection diodes 18e1, 18e2, and 18e3 is connected to an anode surface interconnection 42a through a contact hole cut in a middle interlayer dielectric 19x. The n-type cathode region of the temperature detection diode 18e1 is connected to the anode region of the temperature detection diode 18e2 (the middle one in FIG. 8) among the triple temperature detection diodes 18e1, 18e2, and 18e3 by a first intermediate wiring 43a.

The cathode region of the middle temperature detection diode 18e is connected to the anode region of the temperature detection diode 18e3 illustrated in the right in FIG. 8 among the triple temperature detection diodes 18e1, 18e2, and 18e3 by a second intermediate wiring 43b. The cathode region of the right temperature detection diode 18e3 is connected to a cathode surface interconnection 42b through a contact hole cut in the middle interlayer dielectric 19x.

In the semiconductor devices according to the first and second modifications, similarly to the semiconductor device 1 illustrated in FIGS. 1 to 4, even when the temperature detection diodes are provided, the imbalance of electric charges in the p-n column layer is considerably reduced. The semiconductor devices according to the first and second modifications therefore can conduct the temperature detection, effectively preventing the breakdown voltage from being reduced, with no influence on the performance of the semiconductor devices as the main devices, respectively.

Moreover, even if the potential difference detected by each of the temperature detection diodes is comparatively small, the triple temperature detection diodes connected in series can increase the output voltage so as to achieve a desired level of the potential difference for temperature detection. The other performances and effectiveness of the semiconductor devices according to the first and second modifications are the same as those of the semiconductor device 1 illustrated in FIGS. 1 to 4.

—Third Modification—

Figure 9:
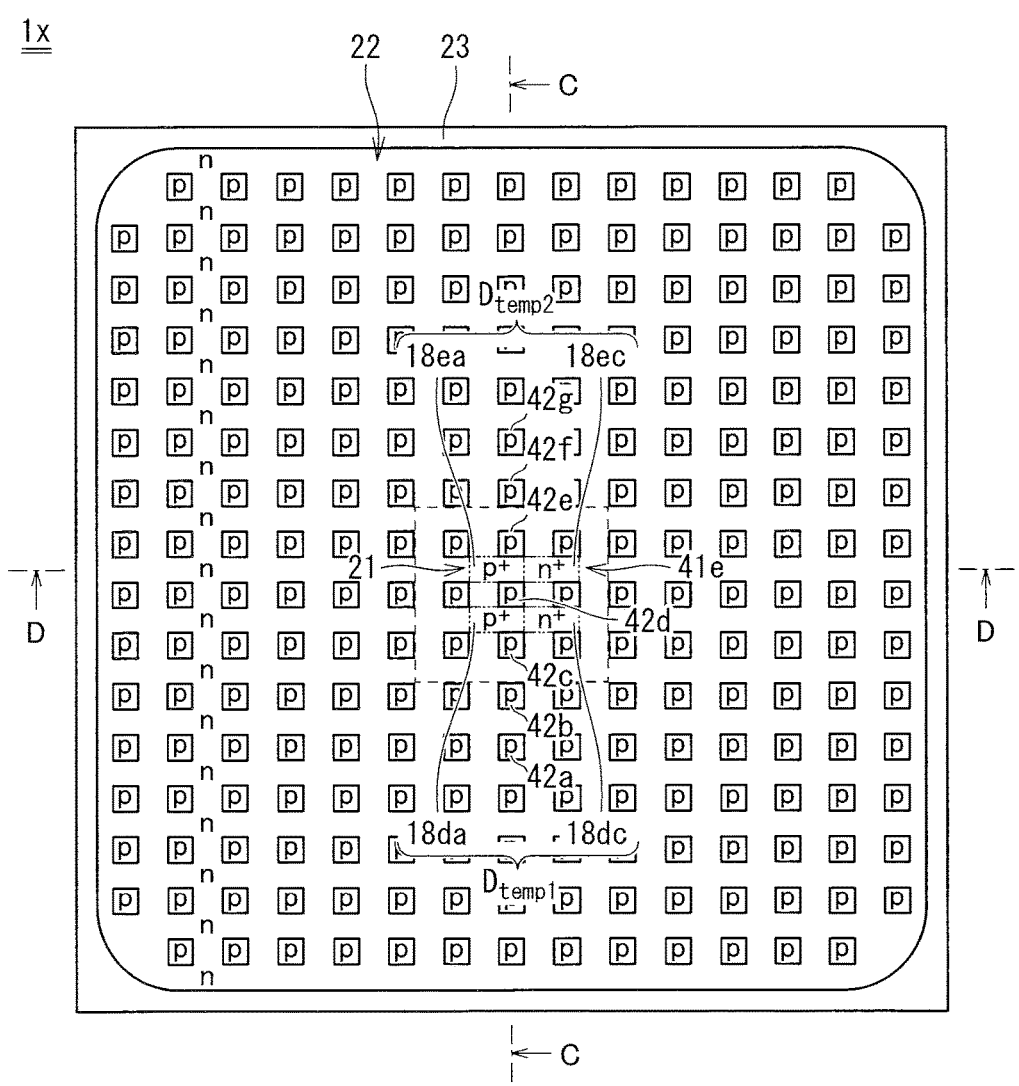
FIG. 9 is a top view of a semiconductor device according to a third modification, schematically illustrating the positional relationship between the p-n column layer and temperature detection diodes.

In the semiconductor device 1 described with FIGS. 1 to 4, the temperature detection diodes are disposed above the p-n column layer having a stripe plane pattern. However, the semiconductor device of the present invention can be implemented by a p-n column layer having a different topology of plane pattern from the stripe plane pattern. As illustrated in the top view of FIG. 9, for example, a p-n column layer of a third modification of the semiconductor device according to the first embodiment of the present invention could be arranged so that plural p-type columns . . . , 42a to 42g, . . . appear as rectangular dots in the plane pattern. The plural p-type columns . . . , 42a to 42g . . . are buried in a layer of the first conductivity-type indicated by "n" in the active area 22. FIG. 9 illustrates a horizontal cross section of the semiconductor device 1x, being cut in parallel to the principal surface at a depth, which can include the p-type columns . . . , 42a to 42g . . . .

Figure 10:
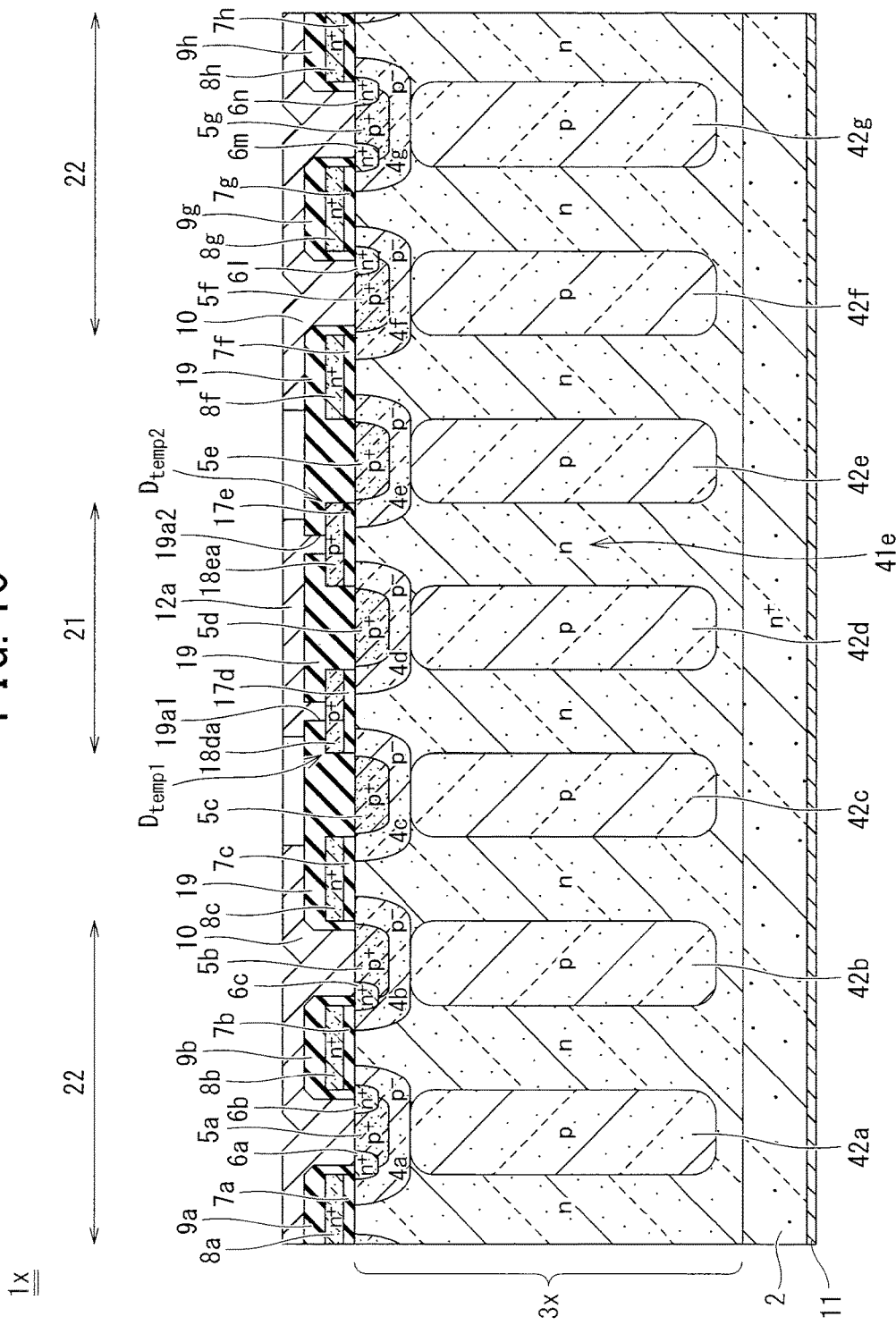
FIG. 10 is a cross-sectional view of the semiconductor device according to the third modification, taken in the direction of arrows C in FIG. 9.

As illustrated in the cross-sectional view of FIG. 10, the p-type columns . . . , 42a to 42g, . . . are substantially cuboids having the same dimensions and are vertically long to the principal surface of the layer of the first conductivity-type. The p-type columns . . . , 42a to 42g, . . . have substantially square upper surfaces and are spaced from each other and arranged at regular intervals in the vertical and horizontal directions in FIG. 9. As illustrated in FIG. 10, the maximum width of the p-type columns . . . , 42a to 42g, . . . is substantially equal to the gate width of the gate electrodes 8a to 8c and 8f to 8h.

In the cuboid of each of the p-type columns . . . , 42a to 42g, . . . , of the example of FIG. 10, four corners of the upper base and four corners of the lower base are rounded. However, the cuboid may have right angle corners as illustrated in FIG. 1 or may have corners more rounded than the example illustrated in FIG. 10. The sides of the cuboid which connect the upper and lower base planes of the cuboid, the sides included in a side face of the cuboid, do not need to be straight lines as illustrated in FIG. 10 and may include a concave or convex topology.

A plurality of regions allocated between the p-type columns . . . , 42a to 42g, . . . in the layer of the first conductivity-type other than the p-type columns . . . , 42a to 42g, . . . are defined as n-type columns . . . , 41e, . . . , thus implementing a p-n column buried in a drift layer 3x. The semiconductor device 1x according to the third modification is different from the semiconductor device 1 according to the first embodiment in that the plane patterns of the n-type columns . . . , 41e, . . . implement a grid and the plane patterns (planar shape) of the p-type columns . . . , 42a to 42g, . . . are grid cells.

The first temperature detection diode $D_{temp1}$ and the second temperature detection diode $D_{temp2}$ according to the third modification are allocated on the first and second middle insulating films 17d and 17e, which are laminated above the n-type columns . . . , 41e, . . . in a similar manner to the semiconductor device 1 according to the first embodiment. The first temperature detection diode $D_{temp1}$ and the second temperature detection diode $D_{temp2}$ have the same line width and thickness as the gate electrodes 8a to 8c and 8f to 8h, and are provided at the same height as the gate electrodes 8a to 8c and 8f to 8h. In the example illustrated in the cross-sectional view of FIG. 11, the second temperature detection diode $D_{temp2}$, which is allocated just above the n-type column 41e embedded in the drift layer 3, is isolated from the gate electrodes 8el and 8er adjacent to the gate electrodes 8el and 8er by spaces.

Figure 11:
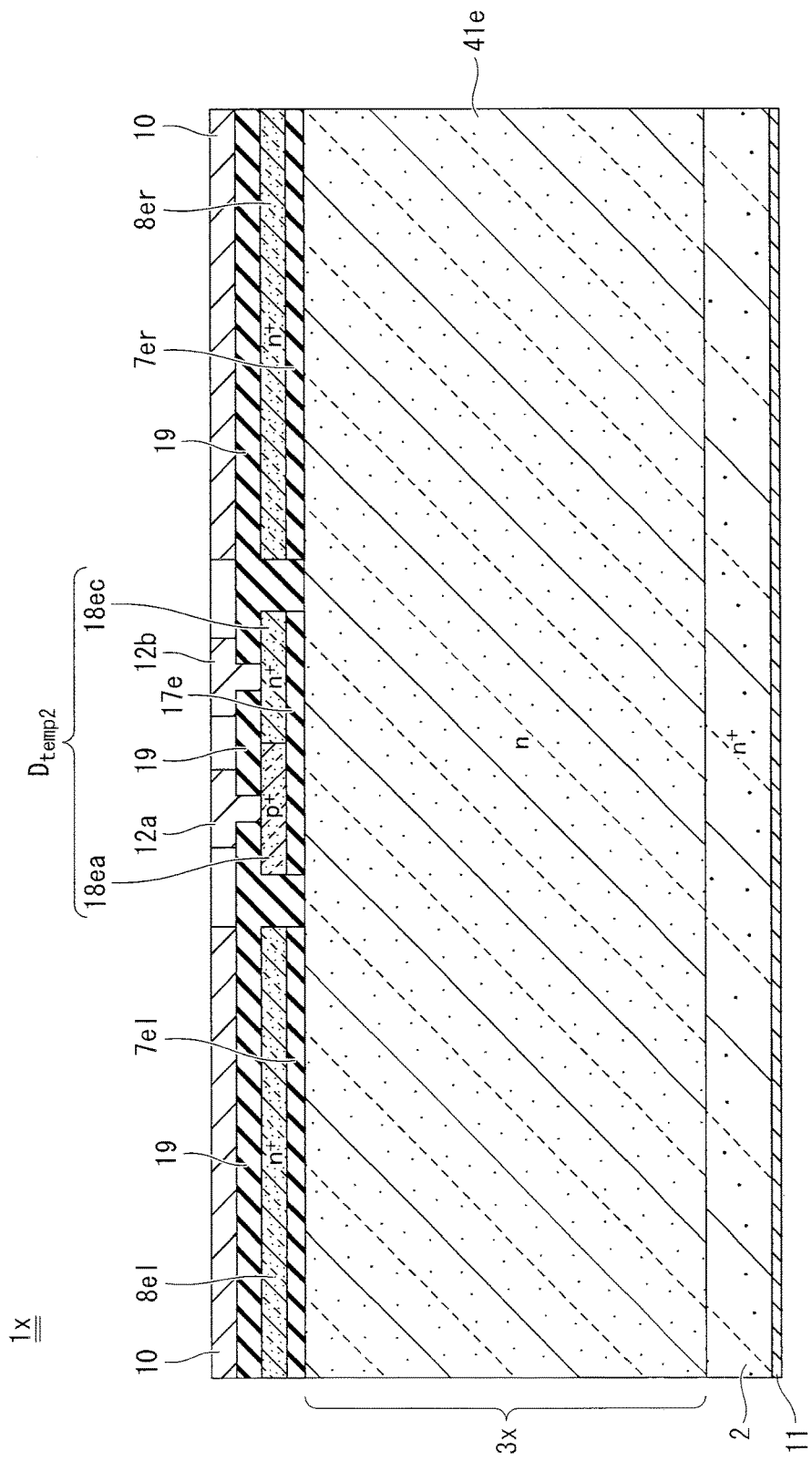
FIG. 11 is a cross-sectional view of the semiconductor device according to the third modification, taken in the direction of arrows D in FIG. 9.

As illustrated in FIGS. 10 and 11, the other structures of the gate electrodes 8a to 8c, 8el, 8er, 8f to 8h, the first temperature detection diode $D_{temp1}$ and the second temperature detection diode $D_{temp2}$ are equivalent to the structures of the constituent members with the same names in the semiconductor device 1 according to the first embodiment. The gate electrodes 8a to 8c, 8el, 8er, 8f to 8h, the first temperature detection diode $D_{temp1}$ and the second temperature detection diode $D_{temp2}$ are delineated as a stripe plane pattern. The other structures of the well regions 4a to 4g, contact regions 5a to 5g, and the like of the semiconductor device 1x are the substantially same as the structures of the semiconductor device 1 described in FIGS. 1 to 4, and the overlapping description of the structures is omitted.

Even when the first temperature detection diode $D_{temp1}$ and the second temperature detection diode $D_{temp2}$ are allocated in a middle area of the principal surface above the p-n column layer which has the grid plane pattern like the semiconductor device 1x according to the third modification, the semiconductor device can achieve an accurate temperature detection, preventing effectively the breakdown voltage from being reduced, with no influence on the performance the semiconductor device 1x as the main device. The other performances and effectiveness of the semiconductor device 1x according to the third modification are the same as those of the semiconductor device 1 illustrated in FIGS. 1 to 4.

—Fourth Modification—

In a semiconductor device 1y according to a fourth modification, similarly to the third modification, n-type columns . . . , 51e, . . . are delineated as the grid plane pattern, while the plane patterns (planar shape) of p-type columns . . . , 52d, . . . are buried as grid cells. However, the semiconductor device 1y is different from the semiconductor device 1x of the third modification in that the upper surfaces of the plural p-type columns . . . , 52d, . . . are precise circles of the same dimensions as illustrated in the top view of FIG. 12.

Figure 13:
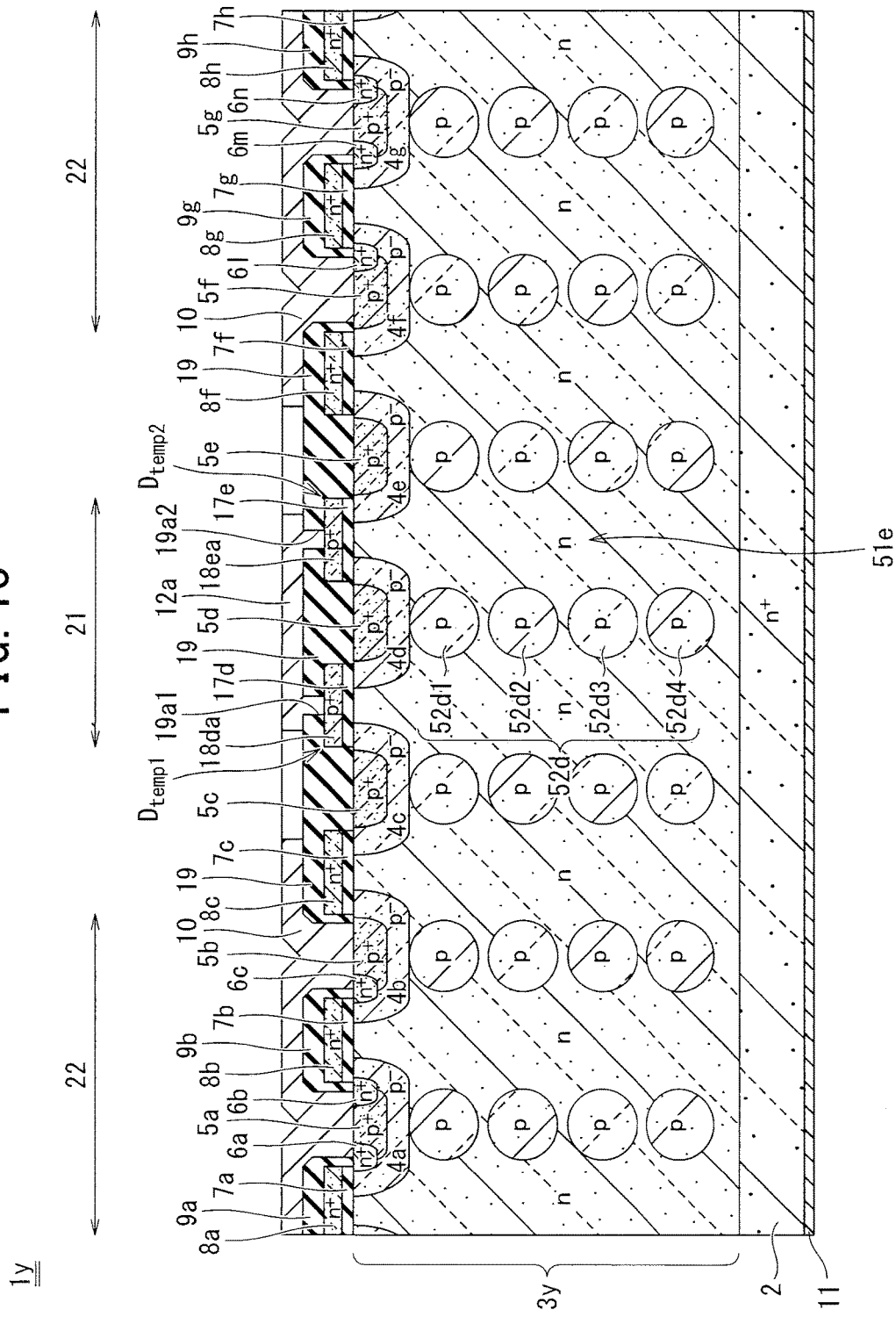
FIG. 13 is a cross-sectional view of the semiconductor device according to the fourth modification, taken in the direction of arrows E in FIG. 12.

As illustrated in the cross-sectional view of FIG. 13, the p-type column 52d is implemented by four p-type regions 52d1, 52d2, 52d3, and 52d4 vertically aligned, being spaced from each other, between the upper and lower surfaces of a drift layer 3y. The four p-type regions 52d1, 52d2, 52d3, and 52d4, which implement the p-type column 52, are spheres of the substantially same dimensions, respectively. The centers of the p-type regions 52d1, 52d2, 52d3, and 52d4 are aligned in the substantially same straight line in the drift layer 3y.

Figure 12:
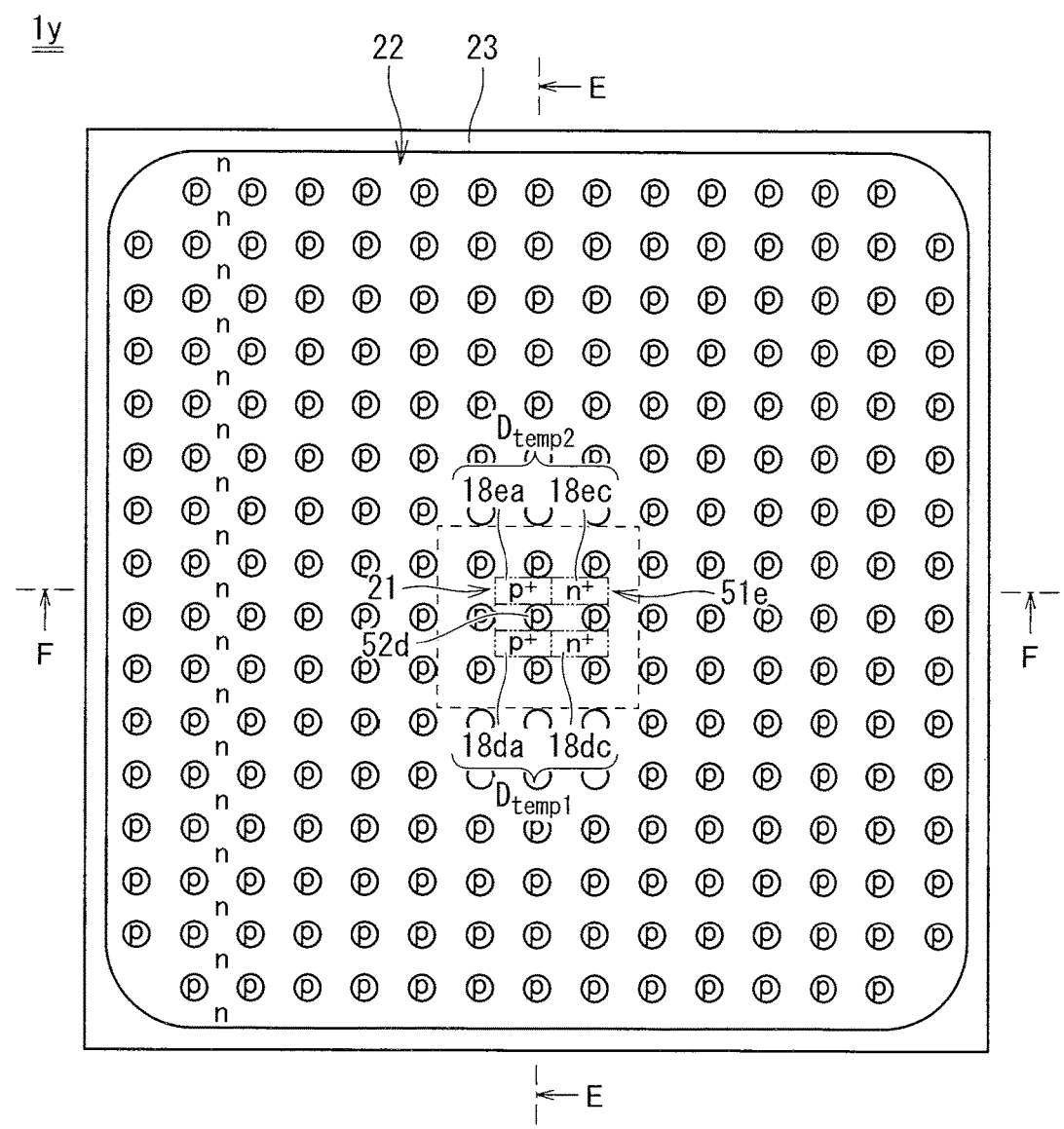
FIG. 12 is a top view of a semiconductor device according to a fourth modification, schematically illustrating the positional relationship between the p-n column layer and temperature detection diodes.

In the p-n column layer according to the fourth modification, each of the p-type columns includes an aligned plural p-type regions, being separated in the direction vertical to the principal surface, so as to establish a straight line topology. FIG. 12 illustrates a horizontal cross section of the semiconductor device 1y, cut in parallel to the principal surface at a depth which can include the p-type columns . . . , 52d, . . . . The centers of the spheres of the p-type regions 52d1, 52d2, 52d3, and 52d4 are cut by the horizontal cross section. The shape of the p-type columns . . . , 52d, . . . is not limited to the sphere and may be a flat-deformed shape such as an oval shape or a football shape.

The first temperature detection diode $D_{temp1}$ and the second temperature detection diode $D_{temp2}$ according to the fourth modification are also allocated on the first middle insulating film 17d and the second middle insulating film 17e, respectively, which are set above the n-type columns . . . , 51e, . . . in a similar manner to the semiconductor device 1 according to the first embodiment. The first temperature detection diode $D_{temp1}$ and the second temperature detection diode $D_{temp2}$ have the same line width and thickness as the gate electrodes 8a to 8c and 8f to 8h. And the first temperature detection diode $D_{temp1}$ and the second temperature detection diode $D_{temp2}$ are provided at the same height as the gate electrodes 8a to 8c and 8f to 8h. In the example illustrated in the cross-sectional view of FIG. 14, the second temperature detection diode $D_{temp2}$, which is disposed just above the n-type column 51e buried in the drift layer 3y, is isolated from the adjacent gate electrodes 8el and 8er by spaces.

Figure 14:
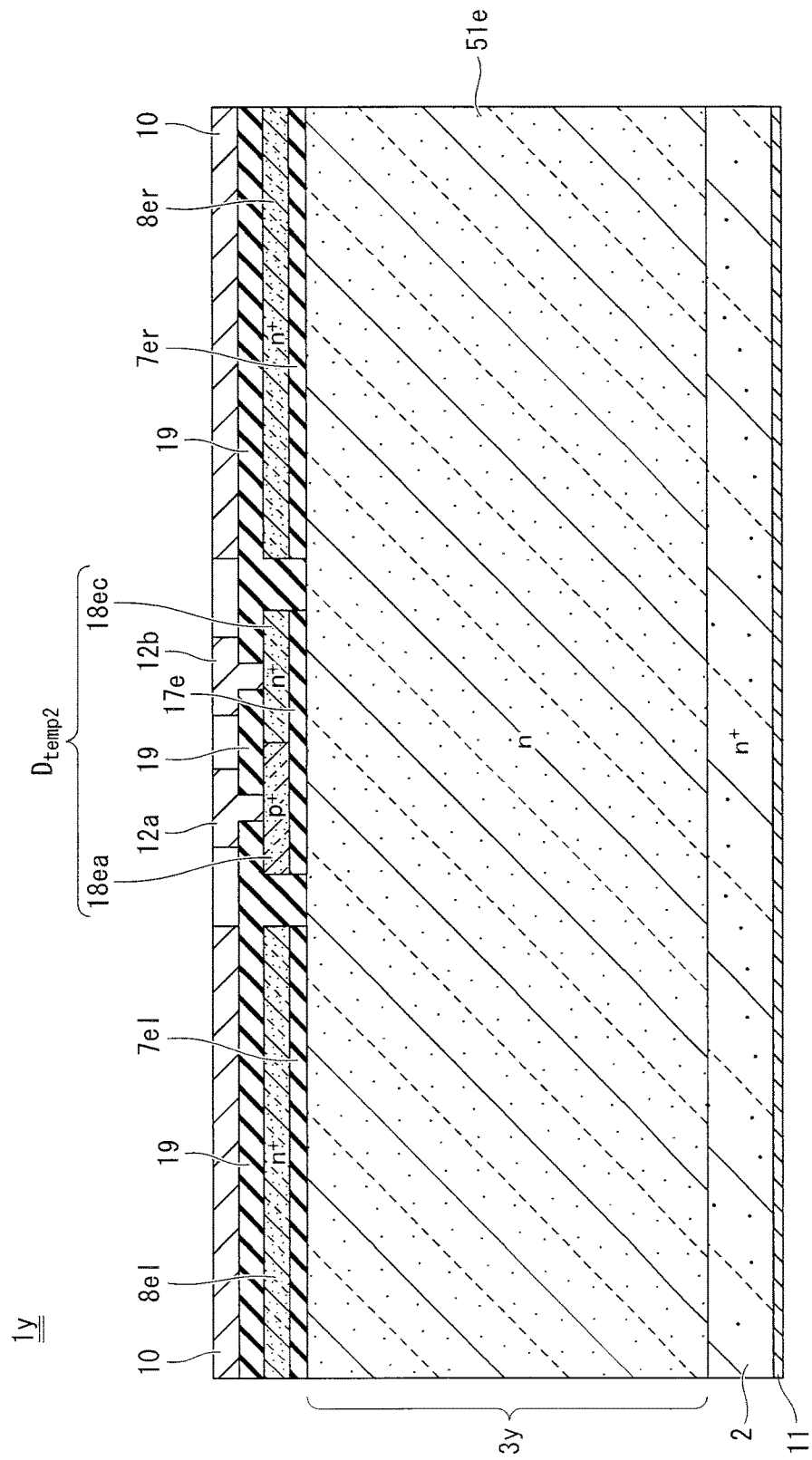
FIG. 14 is a cross-sectional view of the semiconductor device according to the fourth modification, taken in the direction of arrows F line in FIG. 12.

As illustrated in FIGS. 13 and 14, the other configurations of the gate electrodes 8a to 8c, 8el, 8er, 8f to 8h, the first temperature detection diode $D_{temp1}$ and the second temperature detection diode $D_{temp2}$ are equivalent to the structures of the constituent members given with the same names as the semiconductor device 1 according to the first embodiment. The gate electrodes 8a to 8c, 8el, 8er, 8f to 8h, the first temperature detection diode $D_{temp1}$ and the second temperature detection diode $D_{temp2}$ are delineated as a stripe plane pattern. The other structures of the well regions 4a to 4g, contact regions 5a to 5g, and the like of the semiconductor device 1y are the substantially same as the structures of the semiconductor device 1 according to the first embodiment, and the overlapping description of the structures is omitted.

Even when the first temperature detection diode $D_{temp1}$ and the second temperature detection diode $D_{temp2}$ are provided on the middle area in the principal surface above the p-n column layer, in which a vertical array of plural p-type regions isolated from each other implements each of the p-type columns, the semiconductor device can achieve accurate temperature detection, and can prevent effectively the breakdown voltage from being reduced, with no influence on the performance of the semiconductor device 1y as the main device. The other performances and effectiveness of the semiconductor device 1y according to the fourth modification are the same as those of the semiconductor device 1 illustrated in FIGS. 1 to 4.

—Manufacturing Method of Semiconductor Device—

Next, a method of manufacturing a semiconductor device according to the first embodiment will be explained.

Figure 15:
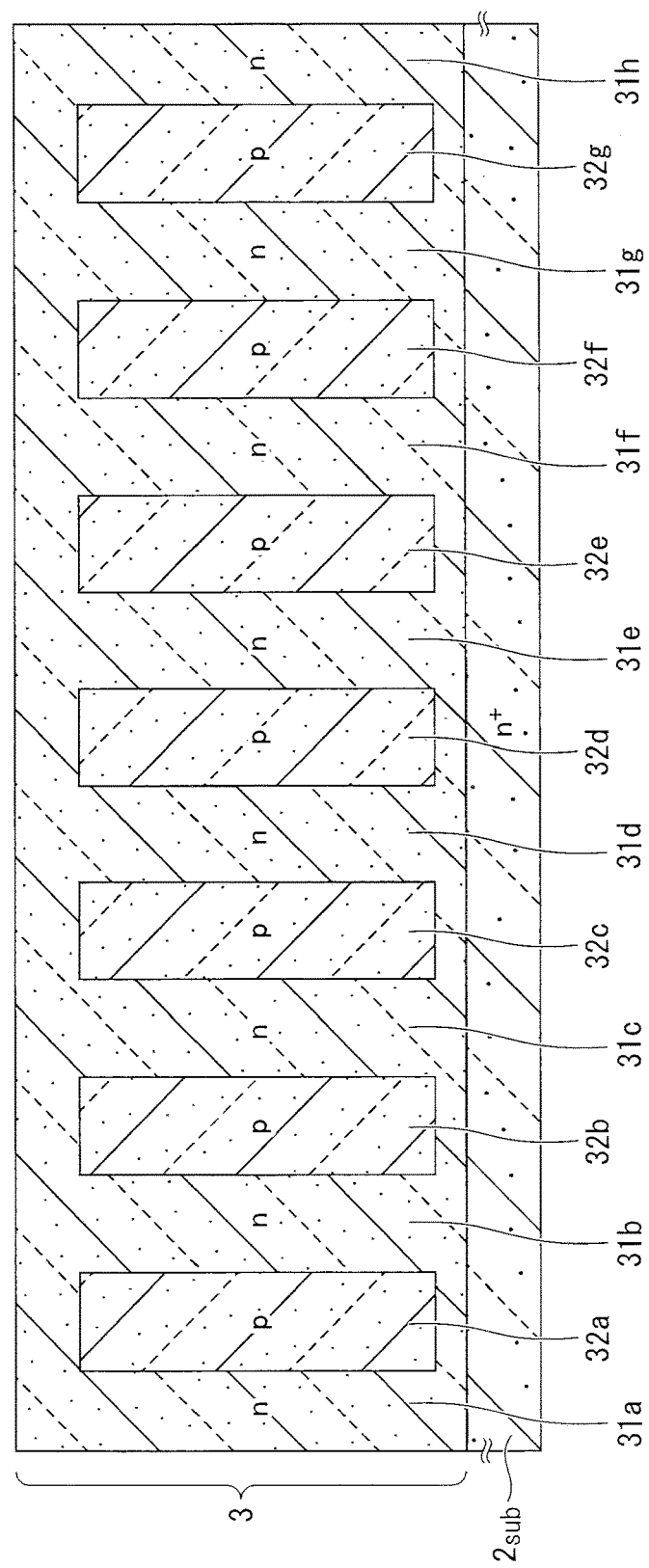
FIG. 15 is a schematic cross-sectional process view illustrating a method of manufacturing a semiconductor device according to the first embodiment (No. 1)

(a) As illustrated in the cross-sectional view of FIG. 15, on one of the principal surfaces of the semiconductor substrate $2_{sub}$, which will serve as a drain region 2, made of n$^+$ Si, for example, the semiconductor substrate $2_{sub}$ has a predetermined thickness, a first epitaxial layer containing an n-type impurity element is grown to a thickness of about two micrometers, for example.

Next, ions of p-type impurity element are implanted into the first epitaxial layer, and then a second epitaxial layer doped with n-type impurity elements is grown to a thickness of about two micrometers, for example. Subsequently, ions of p-type impurity element are implanted into the second epitaxial layer. The ion implantation processes and the epitaxial growth processes are repeated several times so as to establish multi-epitaxial growth, thereby forming the n-type columns 31a to 31h and p-type columns 32a to 32g extending in the thickness direction of the semiconductor substrate $2_{sub}$.

In the above procedure, the topmost epitaxial layer is not subjected to ion implantation, so that an n$^-$ type layer remains in a region between the upper surface of the drift layer 3 and the upper surface of the p-n column layer. In the above-described multi-epitaxial growth, ions of n-type impurity element may be further implanted into the region where the n-type columns 31a to 31h are scheduled to be formed.

Figure 16:
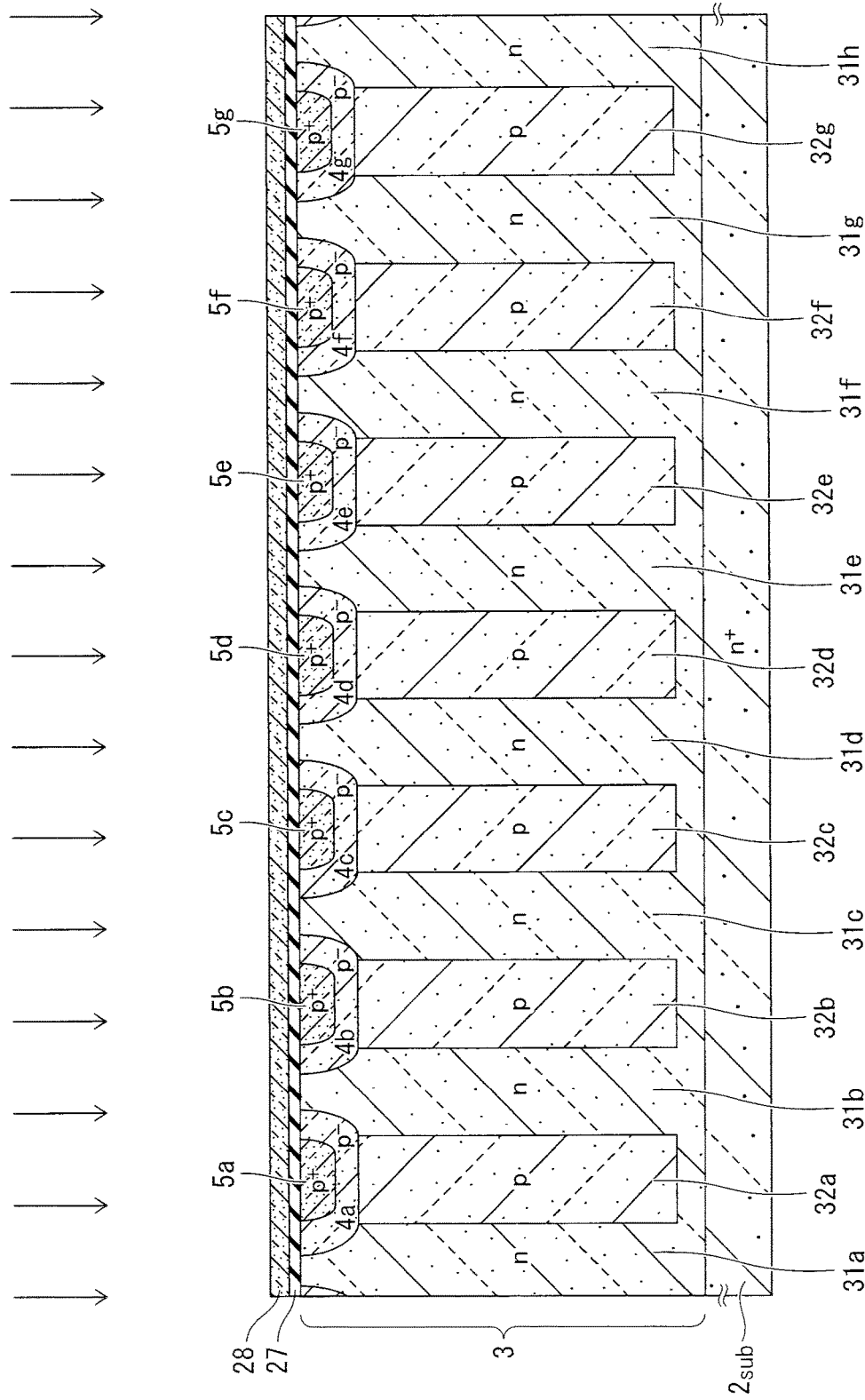
FIG. 16 is a schematic cross-sectional process view illustrating the method of manufacturing a semiconductor device according to the first embodiment (No. 2)

(b) Next, as illustrated in FIG. 16, p-type impurity elements, such as Al and B are doped into the upper surface of the drift layer 3 by ion implantation or the like using resist as a mask. The doped impurity elements are thermally diffused to form the p$^-$ well regions 4a to 4g of low concentration in a region between the upper surface of the drift layer 3 and the p-type columns 32a to 32g. Subsequently, p-type impurity elements such as Al and B are doped by ion implantation or the like into the well regions 4a to 4g to form the p$^+$ contact regions 5a to 5g of high concentration.

(c) Next, after a predetermined cleaning process, the upper surface of the drift layer 3 is thermally oxidized to form an oxidized film as an insulating film 27, which is to serve as the gate insulating films 7a, 7b, 7c, 7dl, 7dr, 7el, 7er, 7f, 7g, 7h . . . , the first middle insulating film 17d and the second middle insulating film 17e illustrated in FIGS. 1 and 2, as illustrated in FIG. 16. Then, a polysilicon film 28, for example, is deposited on the insulating film 27 by reduced-pressure CVD or the like. The polysilicon film 28 can be an n-type doped film having a comparatively low concentration of about 10$^{16}$ cm$^{-3}$, for example, a non-doped film, or the like.

Figure 17:
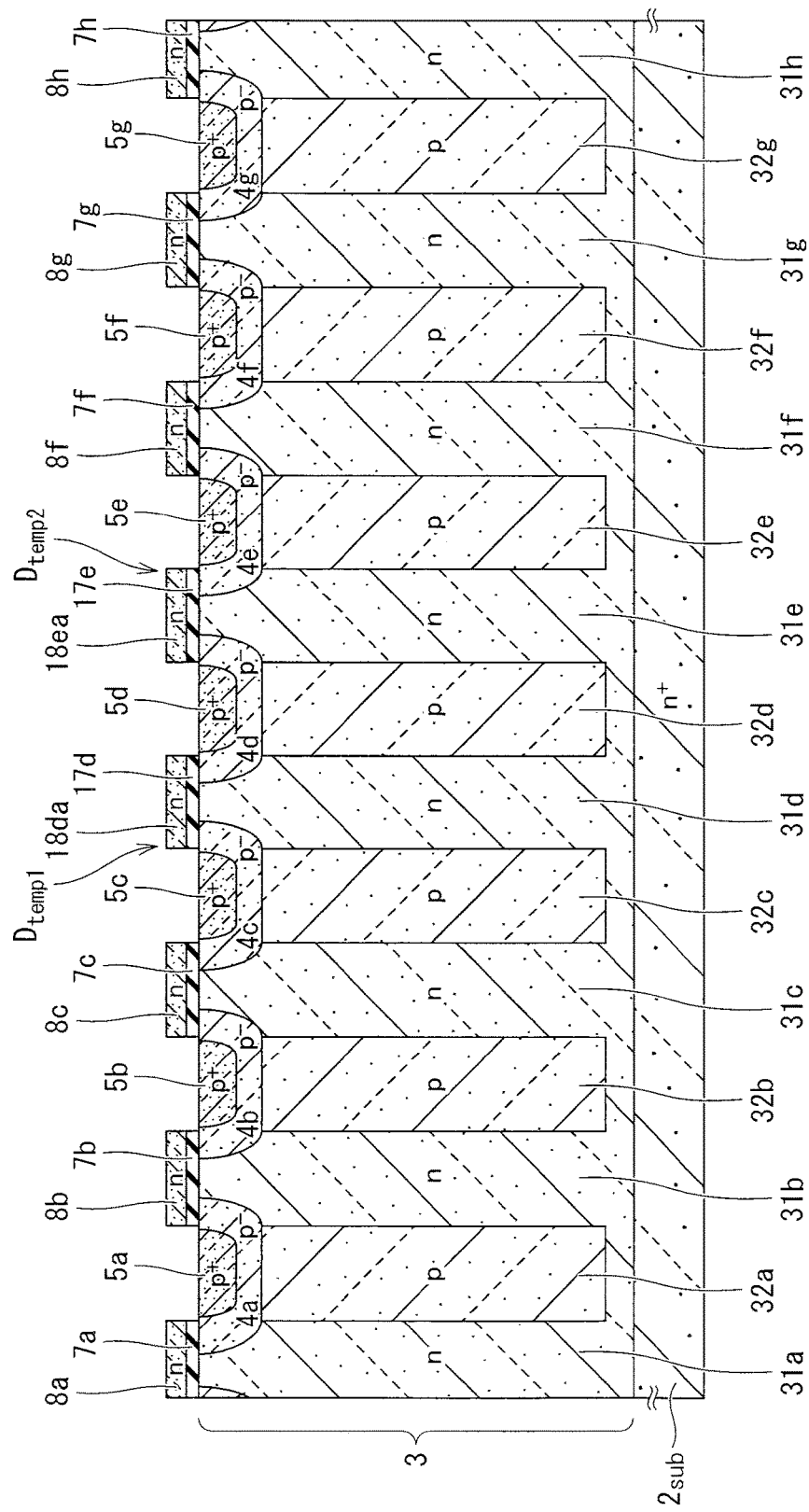
FIG. 17 is a schematic cross-sectional process view illustrating the method of manufacturing a semiconductor device according to the first embodiment (No. 3)

(d) Next, patterns of the insulating film 27 and polysilicon film 28 are delineated by photolithography and dry etching or another process. As illustrated in the cross-sectional view of FIG. 17, the first temperature detection diode $D_{temp1}$, the second temperature detection diode $D_{temp2}$ and the plural gate electrodes 8a, 8b, 8c, 8dl, 8dr, 8el, 8er, 8f, 8g, 8h . . . having the same line width are simultaneously delineated, above an area between the p-type columns 32a to 32g at the same height in a periodic manner.

Figure 18:
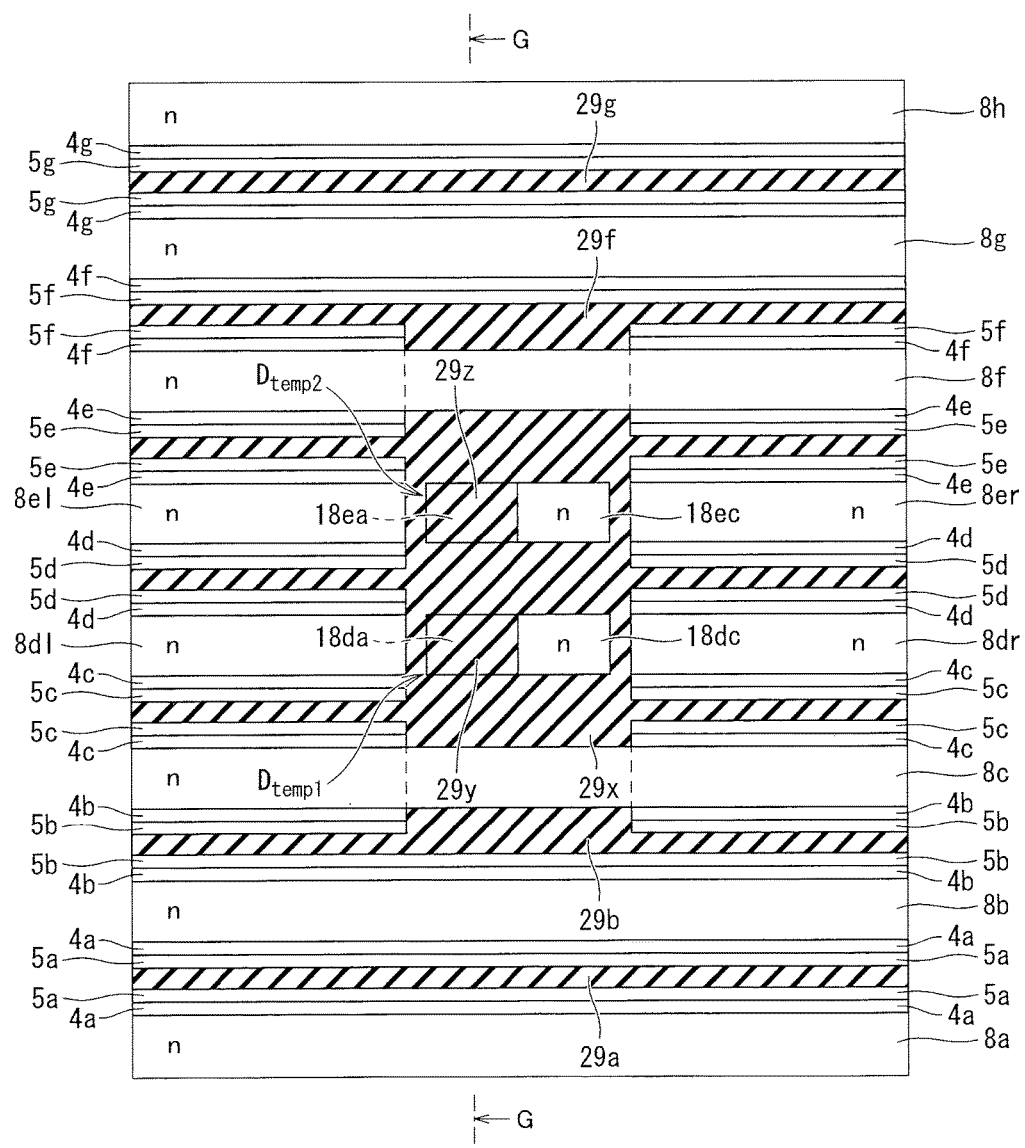
FIG. 18 is a schematic top view illustrating the method of manufacturing a semiconductor device according to the first embodiment (No. 4)
Figure 19:
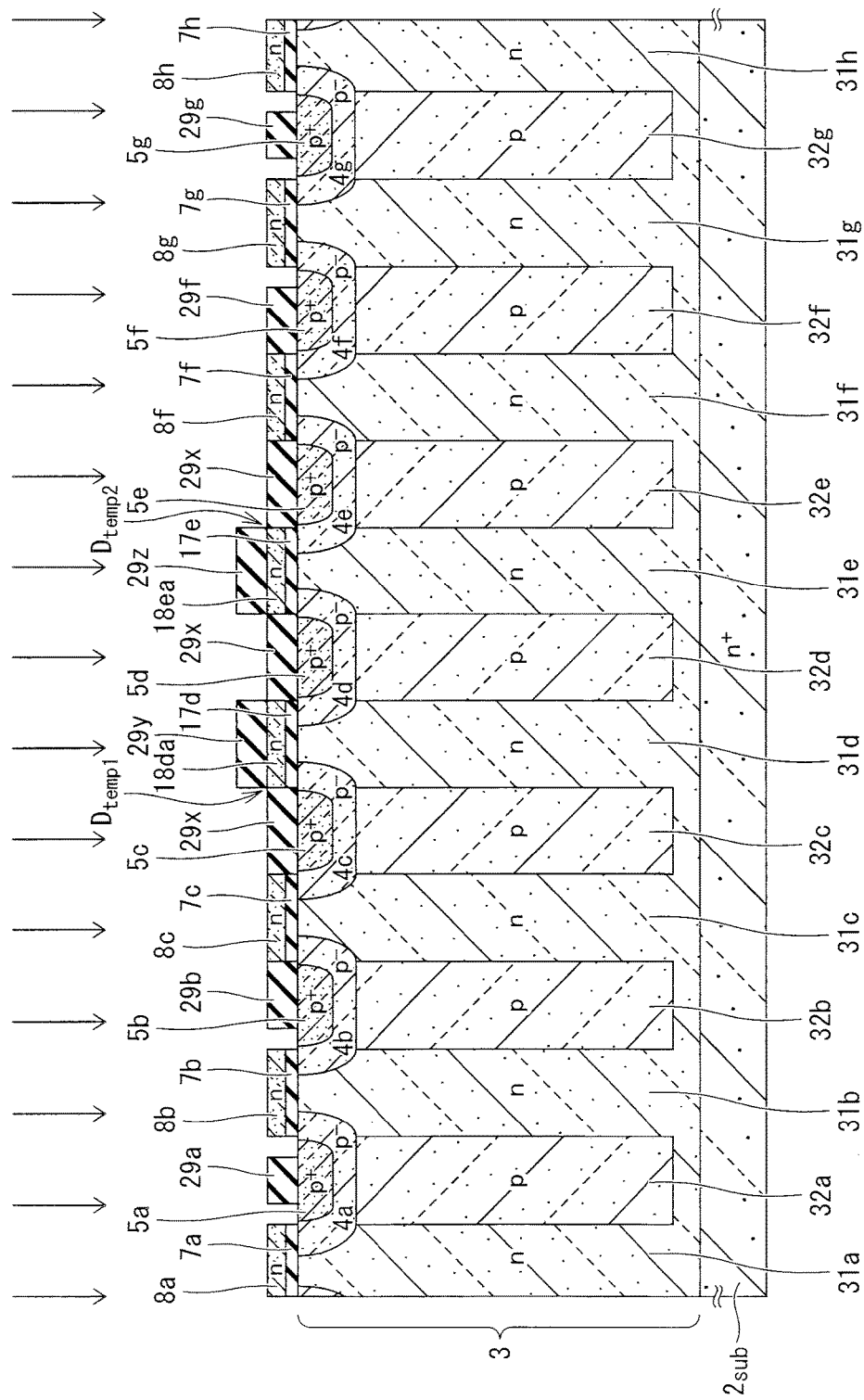
FIG. 19 is a cross-sectional process view taken in the direction of arrows G in FIG. 18.

(e) Next, as illustrated in the top view of FIG. 18, patterns of resist films 29a, 29b, 29x, 29f, 29g, 29y, and 29z are delineated so as to selectively cover on the upper surface of the drift layer 3. In the places where the source regions 6ato 6c, 6dl to 6kl, 6dr to 6kr, and 6l to 6m are scheduled to be formed, the patterns of resist films 29a, 29b, 29x, 29f, and 29g are delineated being spaced from the gate electrodes 8a to 8c and 8f to 8h adjacent to the gate electrodes 8a to 8c and 8f to 8h as illustrated in the cross-sectional view of FIG. 19. A pattern of resist film 29y is selectively covered on the upper surface of the first anode region 18da allocated at the left half (FIG. 18) of the upper surface of the first temperature detection diode $D_{temp1}$. Another pattern of resist film 29z is selectively covered on the upper surface of the second anode region 18da allocated at the left half (FIG. 18) of the upper surface of the second temperature detection diode $D_{temp2}$.

Figure 20:
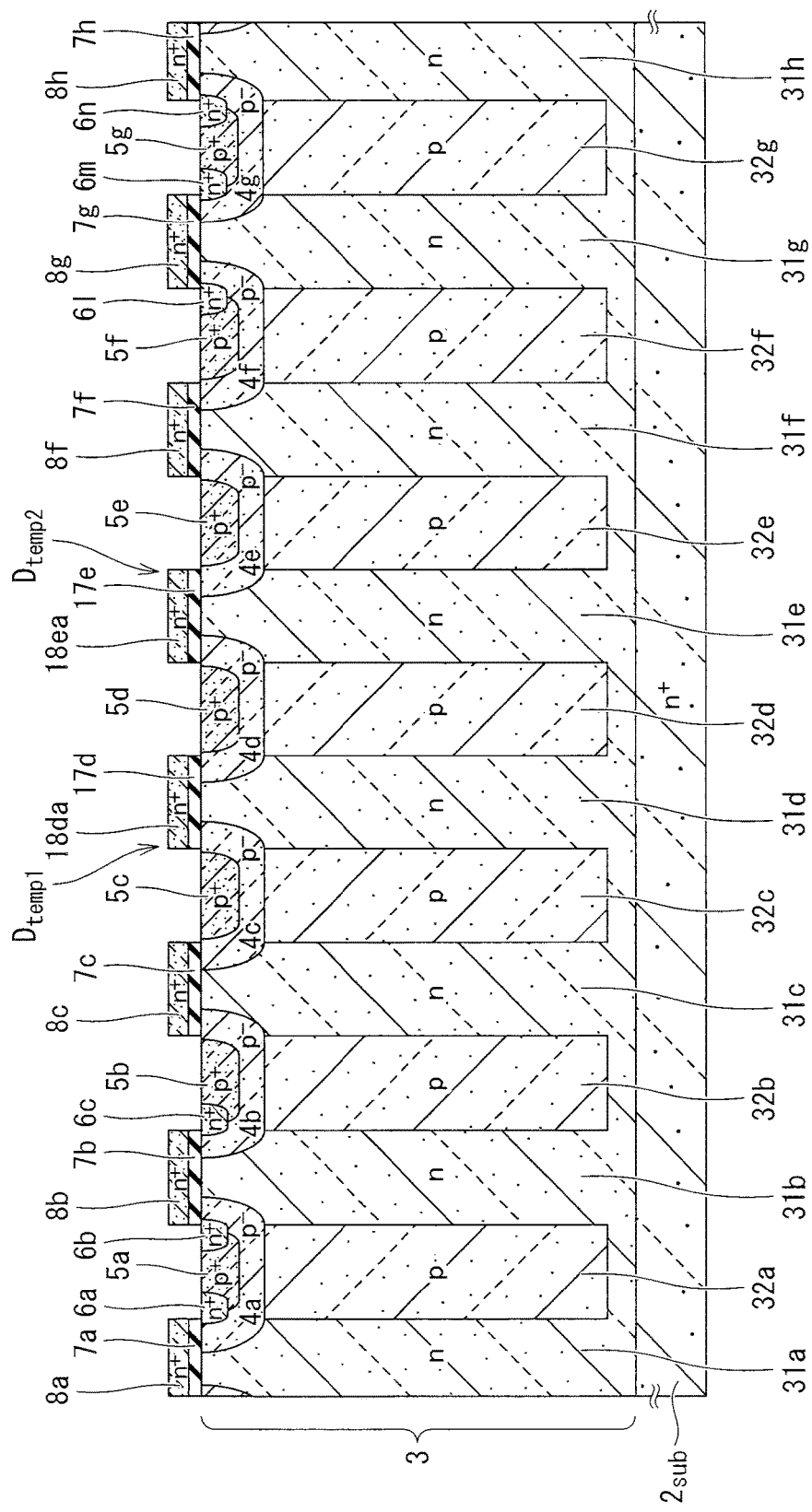
FIG. 20 is a schematic cross-sectional process view illustrating the method of manufacturing a semiconductor device according to the first embodiment (No. 5)

(f) Next, n-type impurity elements, such as phosphorus (P), are doped into the entire surface of the drift layer 3 by ion implantation or the like through the delineated patterns of resist film 29a, 29b, 29x, 29f, 29g, 29y, and 29z and the gate electrodes 8a, 8b, 8c, 8dl, 8dr, 8el, 8er, 8f, 8g, 8h . . . to form n+source regions 6a to 6c and 6l to 6n of high concentration, as illustrated in the cross-sectional view of FIG. 20. The polysilicon films in the gate electrodes 8a, 8b, 8c, 8dl, 8dr, 8el, 8er, 8f, 8g, 8h . . . are doped to establish n$^+$-doped polysilicon films having a high concentration, by ion implantation.

The remaining half areas of the first temperature detection diode $D_{temp1}$ and the second temperature detection diode $D_{temp2}$, where no pattern of resist film is coated, are n$^+$-type doped by ion implantation. On the other hand, half regions of the first anode region 18da and the second anode region 18ea of the first temperature detection diode $D_{temp1}$ and the second temperature detection diode $D_{temp2}$, where the patterns of patterns of the resist films are coated, keep the comparatively low n-type impurity concentration.

(g) Next, patterns of resist film are delineated by photolithography and dry etching or another process so as to selectively cover on regions of upper part of the drift layer 3 other than the first anode region 18da and the second anode region 18ea of the first temperature detection diode $D_{temp1}$ and the second temperature detection diode $D_{temp2}$.

Figure 21:
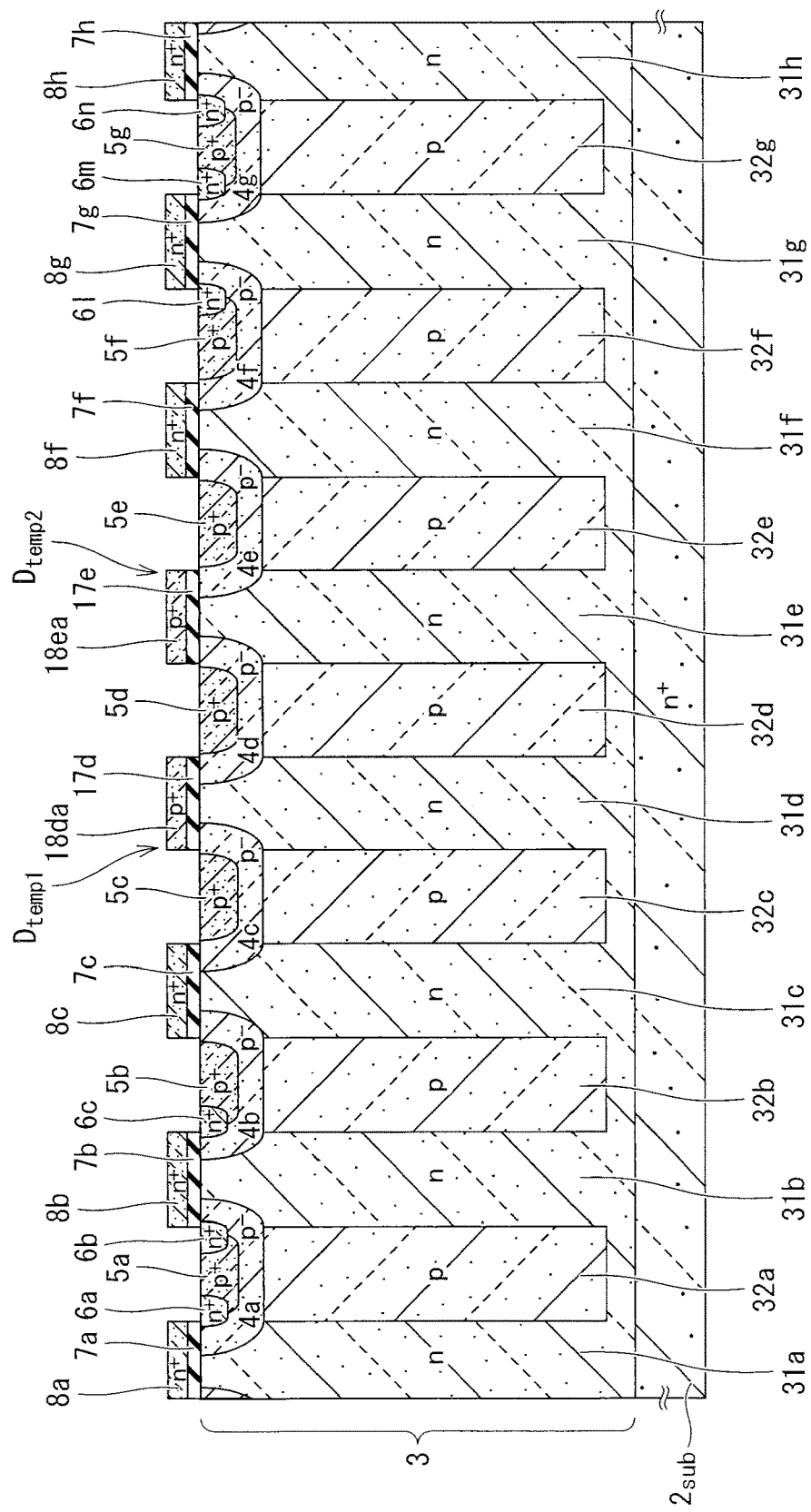
FIG. 21 is a cross-sectional process view taken in the direction of arrows H in FIG. 22.

Using the delineated patterns of resist film, ions of p-type impurity element, such as Al or B, are implanted to invert the conductivity type of the first anode region 18da and the second anode region 18ea from n-type to p$^+$-type as illustrated in the cross-sectional view of FIG. 21.

As illustrated in FIG. 22, the p+ first anode region 18da and the p+ second anode region 18ea are arranged to have a high concentration equal to that of the contact regions 5a to 5g. Through steps (a) to (g), the first temperature detection diode $D_{temp1}$ and the second temperature detection diode $D_{temp2}$ are formed so as to keep with the periodic structure of the gate electrodes 8a, 8b, 8c, 8dl, 8dr, 8el, 8er, 8f, 8g, 8h . . . .

Figure 24:
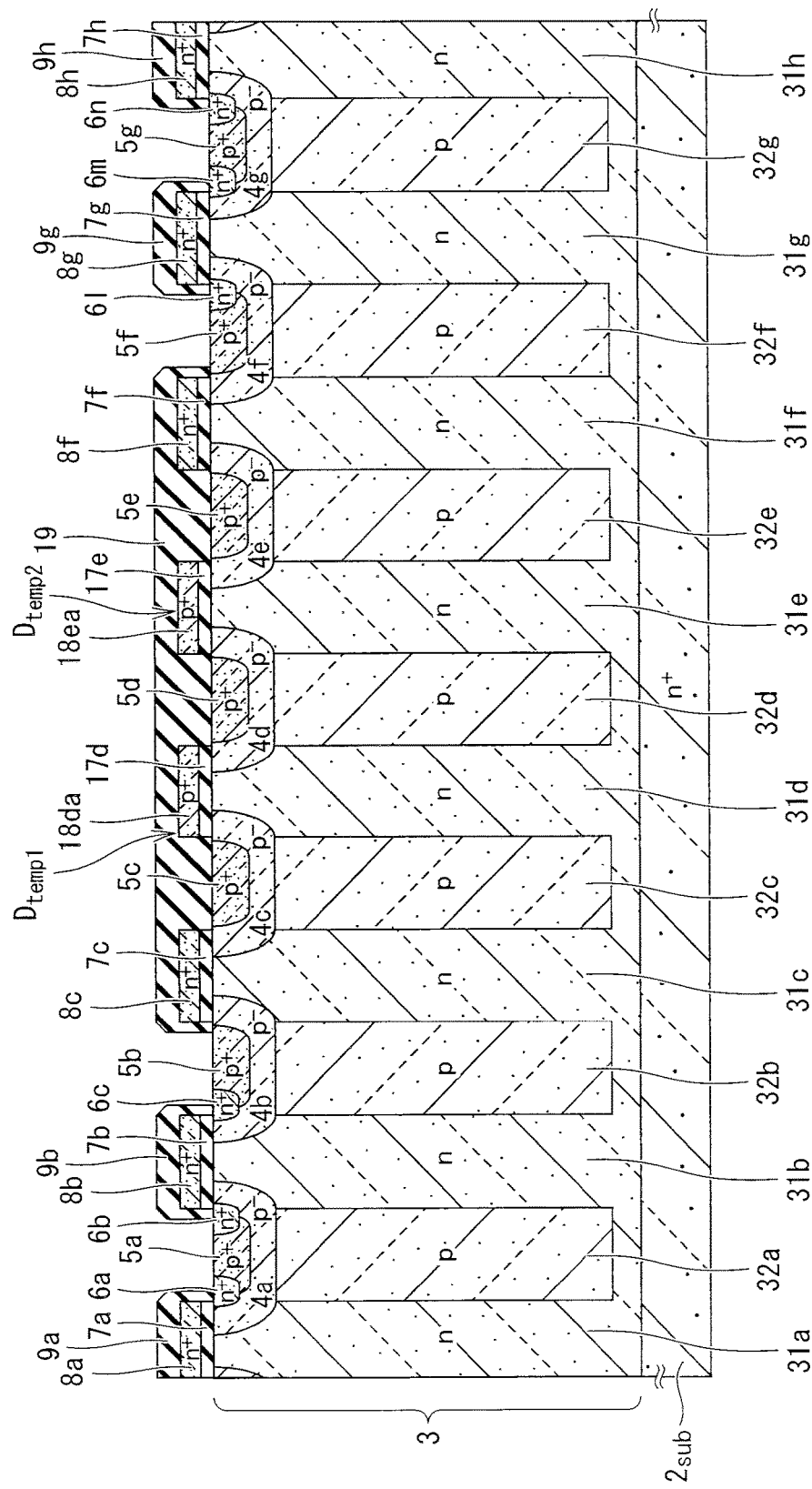
FIG. 24 is a cross-sectional process view taken in the direction of arrows I in FIG. 23.

(h) Next, an insulating film of silicon oxide or the like is deposited on the entire upper surface of the structure on the drift layer 3 by CVD or the like, and the deposited insulating film is delineated to form the interlayer dielectrics 9a, 9b, 9g, 9h, . . . and middle interlayer dielectric 19 as illustrated in the cross-sectional views of FIGS. 23 and 24. The interlayer dielectrics 9a, 9b, 9g, 9h, . . . and the middle interlayer dielectric 19 are subjected to a predetermined planarization treatment. In the middle interlayer dielectric 19, contact holes for the anode and cathode regions are individually cut by dry etching or the like.

Figure 25:
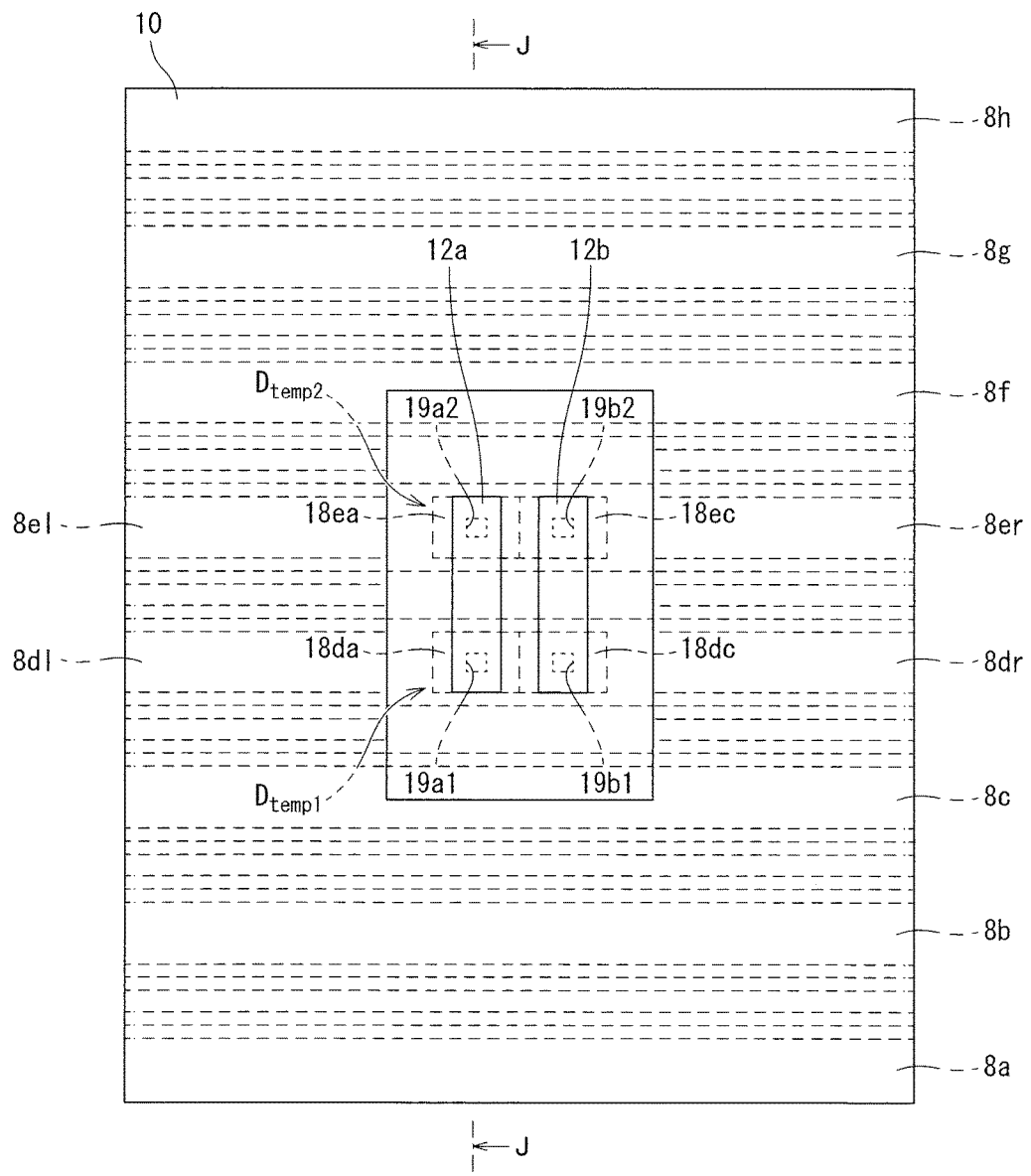
FIG. 25 is a top view illustrating the method of manufacturing a semiconductor device according to the first embodiment (No. 8)

(i) Next, the thus-obtained product is subjected to a predetermined cleaning treatment, and then metallic film of Al or the like is deposited on the entire surface of the structure on the drift layer 3 by sputtering or the like. The deposited film is delineated by photolithography and dry etching or another process to form the source electrode 10 as illustrated in the top view of FIG. 25. As illustrated in the cross-sectional view of FIG. 26, the pattern of the anode surface interconnection 12a is delineated so as to penetrate the contact hole 19a1 on the first anode region 18da and the contact hole 19a2 on the second anode region 18ea. As illustrated in FIG. 25, the pattern of the cathode surface interconnection 12b is delineated so as to penetrate the contact hole 19b1 on the first cathode region 18dc and the contact hole 19b2 on the second anode region 18ec.

(j) Next, an insulating film, which is not illustrated, is deposited on the entire surface of the structure on the drift layer 3. As illustrated in the top view of FIG. 27, pattern of an anode pad region 35a and pattern of a cathode pad region 35b are delineated in the periphery of the principal surface of the semiconductor device 1 illustrated in FIG. 1 distant from the temperature detection area 21, being allocated at middle area of the principal surface, using a metallic film of Al or the like.

Figure 27:
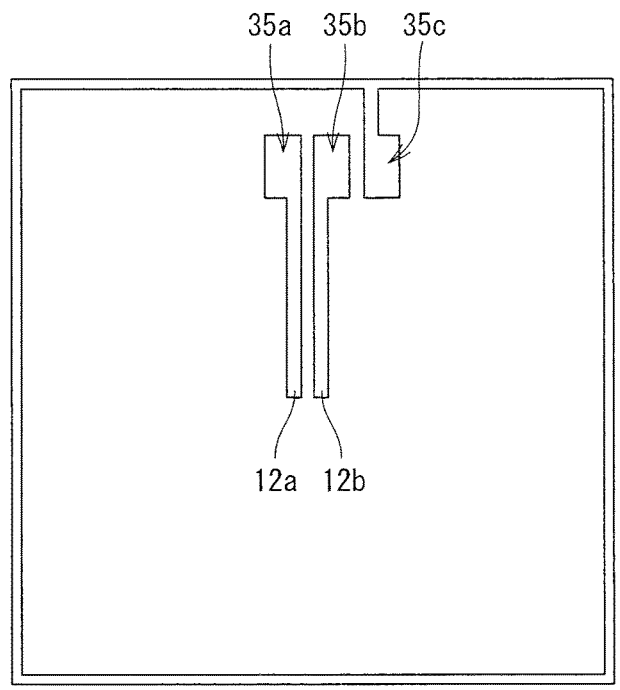
FIG. 27 is a schematic top view illustrating an arrangement pattern of pad regions for wire bonding in anode and cathode surface interconnections of the temperature detection diodes in the semiconductor device according to the first embodiment.

As illustrated in the example of FIG. 27, in a plane pattern of a chip of the semiconductor device 1 after dicing, the anode pad region 35a and the cathode pad region 35b are provided near the upper side of the substantially square semiconductor device 1 and are arranged together with a gate electrode pad region 35c side by side along the upper side. The anode pad region 35a and the cathode pad region 35b are connected to the anode surface interconnection 12a and the cathode surface interconnection 12b, respectively.

Figure 26:
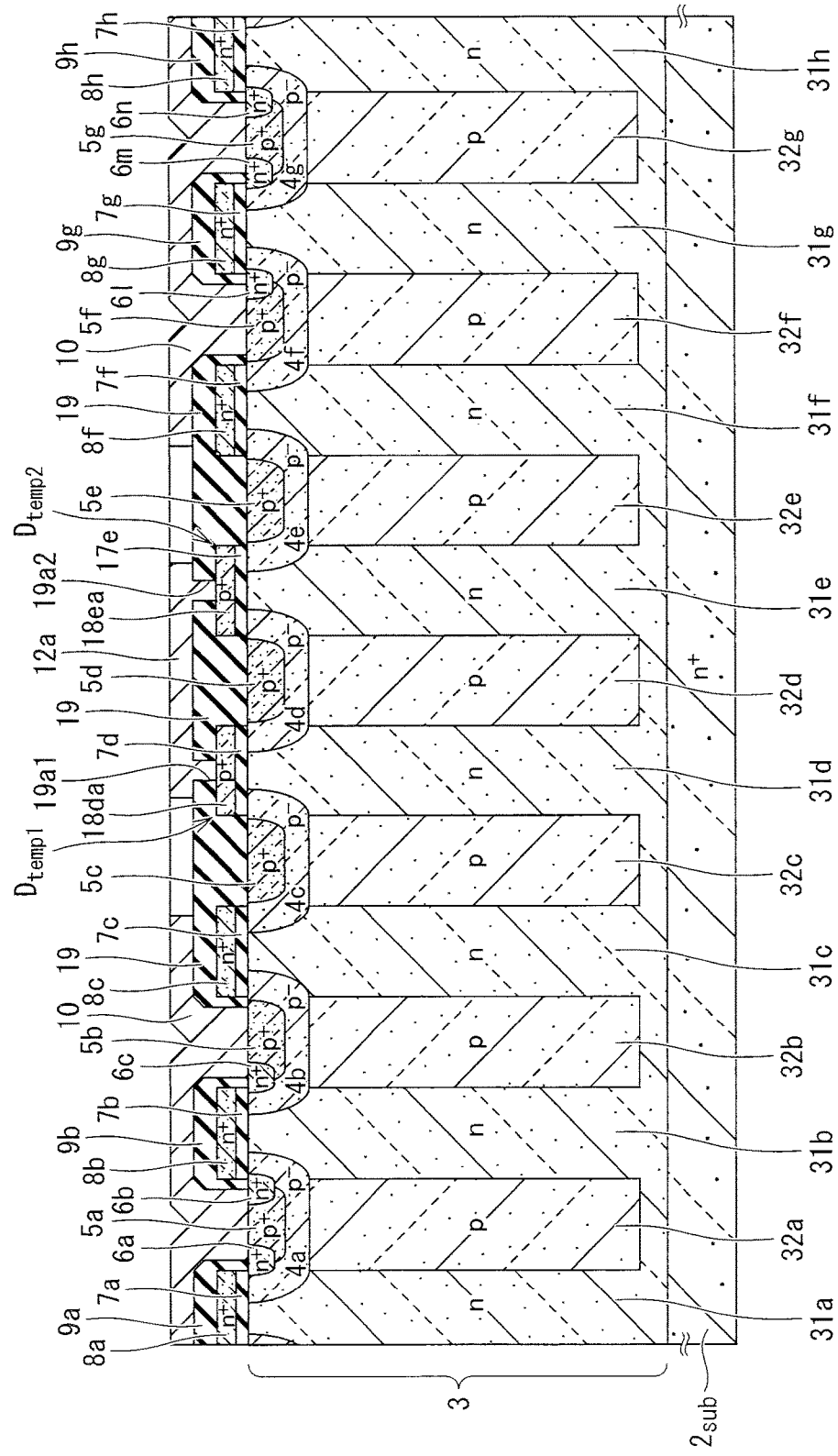
FIG. 26 is a cross-sectional process view taken in the direction of arrows J in FIG. 25.

(k) Next, a passivation film (not illustrated) is deposited on the upper surface of the semiconductor device 1 illustrated in FIG. 1 by plasma CVD or the like. Then, the semiconductor substrate $2_{sub}$ illustrated in FIG. 26 is thinned to a predetermined thickness by chemical mechanical polishing (CMP) or another method to form the drain region 2 illustrated in FIG. 1. Some films selected from metallic films of Al, Al—Si, Ti, Ni, Au, Ag, and the like are deposited on the surface of the drain region 2 by vacuum evaporation or sputtering, for example, to form the drain electrode 11.

The laminated structure including the drain region 2 is then diced into plural chips, each of which is then mounted on a package by a predetermined treatment including wire bonding. Steps (a) to (k) described above implement the method of manufacturing a semiconductor device according to the first embodiment, which can manufacture the semiconductor device 1 that accurately detects temperature, and the reduction of the breakdown voltage is effectively prevented from.

Figure 28:
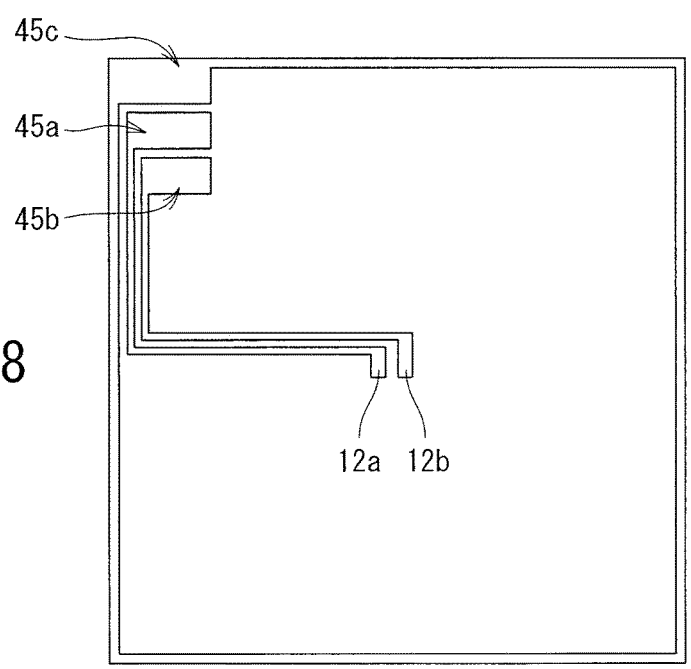
FIG. 28 is a schematic top view illustrating another arrangement pattern of pad regions for wire bonding of anode and cathode surface interconnections of the temperature detection diode in the semiconductor device according to the first embodiment.

As illustrated in the top view of FIG. 28, an anode pad region 45a, a cathode pad region 45b, and a gate electrode pad region 45c may be collectively provided at any corner of the square of the semiconductor device 1 illustrated in FIG. 1. As illustrated in FIG. 28, when the anode pad region 45a and the cathode pad region 45b are allocated at a corner, the distances between the anode pad region 45a and the cathode pad region 45b and the temperature detection areas 21 illustrated in FIG. 1 are longer than those in the arrangement pattern illustrated in FIG. 27, so that the impact applied at wire bonding can be reduced.

By the method of manufacturing a semiconductor device according to the first embodiment, the gate electrodes 8a, 8b, 8c, 8dl, 8dr, 8el, 8er, 8f, 8g, 8h . . . , the first temperature detection diode $D_{temp1}$ and the second temperature detection diode $D_{temp2}$, which have the same dimensions are simultaneously formed by the same manufacturing process using the same materials. Moreover, the gate insulating films 7a to 7c, 7f to 7h, the first middle insulating film 17d and the second middle insulating film 17e are simultaneously formed by the same manufacturing process. In the other words, the gate manufacturing process used in existing manufacturing facilities could be utilized effectively. Therefore, while preventing an increase in burden on the manufacturing process, an efficient manufacturing procedure of the semiconductor device 1 capable of detecting temperature becomes possible.

By the method of manufacturing the semiconductor device according to the first embodiment, unlike the semiconductor device 101 according to the comparative example illustrated in FIGS. 5 and 6, the design of the p-n column layer in the drift layer 3 does not need to be changed between the temperature detection area 21 and active area 22. Accordingly, the burden on the manufacturing process of the p-n column is also not increased, thus preventing an increase in manufacturing cost.

—Another Manufacturing Method of Semiconductor Device—

In the method of manufacturing a semiconductor device according to the first embodiment, the entire regions of the first temperature detection diode $D_{temp1}$ and the second temperature detection diode $D_{temp2}$ are formed into n-type at first, and halves of the regions are inverted to p-type to fabricate p-n junctions. However, the method of manufacturing a semiconductor device according to the present invention can be also executed by forming the entire regions of the first temperature detection diode $D_{temp1}$ and the second temperature detection diode $D_{temp2}$ into p-type at first, and inverting halves of the regions to n-type to fabricate p-n junctions.

Hereinafter, the aforementioned method is described below concretely. In terms of the conductivity types of impurity elements, manufacturing techniques, and the like, the same portions as those in the method of manufacturing a semiconductor device according to the first embodiment are not described again.

Figure 29:
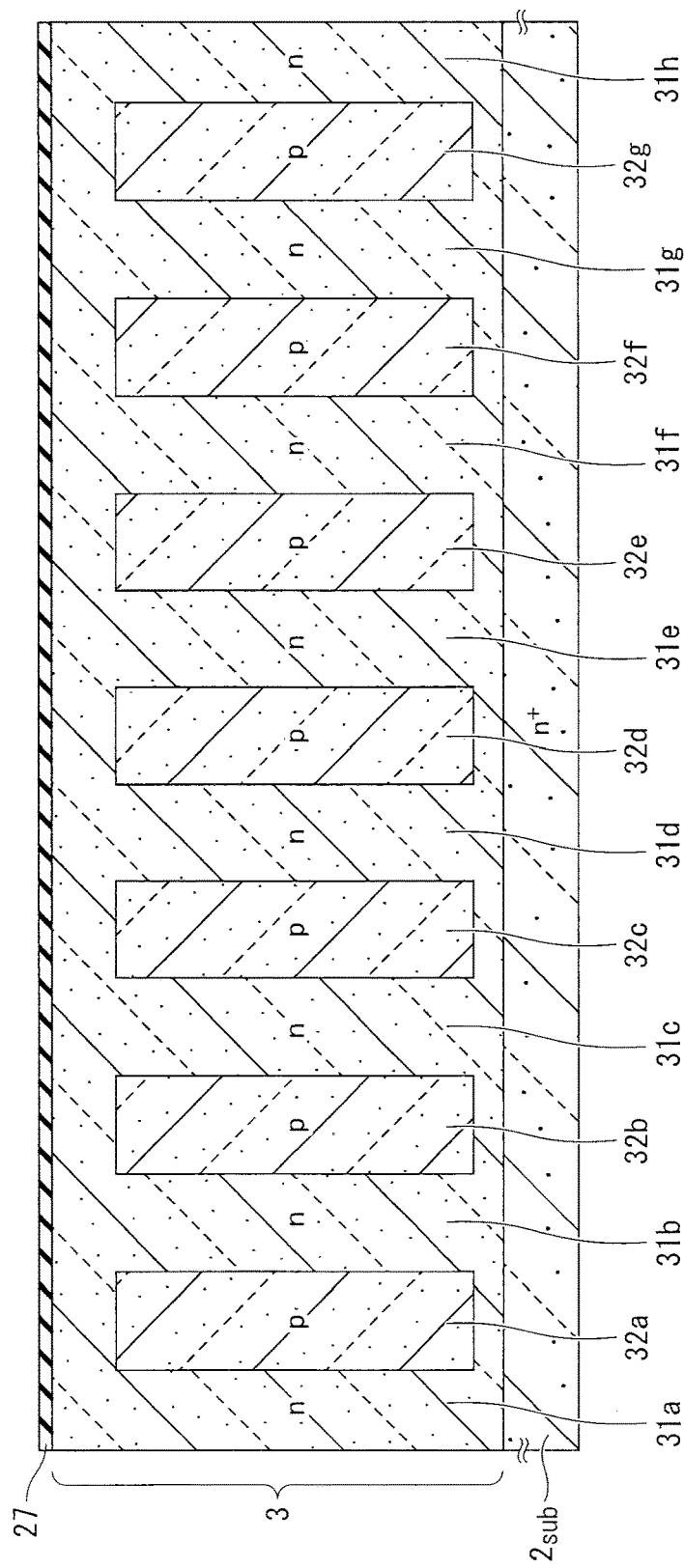
FIG. 29 is a schematic cross-sectional process view illustrating another method of manufacturing a semiconductor device according to the first embodiment (No. 1)

(l) The same semiconductor substrate $2_{sub}$, on which the drift layer 3 is formed as illustrated in FIG. 15, is prepared. In the drift layer 3, the p-n column layer is buried. The upper surface of the drift layer 3 is thermally oxidized to form an oxidized film as the insulating film 27, which serves as the gate insulating films 7a, 7b, 7c, 7dl, 7dr, 7el, 7er, 7f, 7g, 7h . . . , the first middle insulating film 17d and the second middle insulating film 17e illustrated in FIGS. 1 and 2, as illustrated in the cross-sectional view of FIG. 29.

Figure 30:
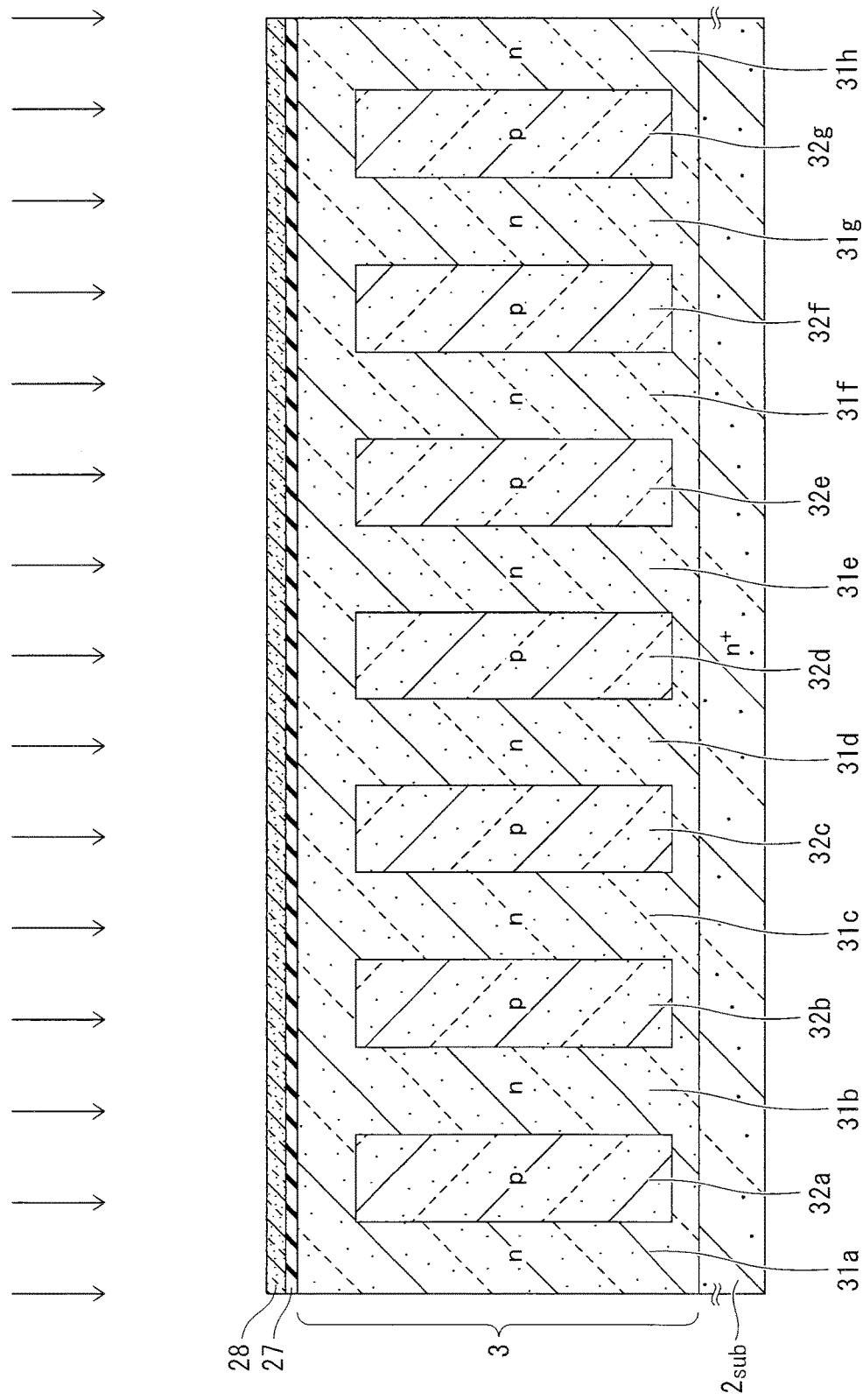
FIG. 30 is a schematic cross-sectional process view illustrating the another method of manufacturing a semiconductor device according to the first embodiment (No. 2)

(m) Next, as illustrated in the cross-sectional view of FIG. 30, the polysilicon film 28, which is non-doped, for example, is deposited on the insulating film 27 by reduced-pressure CVD or the like. Dopants of p-type impurity element, such as Al or B, are doped into the entire surface of the deposited polysilicon film 28 by ion implantation or the like, so that the impurity elements are doped to the p$^+$ polysilicon film 28 at a high concentration of about $10^{18}$ cm$^{-3}$.

Figure 31:
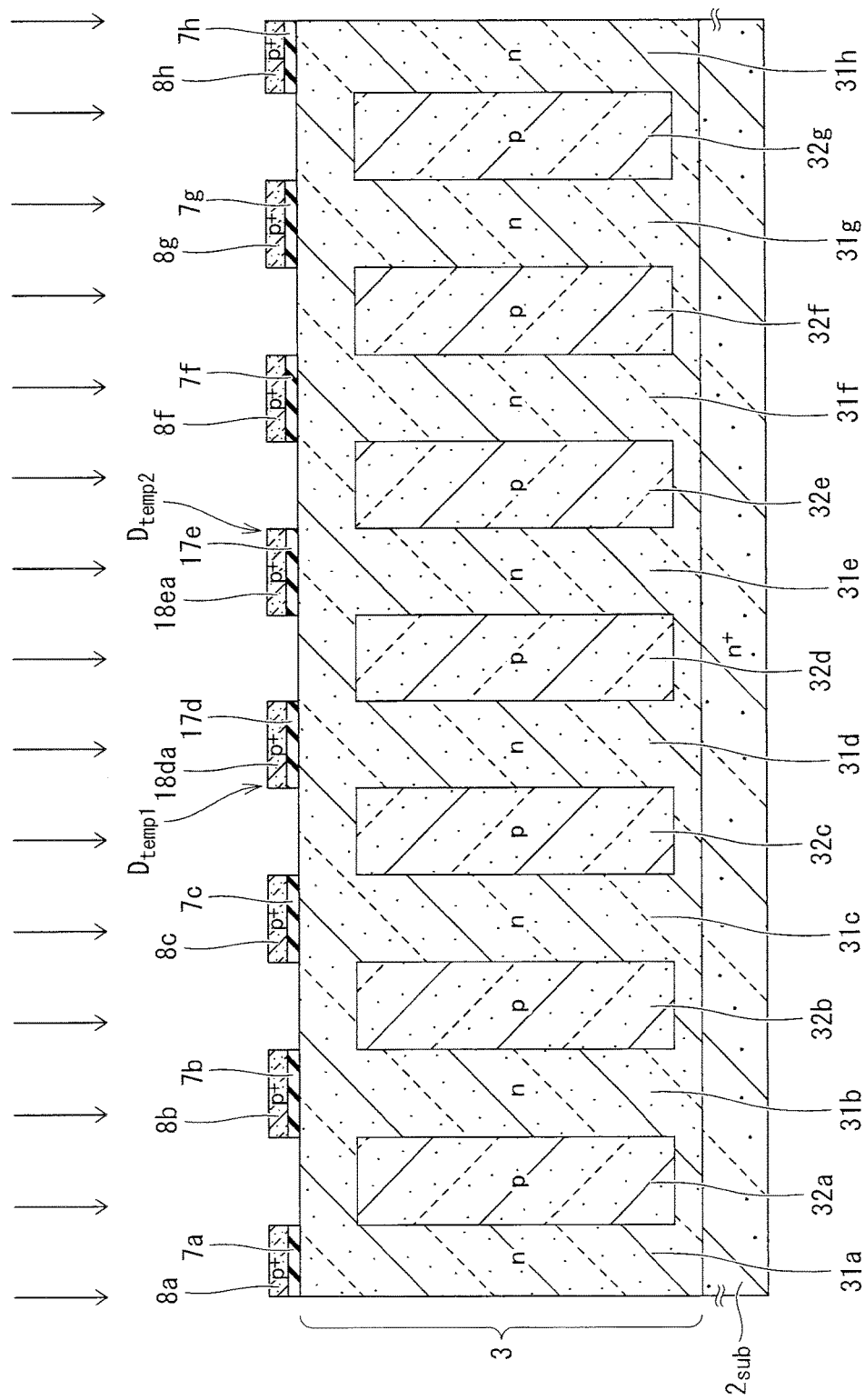
FIG. 31 is a schematic cross-sectional process view illustrating the another method of manufacturing a semiconductor device according to the first embodiment (No. 3)

(n) Next, the pattern of the insulating film 27 and the polysilicon film 28 are delineated by photolithography and dry etching or another process. As illustrated in the cross-sectional view of FIG. 31, the first temperature detection diode $D_{temp1}$, the second temperature detection diode $D_{temp2}$ and the plural gate electrodes 8a, 8b, 8c, 8dl, 8dr, 8el, 8er, 8f, 8g, 8h . . . illustrated in FIG. 4 are simultaneously formed at the same height.

(o) Next, dopants of p-type impurity element, such as Al and B, are doped into the upper surface of the drift layer 3 by ion implantation or the like using the first temperature detection diode $D_{temp1}$, the second temperature detection diode $D_{temp2}$ and plural gate electrodes 8a, 8b, 8c, 8dl, 8dr, 8el, 8er, 8f, 8g, 8h . . . as a doping mask. The doped impurity elements are thermally diffused into a layer between the upper surface of the drift layer 3 and the p-type columns 32a to 32g to form the p$^-$ well regions 4a to 4g of low concentration, as illustrated in the cross-sectional view of FIG. 32.

Figure 36:
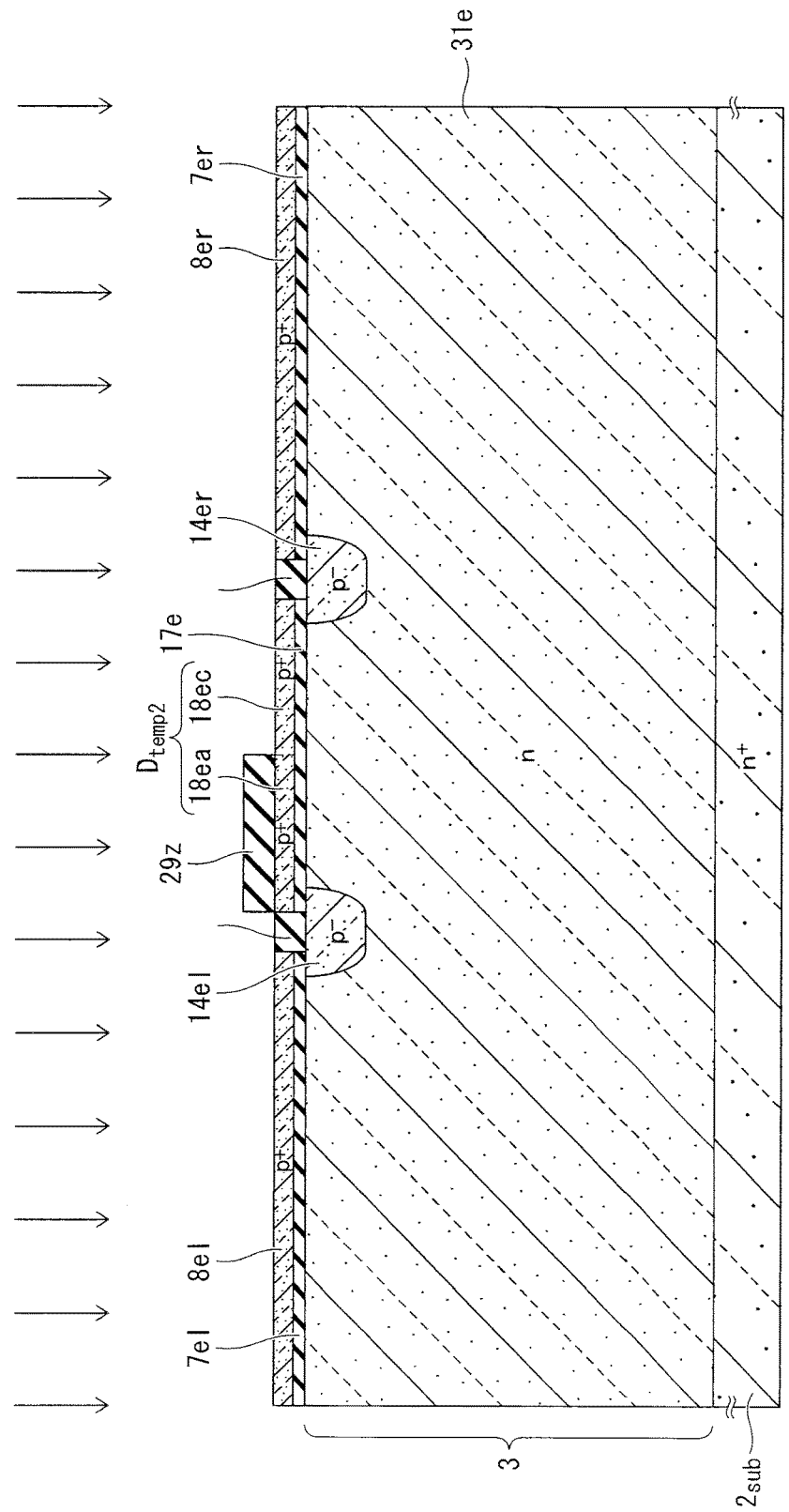
FIG. 36 is a cross-sectional process view taken in the direction of arrows L in FIG. 34.

Ions of the p-type impurity element are implanted through a gap between the first temperature detection diode $D_{temp1}$ and the gate electrode 8dl and a gap between the first temperature detection diode $D_{temp1}$ and the gate electrode 8dr on both sides of the first temperature detection diode $D_{temp1}$, the first temperature detection diodes $D_{temp1}$ and the gate electrodes 8dl and 8dr illustrated in FIG. 2 being aligned along the same straight line, such as a first low-concentration region 14e1 and a second low-concentration region 14er illustrated in the cross-sectional view of FIG. 36 later. Moreover, the ions of p-type impurity element are also implanted into two gaps assigned on both sides of the second temperature detection diode $D_{temp2}$, similarly to the two gaps assigned on both sides of the first temperature detection diode $D_{temp1}$.

FIG. 36 illustrates a first p$^-$ region 14e1 of low concentration, which is formed by the implanted impurity elements under the gap between the second temperature detection diode $D_{temp2}$ and the gate electrode 8el, allocated on the left of the second temperature detection diode $D_{temp1}$ in FIG. 36, just above the n-type column 31e. Moreover, the second p$^-$ region 14er of low concentration is formed by the implanted impurity elements under the gap between the second temperature detection diode $D_{temp2}$ and the gate electrode 8er, allocated on the right of the second temperature detection diode $D_{temp2}$ in FIG. 36, just above the n-type column 31e.

Figure 32:
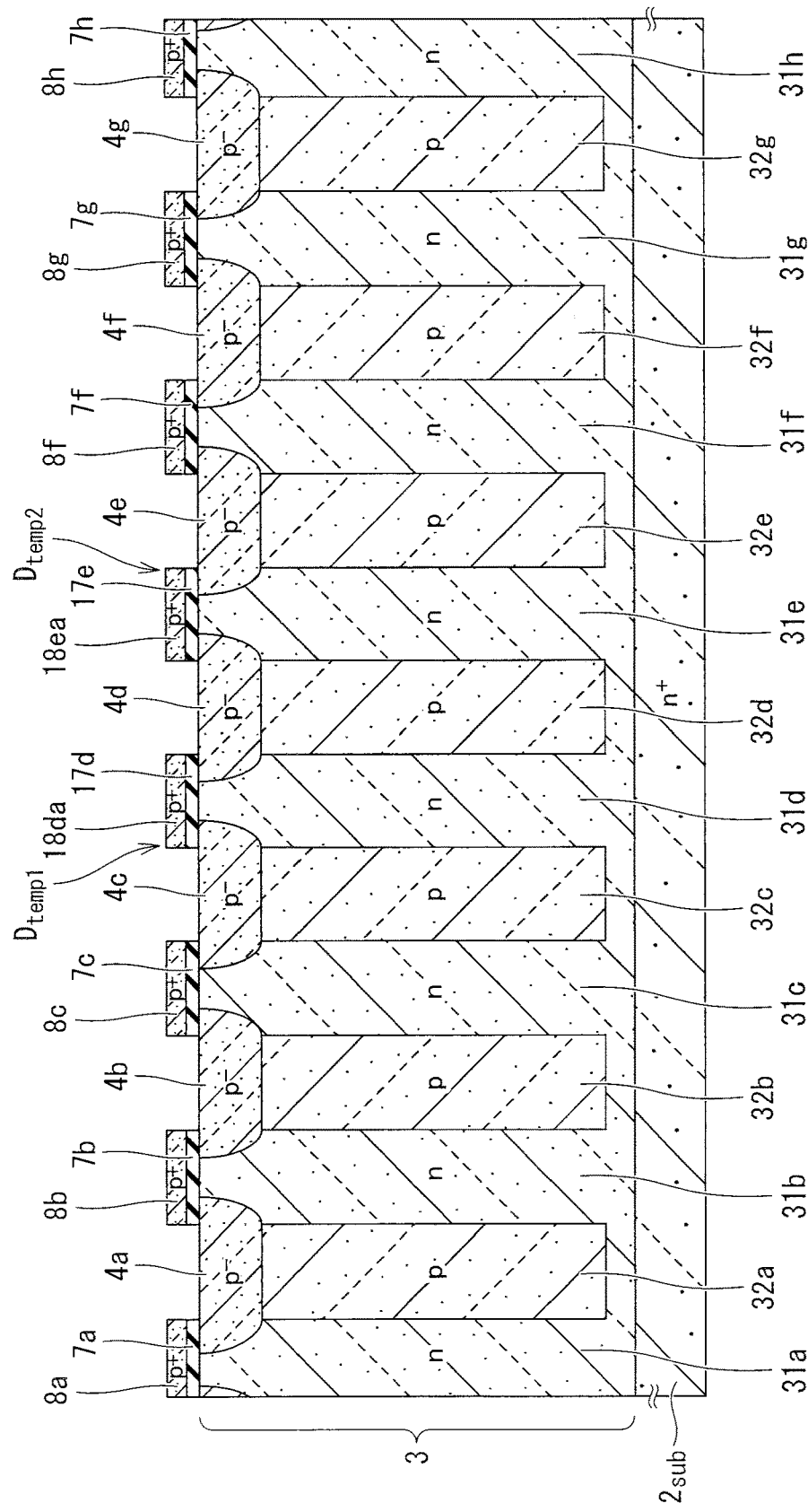
FIG. 32 is a schematic cross-sectional process view illustrating the another method of manufacturing a semiconductor device according to the first embodiment (No. 4)

In a similar manner to the second temperature detection diode $D_{temp2}$, p$^-$ regions of low concentration are formed under the gaps on both sides of the first temperature detection diodes $D_{temp1}$ illustrated in FIG. 32, which are not illustrated. Through the first low-concentration region 14el and the second low-concentration region 14er illustrated in FIG. 36, the triple well regions 4c to 4e, which are adjacent to the first temperature detection diode $D_{temp1}$ and the second temperature detection diode $D_{temp2}$ in upper part of the drift layer 3, are mutually connected, thereby further increasing the breakdown voltage of the entire semiconductor device 1.

Figure 33:
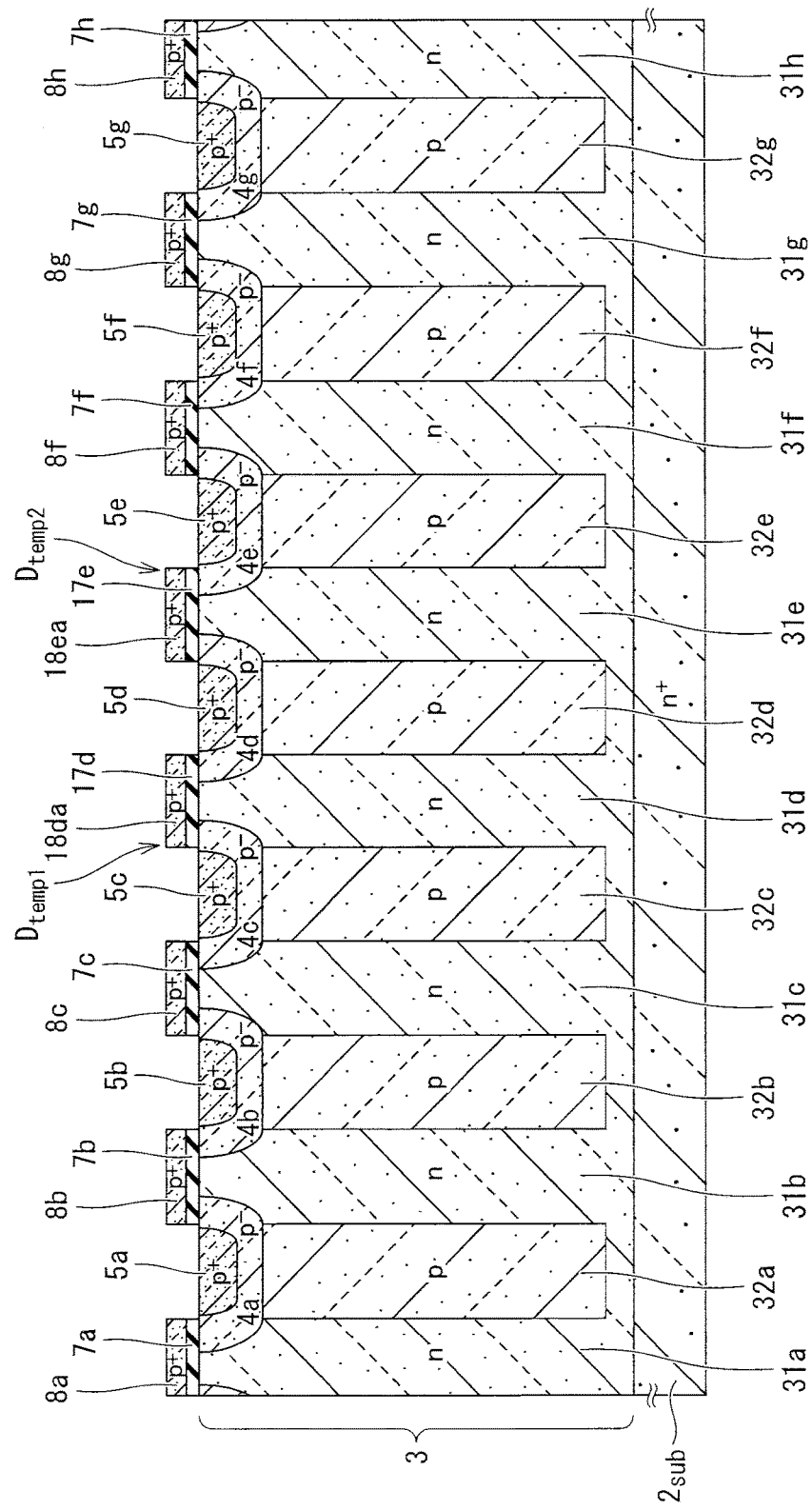
FIG. 33 is a schematic cross-sectional process view illustrating the another method of manufacturing a semiconductor device according to the first embodiment (No. 5)

(p) Next, dopants of p-type impurity element such as Al and B are doped by ion implantation or the like into the well regions 4a to 4g to form p+contact regions 5a to 5g of high concentration as illustrated in the cross-sectional view of FIG. 33.

Figure 34:
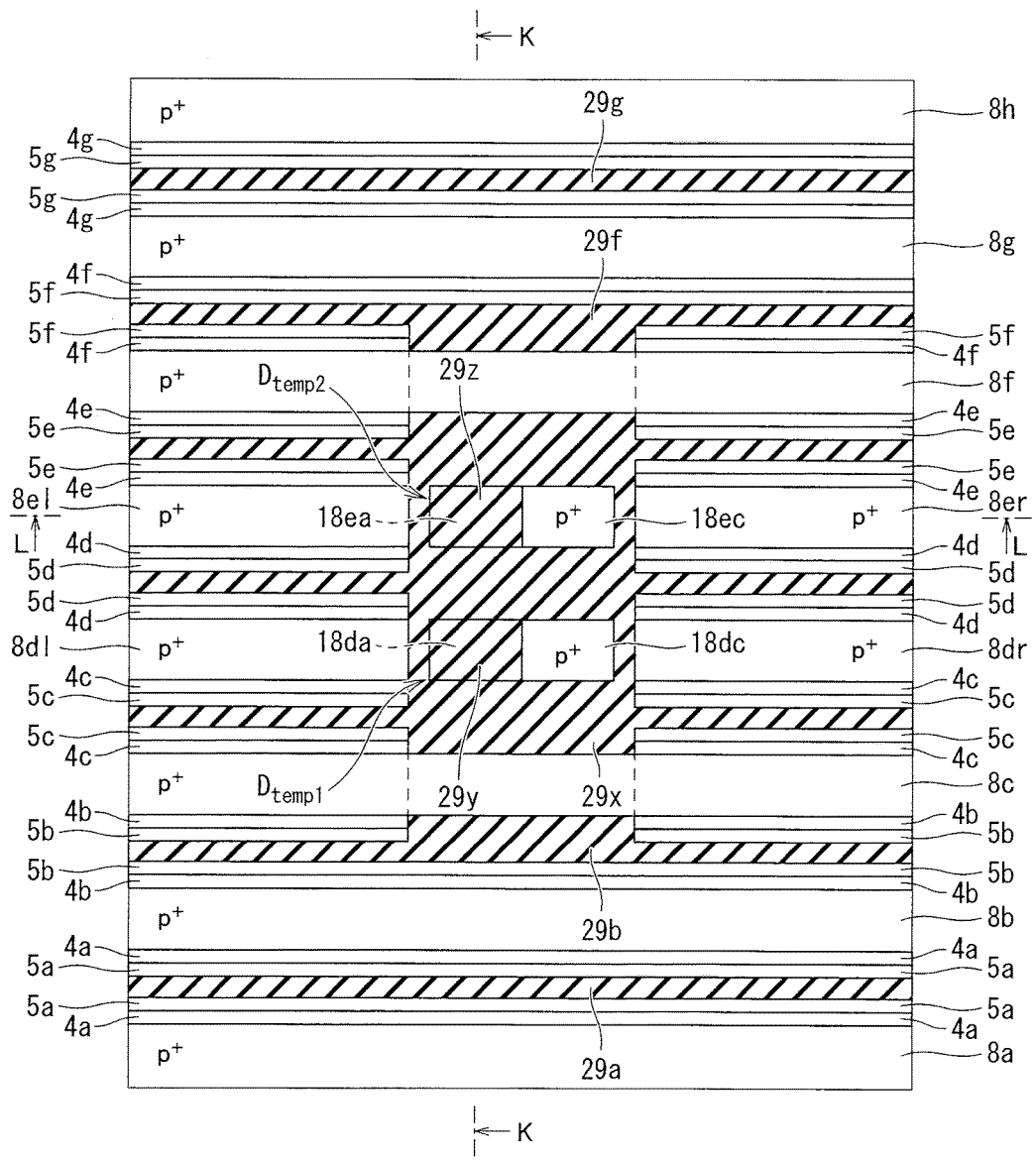
FIG. 34 is a schematic top view illustrating the another method of manufacturing a semiconductor device according to the first embodiment (No. 6)

(q) Next, as illustrated in the top view of FIG. 34, a resist film is delineated so that the patterns of resist films 29a, 29b, 29x, 29f, 29g, 29y, and 29z selectively cover on the upper surface of the drift layer 3. In the places where the source regions 6a to 6c, 6dl to 6kl, 6dr to 6kr, and 6l to 6n illustrated in FIG. 22 are scheduled to be formed, the patterns of the resist films 29a, 29b, 29x, 29f, and 29g are delineated so as to cut windows in each of areas between the adjacent gate electrodes 8a to 8c, 8f to 8h.

Figure 35:
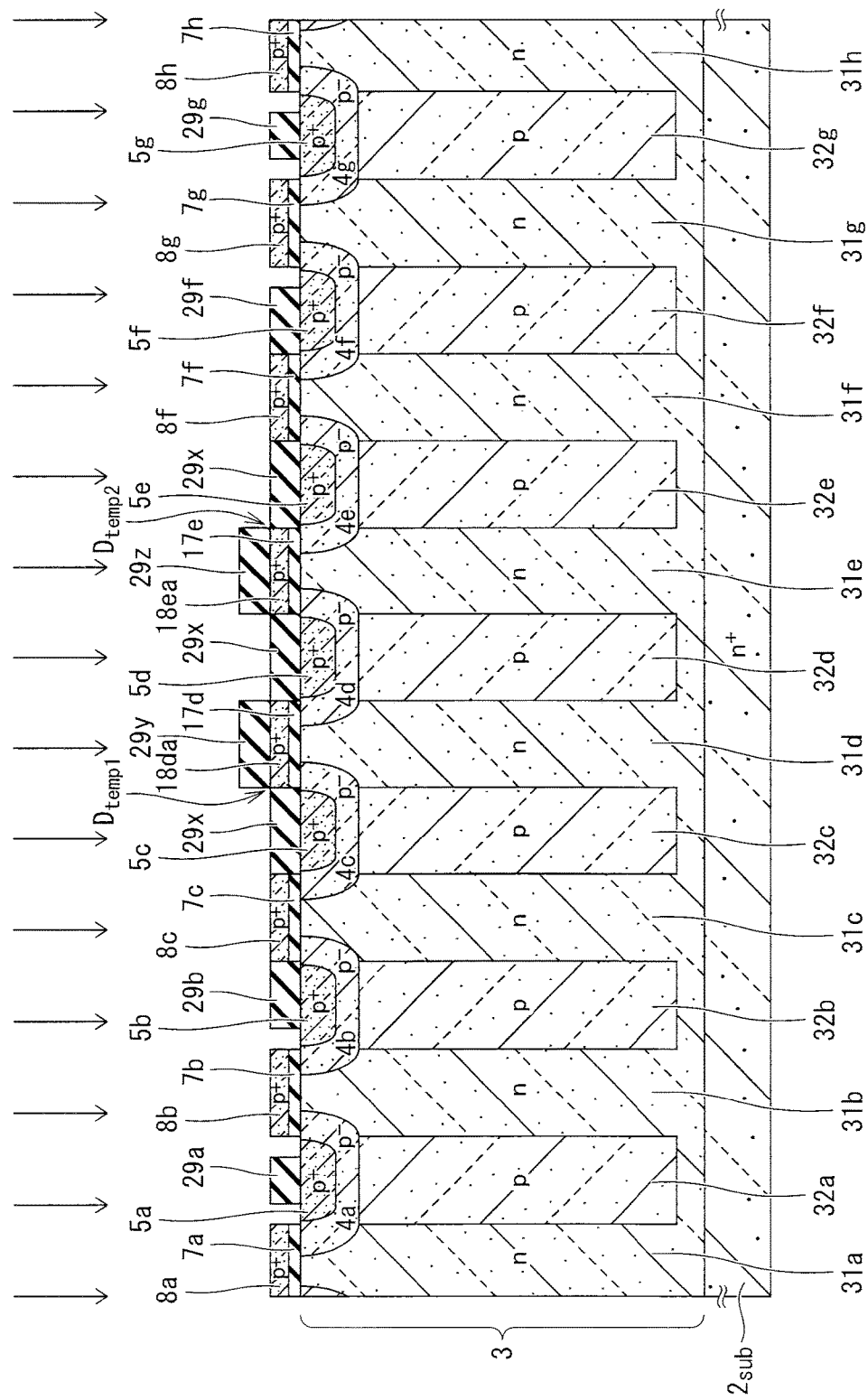
FIG. 35 is a cross-sectional process view taken in the direction of arrows K in FIG. 34.

As illustrated in the cross-sectional view of FIG. 35, the resist film 29y is delineated on the upper surface of the first anode region 18da so as to define the left half of the upper surface of the first temperature detection diode $D_{temp1}$ in FIG. 34. As illustrated in FIG. 36, the resist film 29z is delineated on the upper surface of the second anode region 18ea so as to define the left half of the upper surface of the second temperature detection diode $D_{temp2}$ in FIG. 34.

(r) Next, dopants of n-type impurity element, such as P, are doped into the entire surface of the drift layer 3 by ion implantation or the like through the windows in the delineated resist film and the gate electrodes 8a, 8b, 8c, 8dl, 8dr, 8el, 8er, 8f, 8g, 8h . . . illustrated in FIG. 34. By implantation of the ions of the n-type impurity element, n$^+$ source regions 6a to 6c, 6dl to 6kl, 6dr to 6kr, and 6l to 6n of high concentration are formed as illustrated in FIG. 22.

The conductivity type of the gate electrodes 8a, 8b, 8c, 8dl, 8dr, 8el, 8er, 8f, 8g, 8h . . . illustrated in FIG. 4 are inverted from p-type to n$^+$-type. Moreover, the remnant halves of the upper surfaces of the first temperature detection diode $D_{temp1}$ and the second temperature detection diode $D_{temp2}$ illustrated in FIG. 34, where no resist film is coated, are inverted from p-type to n$^+$-type. Subsequently, the same steps as (h) to (k) described above are performed to complete the scheme of another method of manufacturing the semiconductor device according to the first embodiment.

With the another method of manufacturing the semiconductor device according to the first embodiment, similarly to the method of manufacturing the semiconductor device described in FIGS. 15 to 28, manufacturing the semiconductor device 1 that can accurately detects temperature, and preventing effectively the breakdown voltage from being reduced, even if the semiconductor device merges temperature detection diodes, become possible. The other performances and effectiveness of the scheme of another method are the same as the method of manufacturing a semiconductor device according to the first embodiment.

<Second Embodiment>
—Structure of Semiconductor Device—

In the semiconductor device according to the first embodiment described in FIGS. 1 to 36, no gate electrodes are allocated just above the n-type columns 31a to 31h in the temperature detection area 21. The semiconductor device according to the first embodiment implements a single level architecture in which the first temperature detection diode $D_{temp1}$ and the second temperature detection diode $D_{temp2}$, having the same thickness, width, and pitch according to the same design rule, are fabricated at the same height as the gate electrodes 8a, 8b, 8c, 8dl, 8dr, 8el, 8er, 8f, 8g, 8f, . . . around the same.

However, a semiconductor device according to a second embodiment includes a double level architecture as follows: in the temperature detection area 21, a part of the area of the gate electrodes, the gate electrodes continuously extend from the periphery at the same height as the peripheral gate electrodes, and temperature detection diodes are provided in a second level above the gate electrodes.

Figure 37:
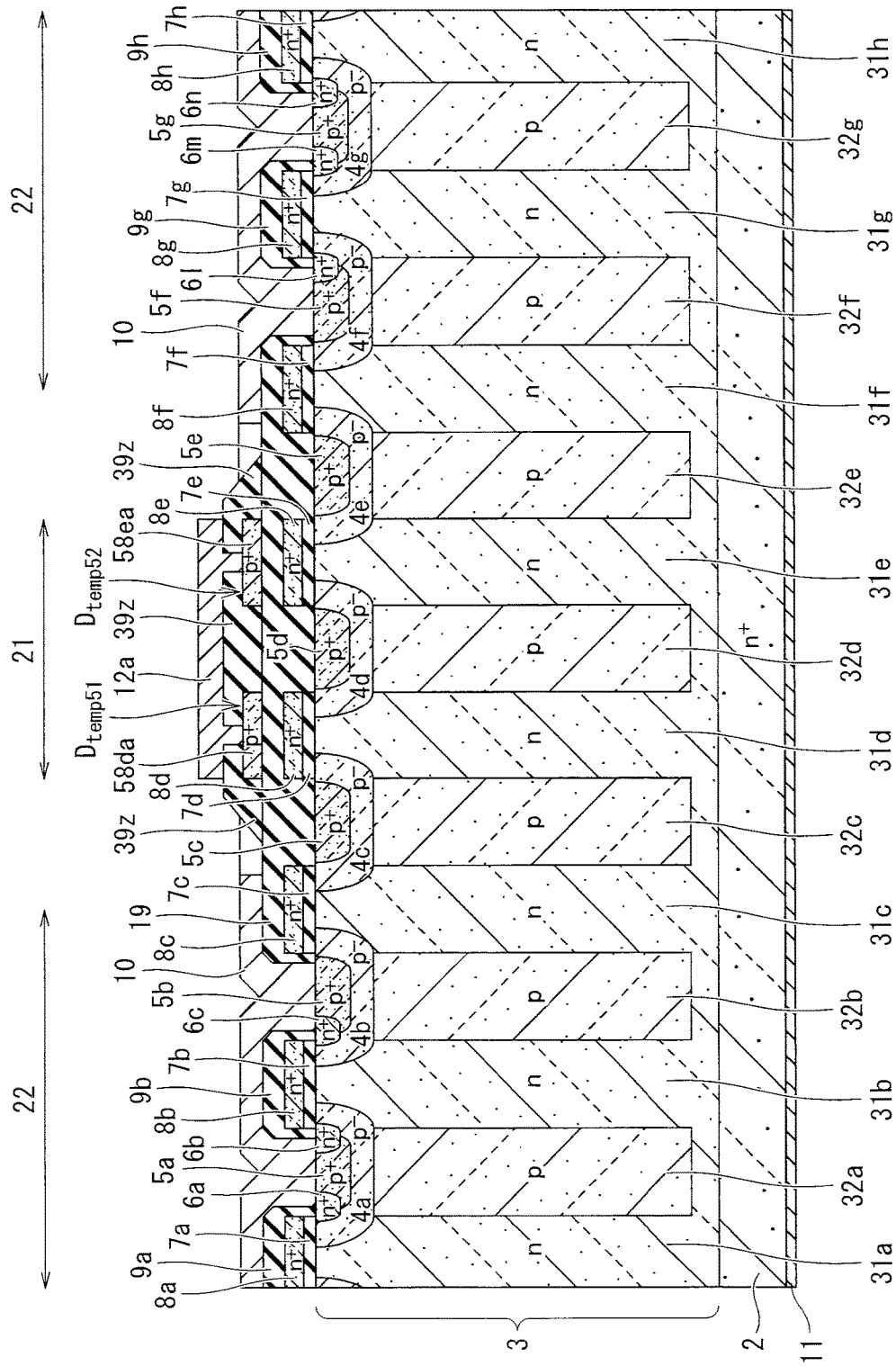
FIG. 37 is a cross-sectional view schematically illustrating a configuration of a semiconductor device according to a second embodiment.

As illustrated in the cross-sectional view of FIG. 37, a semiconductor device 1z according to the second embodiment includes a drain region 2 of a first conductivity-type, a layer of the first conductivity-type provided on the drain region 2, and a drift layer 3 having a SJ structure in which plural columns 32a to 32g of a second conductivity-type are buried at regular intervals in the layer of the first conductivity-type. The semiconductor device 1z includes plural well regions 4a to 4g of the second conductivity-type periodically buried in a surface-side layer of the layer of the first conductivity-type, and contact regions 5a to 5g of the second conductivity-type periodically provided in the plural well regions 4a to 4g, respectively.

The semiconductor device 1z further includes plural source regions 6a to 6c, 6dr, 6fr, 6hr, and 6l to 6n of the first conductivity-type illustrated in FIG. 22 selectively embedded in the plural well regions 4a to 4g other than the partial areas for the triple well regions 4c to 4e. The semiconductor device 1z illustrated in FIG. 37 still further includes gate insulating films 7a to 7h . . . on the well regions 4a to 4g, and plural gate electrodes 8a to 8h periodically arranged on the gate insulating films 7a to 7h . . . .

The well regions 4a to 4g may be provided just above p-type columns 32a to 32g. Each of the gate insulating films 7a to 7h . . . and gate electrodes 8a to 8h . . . are individually provided on the surface of the layer of the first conductivity-type so as to bridge a corresponding pair of the source regions 6a to 6c, 6dl to 6kl, 6dr to 6kr, and 6l to 6n illustrated in FIG. 22 assigned to neighboring two well regions 4a to 4g in a similar manner to the first embodiment. As illustrated in FIG. 37, the semiconductor device 1z of the second embodiment is different from the first embodiment in the following points:

in the semiconductor device 1z, no p-n junctions are provided in the part of polysilicon where the first temperature detection diode $D_{temp1}$ and the second temperature detection diode $D_{temp2}$ were provided in the first embodiment;

a middle interlayer dielectric 19 is provided on the upper surface of the polysilicon; and the first temperature detection diode $D_{temp1}$ and the second temperature detection diode $D_{temp2}$ are provided on the upper surface of the middle interlayer dielectric 19.

The semiconductor device 1z includes plural interlayer dielectrics 9a, 9b, 9g, 9h, . . . and the middle interlayer dielectric 19, which are deposited on the gate electrodes 8a to 8h, . . . . The semiconductor device 1z further includes a source electrode 10 provided on the plural interlayer dielectrics 9a, 9b, 9g, 9h, . . . to electrically short-circuit the source regions 6a to 6c, 6dl to 6kl, 6dr to 6kr, 6l to 6n illustrated in FIG. 22 with the contact regions 5a to 5g, and a drain electrode 11 provided on the bottom surface (the lower surface) of the drain region 2 opposite to the drift layer 3.

In the semiconductor device 1z, the first temperature detection diode $D_{temp51}$ and the second temperature detection diode $D_{temp52}$, which have the same line width and thickness as those of the gate electrodes 8a to 8h, . . . are provided on the middle interlayer dielectric 19 in keeping with the periodic structure of the gate electrodes 8a to 8h, . . . .

The internal structure of the drift layer 3, the interlayer dielectrics 9a, 9b, 9g, 9h, . . . and middle interlayer dielectric 19, anode surface interconnection 12a and the cathode surface interconnection 12b illustrated in FIG. 2, and source electrode 10 have equivalent structures as the corresponding constituent members given with the same names in the semiconductor device 1 according to the first embodiment illustrated in FIGS. 1 and 2, and the detailed description of the structures is omitted.

The gate insulating films 7a to 7h, . . . and gate electrodes 8a to 8h, . . . illustrated in FIG. 37 continuously extend between both end lines of the edge area of the semiconductor device 1z even in the temperature detection area 21.

The gate electrodes 8a to 8h, . . . are of the first conductivity type and is made of $n^{++}$ polycrystalline silicon (doped polysilicon) doped with a high concentration of impurities, about $5 \times 10^{20}$ cm$^{-3}$, which is higher than that of the gate electrodes 8a, 8b, 8c, 8dl, 8dr, 8el, 8er, 8f, 8g, 8h . . . of the semiconductor device 1 illustrated in FIGS. 1 and 4.

The first temperature detection diode $D_{temp51}$ and the second temperature detection diode $D_{temp52}$ are provided on the middle interlayer dielectric 19, just above the two n-type columns 31d and 31e located in the middle area of FIG. 37, so as to be aligned with the positions of the gate electrodes 8d and 8e, arranged just under the first temperature detection diode $D_{temp51}$ and the second temperature detection diode $D_{temp52}$, in the width direction, respectively. The other structures of the first temperature detection diode $D_{temp51}$ and the second temperature detection diode $D_{temp52}$ are equivalent to those of the first temperature detection diode $D_{temp1}$ and the second temperature detection diode $D_{temp2}$ of the semiconductor device 1 according to the first embodiment illustrated in FIG. 1.

On the first temperature detection diode $D_{temp51}$ and the second temperature detection diode $D_{temp52}$, an upper interlayer dielectric 39z is deposited. The upper interlayer dielectric 39z illustrated in FIG. 37 has an upper surface which is arranged to be located above the source electrode 10. On the upper interlayer dielectric 39z, the anode surface interconnection 12a and the cathode surface interconnection 12b are provided between the first temperature detection diode $D_{temp51}$ and the second temperature detection diode $D_{temp52}$ in a similar manner to the semiconductor device 1 according to the first embodiment.

Similarly in the semiconductor device 1z according to the second embodiment, the p-n column layer is uniformly buried in the drift layer 3 across the temperature detection area 21 and active area 22 so that the columns regularly appear as stripes of the same line width in the plane pattern. On the n-type columns 31a to 31h, the gate electrodes 8a to 8h, . . . , the first temperature detection diode $D_{temp51}$ and the second temperature detection diode $D_{temp52}$ are provided so as to have the same line width and thickness as those of the n-type columns 31a to 31h.

Accordingly, in a similar manner to the semiconductor device 1 according to the first embodiment, even when the temperature detection diodes are merged, the imbalance of electric charges in the p-n column layer is significantly reduced. The semiconductor device 1z can achieve accurate temperature detection, preventing effectively the breakdown voltage from being reduced, with no influence on the performance of the semiconductor device $1z$ as the main device.

Moreover, in the semiconductor device $1z$ according to the second embodiment, the insulating films are provided in double level architecture in the temperature detection area 21. Accordingly, the total thickness of the insulating films is larger than that of the semiconductor device 1 according to the first embodiment, thus increasing the breakdown voltage.

—Manufacturing Method of Semiconductor Device—

Next, a method of manufacturing a semiconductor device according to the second embodiment will be explained. In terms of the conductivity types of impurity elements, manufacturing techniques, and the like, the same portions as those in the method of manufacturing the semiconductor device according to the first embodiment are not described again.

Figure 38:
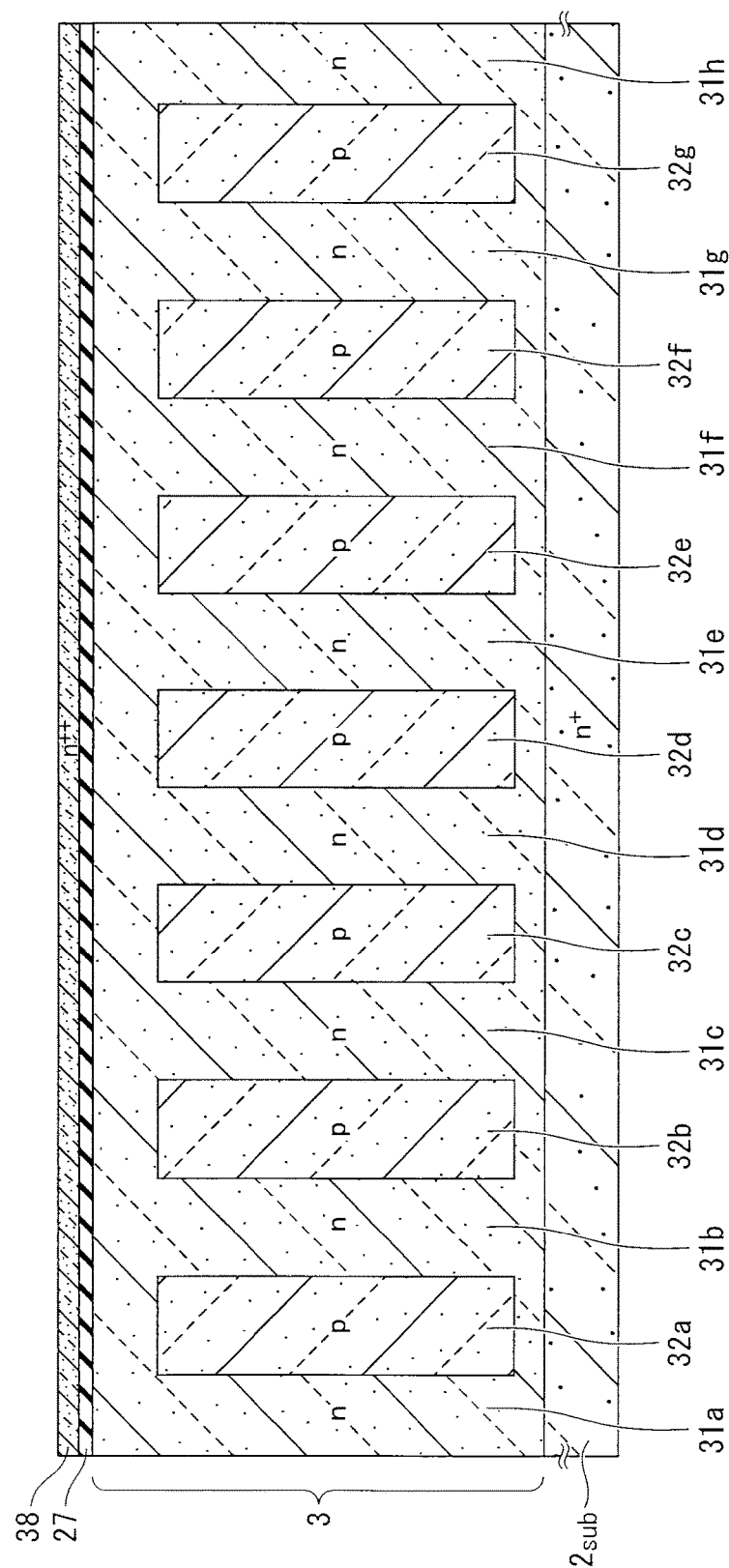
FIG. 38 is a schematic cross-sectional process view illustrating a method of manufacturing a semiconductor device according to the second embodiment (No. 1)

(s) First, the same semiconductor substrate $2_{sub}$, on which the drift layer 3 is formed, as that illustrated in FIG. 15 is prepared. In the drift layer 3, the p-n column layer is embedded. The upper surface of the drift layer 3 is thermally oxidized to form an oxidized film as the insulating film 27, which serves as the gate insulating films and middle insulating film, as illustrated in the cross-sectional view of FIG. 38. On the insulating film 27, a doped polysilicon film 38 is deposited, which is an $n^{++}$ polycrystalline silicon film doped with a high concentration of impurities of about $5 \times 10^{20}$ $cm^{-3}$. The doped polysilicon film 38 can be formed by firstly depositing a non-doped polysilicon and secondly thermally diffusing elements of phosphorous from the surface of the non-doped polysilicon.

(t) Next, the $n^{++}$ type doped polysilicon film 38 is delineated by photolithography and dry etching another process. As illustrated in the cross-sectional view of FIG. 39, the plural gate electrodes $8a$ to $8h$ . . . of the same line width are cut uniformly in a periodic manner between the plural p-type columns $32a$ to $32g$ across the temperature detection area 21 and active area 22 illustrated in FIG. 37.

Figure 39:
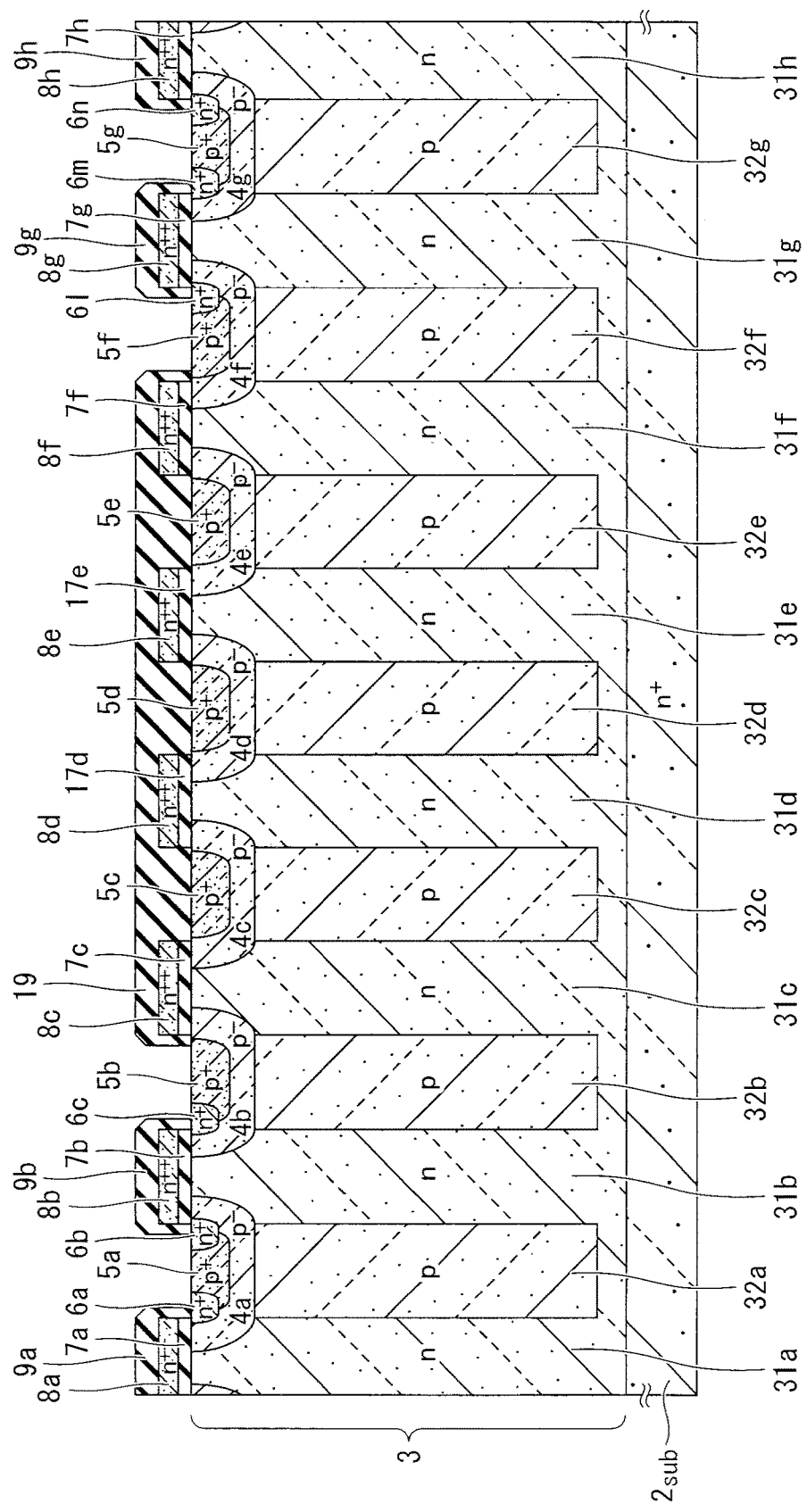
FIG. 39 is a schematic cross-sectional process view illustrating the method of manufacturing a semiconductor device according to the second embodiment (No. 2)

(u) Then, as illustrated in FIG. 39, in a similar manner to the aforementioned steps (o) and (p), ions are implanted between the gate electrodes $8a$ to $8h$ . . . to form $p^{-}$ well regions $4a$ to $4g$ of a low concentration and $p^{+}$ contact regions $5a$ to $5g$ of a low concentration. The $n^{+}$ source regions $6a$ to $6c$, $6dl$ to $6kl$, $6dr$ to $7kr$, $6l$ to $6n$, . . . illustrated in FIG. 22 of a high concentration are then formed in a similar manner to the aforementioned step (r).

(v) Next, in a similar manner to the step (h), an oxide material for an insulating film is deposited, and the deposited insulating film is delineated to define the interlayer dielectrics $9a$, $9b$, $9g$, $9h$, . . . and the middle interlayer dielectric 19 as illustrated in FIG. 39.

Figure 40:
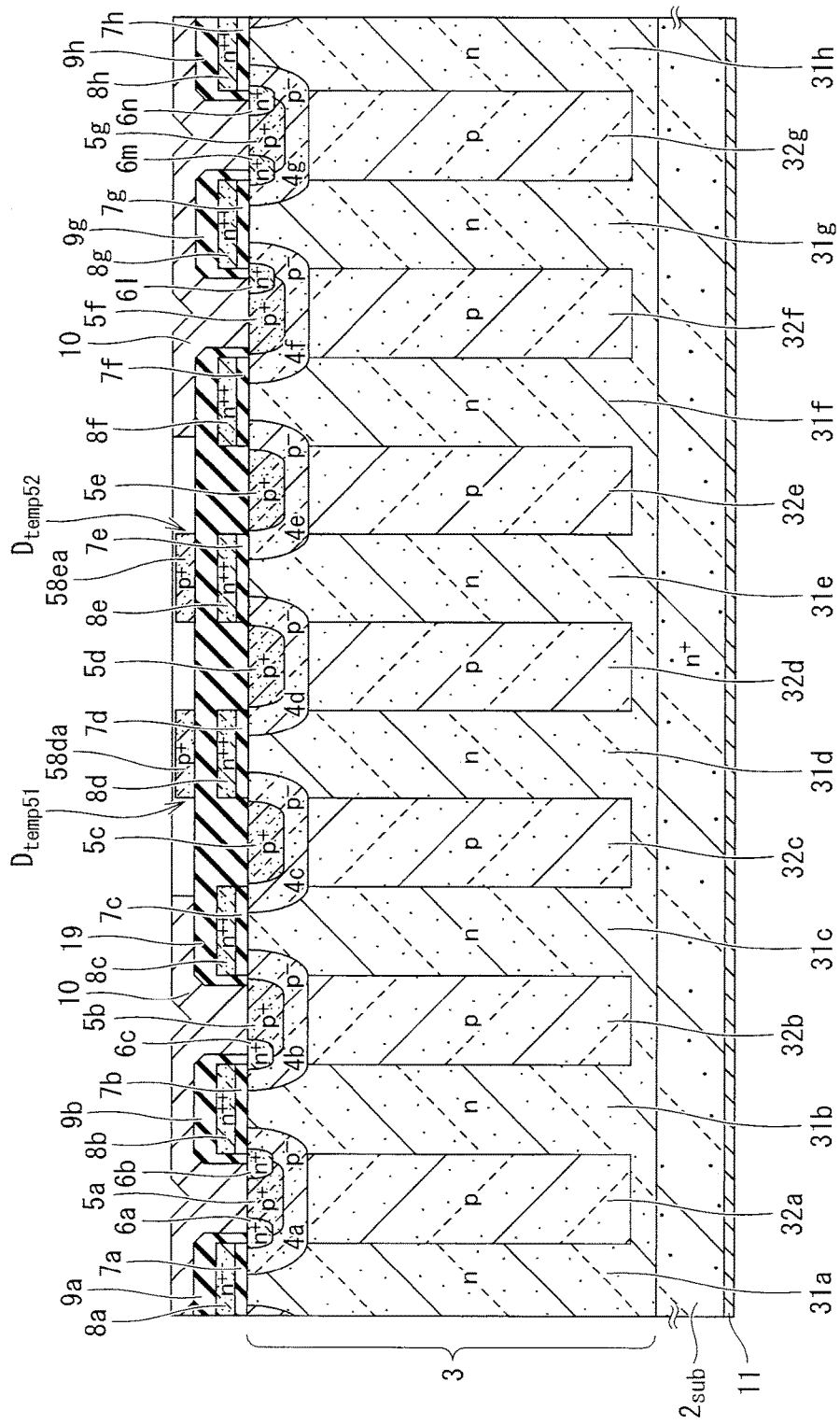
FIG. 40 is a cross-sectional process view taken in the direction of arrows M in FIG. 35.

(w) Next, on the interlayer dielectrics $9a$, $9b$, $9g$, $9h$, . . . and the middle interlayer dielectric 19, a non-doped polysilicon film, which is not illustrated, is deposited by reduced-pressure CVD or the like. As illustrated in FIG. 40, the non-doped polysilicon film is delineated by photolithography and dry etching or another process to define the regions of the first temperature detection diode $D_{temp51}$ and the second temperature detection diode $D_{temp52}$. The first temperature detection diode $D_{temp51}$ and the second temperature detection diode $D_{temp52}$ are allocated in keeping with the periodic structure of the gate electrodes $8a$ to $8h$, . . . by the steps (s) to (w).

Figure 41:
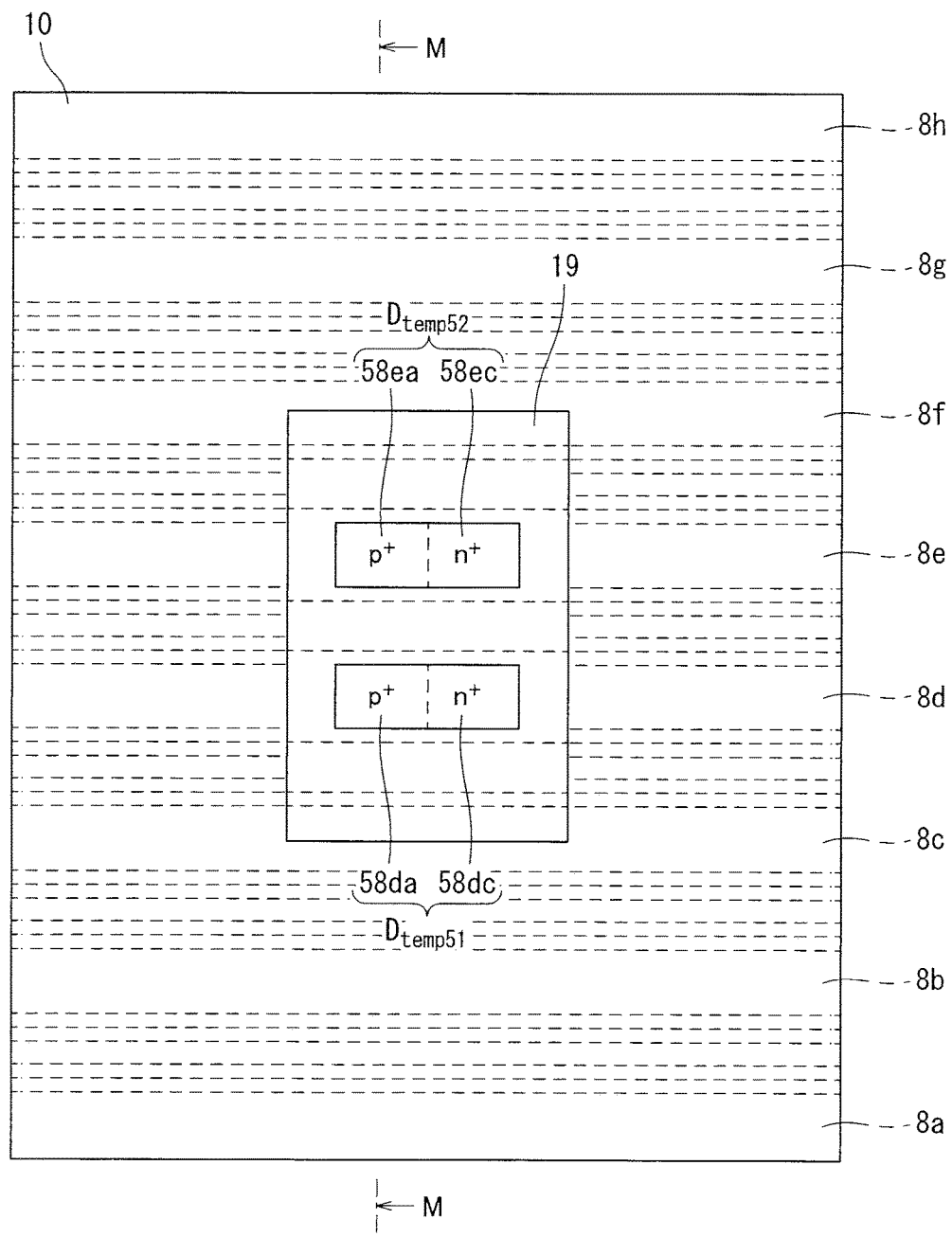
FIG. 41 is a schematic top view illustrating the method of manufacturing a semiconductor device according to the second embodiment (No. 3).

(x) In the thus-formed regions of the first temperature detection diode $D_{temp51}$ and the second temperature detection diode $D_{temp52}$, dopants of p-type impurity elements, such as Al and B, and dopants of n-type impurity elements, such as P, are doped from above the drain region 2 by ion implantation or the like into respective halves of each region equally divided along the longitudinal direction using selective doping masks. The first temperature detection diode $D_{temp51}$ and the second temperature detection diode $D_{temp52}$ are formed as illustrated in the cross-sectional view of FIG. 40 and the top view of FIG. 41. On the active area 22 illustrated in FIG. 37, a metallic film of Al or the like is deposited. The deposited metallic film is delineated to form the source electrode 10.

(y) Next, an oxide material such as silicon oxide is deposited by CVD or the like on the first temperature detection diode $D_{temp51}$ and the second temperature detection diode $D_{temp52}$ to form an insulating film. The deposited insulating film is delineated to form the upper interlayer dielectric $39z$ illustrated in FIG. 37. In the upper interlayer dielectric $39z$, contact holes for the anode surface interconnection $12a$ and the cathode surface interconnection $12b$ illustrated in FIG. 2 are cut by dry etching or the like.

By the same treatments as the steps (j) and (k), in a similar manner to the method of manufacturing a semiconductor device according to the first embodiment, the semiconductor device $1z$ is manufactured, which can accurately detect temperature, and preventing the breakdown voltage from being reduced, with no influence on the performance of the semiconductor device $1z$ as the main device.

The method of manufacturing a semiconductor device according to the second embodiment is especially effective when the gate electrodes include an extremely high concentration of impurity elements because of the quality requirements of the semiconductor device and therefore inverting the conductivity type from n-type to p-type as described in the method of manufacturing the semiconductor device according to the first embodiment is difficult.

By the method of manufacturing the semiconductor device according to the second embodiment, the design of the p-n column layer in the drift layer 3 does not need to be changed between the temperature detection area 21 and active area 22 similarly to the method of manufacturing the semiconductor device according to the first embodiment. Accordingly, the burden on the manufacturing process of the p-n column is also not increased, thus preventing an increase in manufacturing cost.

<Other Embodiments>

The present invention is explained based on the foregoing disclosed embodiments. However, it is should not be understood that the statements and drawings included in the disclosure limit the present invention. It should be considered that the disclosure reveals various substitute embodiments, examples, and application technologies to a person skilled in the art.

For example, in the method of manufacturing a semiconductor device according to the first embodiment, the p-n column layer is buried using multi-epitaxial growth. However, the method of burying the p-n column layer is not limited to the multi-epitaxial growth. The p-n column layer may be formed by digging trenches in the surface of the drift layer 3 illustrated in FIG. 1 and burying semiconductor regions doped with p-type or n-type impurity elements in the dug trenches, for example.

The above-described technical scope of the temperature detection area is defined for convenience of description. The temperature detection area can be defined to another technical scope, which may include an area having a certain length in gaps generated around the temperature detection diodes, as long as the temperature detection diodes are provided in the temperature detection area, and as long as the temperature detection area lies in the technical scope of the present invention.

In the semiconductor device 1 according to the first embodiment illustrated in FIG. 1, the well regions 4a to 4g and contact regions 5a to 5g are provided in the temperature detection area 21 to increase the breakdown voltage. However, the well regions and contact regions are no essential in the temperature detection area 21. The upper surfaces of the p-type columns 32a to 32g under the temperature detection area 21 may implement the upper surface of the drift layer 3.

In the first and second embodiments, each temperature detection diode is provided to have the same line width as that of the gate electrodes. In the present invention, the dimensions of each temperature detection diode may be shorter than the gate width of the gate electrodes. However, by designing the temperature detection diodes according to the same design rule as the gate electrodes, the semiconductor device can be manufactured efficiently. In the semiconductor device according to the present invention, the number of temperature detection diodes provided on the drift layer is not limited two. The temperature detection diodes can be properly varied in number, depending on the magnitudes of the current and voltage necessary for temperature detection, as long as a plurality of temperature detection diodes are connected to each other.

With the semiconductor device 1 according to the first embodiment illustrated in FIG. 4, the six gate electrodes 8c, 8dl, 8dr, 8el, 8er, and 8f surround the four sides of the temperature detection area 21. However, the number of gate electrodes surrounding the temperature detection area varies depending on the area of the temperature detection area 21, that is, the number of temperature detection diodes. If the semiconductor device 1 is provided with one temperature detection diode, for example, the number of gate electrodes surrounding the temperature detection diode is four. If the semiconductor device 1 is provided with triple temperature detection diodes, the number of gate electrodes surrounding the temperature detection diodes is eight.

With the method of manufacturing a semiconductor device according to the first embodiment, the low concentration regions of the second conductivity type (p-type), which is different from the conductivity-type of the n-type columns 31a to 31h, are buried through gaps between the temperature detection diodes and gate electrodes 8a to 8h, . . . by ion implantation in the process of forming the well regions 4a to 4g as illustrated in FIGS. 35 and 36. However, the forming of the low-concentration regions at the gaps is unnecessary in the present invention. The semiconductor device according to the present invention may be manufactured in such a manner that ion implantation for doping the well regions 4a to 4g is performed, after the gaps are masked by resist film or the like, so as not to form the low-concentration regions through the gaps.

The semiconductor devices described in FIGS. 1 to 41 are MOSFETs. However, the present invention is applicable to other semiconductor devices having MOS gate structures, such as IGBTs, for example. Moreover, the present invention is applicable to a semiconductor device having a SJ structure, but not having the MOS gate structures, as long as the edge effect of the field intensity of the temperature detection diodes or the like does not influence the behavior of the p-n column layer.

The semiconductor device and the method of manufacturing the semiconductor device according to the present invention can be implemented by a combination of technical ideas of the embodiments and modifications illustrated in FIGS. 1 to 41. For example, on the drift layer appearing as a grid in the plane pattern as illustrated in FIGS. 9 to 14, a part of the region of the gate electrode continuously extended from the periphery is arranged at the same height as the gate electrode in the temperature detection area 21 like the semiconductor device 1z illustrated in FIG. 37. The temperature detection diodes may be disposed at a second level above the gate electrode to implement a semiconductor device of a double level architecture. In the double level architecture, the same effectiveness as those described in the embodiments can be achieved.

As described so far, the present invention includes various embodiments that are not described above, and the technical scope of the invention is defined only by a subject matter or features, which specify the present invention, according to the reasonable scopes prescribed by patent claims based on the foregoing explanation.

What is claimed is:

1. A method of manufacturing a semiconductor device, comprising:
preparing a drift layer of a first conductivity-type, including a plurality of columns of a second conductivity-type, a plane pattern of each of the columns of the second conductivity-type extends along a first direction parallel to the principal surface of the layer of the first conductivity-type, the columns of the second conductivity-type are arranged at regular intervals, interdigitally sandwiching columns of the first conductivity-type made of the drift layer so as to implement a drift layer having a superjunction structure in which the columns of the first conductivity-type and the columns of the second conductivity-type are arranged side by side;
forming a plurality of well regions of the second conductivity-type in a surface-side layer of the layer of the first conductivity-type;
forming a plurality of source regions of the first conductivity-type selectively in the plurality of well regions;
forming a gate insulating film on the plurality of well regions; and
forming an array of gate electrodes on the gate insulating films, each of the gate electrodes bridging the corresponding source regions in a pair of neighboring two well regions; and
forming a temperature detection diode at a partial area defined in the array of the gate electrodes,
wherein at least one column among the columns has a first line width in a second direction, the temperature detection diode has a second line width in the second direction, and the first line width is equal to the second line width, and
wherein the second direction is perpendicular to the first direction.

2. The method of claim 1, wherein the temperature detection diode is formed above a middle area of the layer of the first conductivity-type, which implements the drift layer, in a plane pattern.

3. The method of claim 2, wherein the temperature detection diode is formed in a structure having a plurality of p-n junction diodes connected in series.

4. The method of claim 3, wherein the forming the plurality of the gate electrodes and the forming the temperature detection diode are executed simultaneously so as to locate the gate electrodes and the temperature detection diode on the same level.

5. The method of claim 4, further comprising forming an interlayer dielectric on the gate electrodes after the forming the plurality of the gate electrodes,
   wherein the temperature detection diode is formed on the interlayer dielectric, which locate above the level of the gate electrodes.

\* \* \* \* \*